United States Patent [19]
Yamamoto et al.

[11] Patent Number: 6,077,310
[45] Date of Patent: Jun. 20, 2000

[54] OPTICAL PROXIMITY CORRECTION SYSTEM

[75] Inventors: Kazuko Yamamoto, Tokyo; Sachiko Miyama, Funabashi; Kiyomi Koyama; Soichi Inoue, both of Yokohama, all of Japan

[73] Assignee: Kabushiki Kaisha Toshiba, Kawasaki, Japan

[21] Appl. No.: 09/239,770

[22] Filed: Jan. 29, 1999

Related U.S. Application Data

[62] Division of application No. 08/771,252, Dec. 20, 1996, Pat. No. 5,879,844.

[30] Foreign Application Priority Data

Dec. 22, 1995 [JP] Japan .................................. 7-335450
Mar. 25, 1996 [JP] Japan .................................. 8-068829
Dec. 19, 1996 [JP] Japan .................................. 8-339636

[51] Int. Cl.$^7$ .................................................. G06F 17/50
[52] U.S. Cl. ............................................. 716/19; 430/30
[58] Field of Search ................................ 364/488, 489, 364/490, 491; 395/500.05, 500.06, 500.07; 716/19, 20, 21; 430/30, 296, 942

[56] References Cited

U.S. PATENT DOCUMENTS

| | | | |
|---|---|---|---|
| 5,051,598 | 9/1991 | Ashton et al. | 250/492.2 |
| 5,663,893 | 9/1997 | Wampler et al. | 364/491 |
| 5,682,323 | 10/1997 | Pasch et al. | 364/491 |
| 5,723,233 | 3/1998 | Garza et al. | 430/5 |
| 5,725,974 | 3/1998 | Kawahira | 430/5 |
| 5,740,068 | 4/1998 | Liebmann et al. | 364/489 |
| 5,792,581 | 8/1998 | Ohnuma | 430/30 |
| 5,801,954 | 9/1998 | Le et al. | 364/488 |
| 5,862,058 | 1/1999 | Samuels et al. | 364/491 |
| 5,879,844 | 3/1999 | Yamamoto et al. | 430/30 |

OTHER PUBLICATIONS

Garofalo et al. "Automatic Proximity Correction for 0.35um 1–line Photolithography," International Workshop on Numerical Modeling of Processes and Devices for Integrated Circuits, Jun. 5–6 1994, pp. 92–94.

Harafuji et al. "A Novel Hierarchical Approach for Proximity Effect Correction in Electron Beam Lithography," IEEE Transactions on Computer–Aided Design of Integrated Circuits and Systems, vol. 12, No. 10, Oct. 1993, pp. 1508–1514.

Smith and Trybula "Photomasks for Advanced Lithography," Twenty–First IEEE/CPMT International Electronics Manufacturing Technology Symposium, Oct. 13–15 1997, pp. 342–345.

Chuang et al. "Practical Applications of 2–D Optical Proximity Corrections for Enhanced Performance of 0.25um Random Logic Devices," International Electron Devices Meeting, Dec. 7–10 1997, pp. 483–486.

Qian and Leon "A New Scalar Planewave Model for High NA Lithography," International Workshop on Numerical Modeling of Processes and Devices for Integrated Circuits, Jun. 5–6 1994, pp. 45–48.

(List continued on next page.)

*Primary Examiner*—Paul R. Lintz
*Assistant Examiner*—Leigh Marie Garbowski
*Attorney, Agent, or Firm*—Oblon, Spivak, McClelland, Maier & Neustadt, P.C.

[57] ABSTRACT

Pattern data that is an object of correction is divided into an area on which correction is made using correction values that have been obtained in advance for patterns and their respective layouts and an area on which correction is made on the basis of correction values calculated by a simulator. For example, simulation-based correction is made on a gate layer in a memory, while rule-based correction is made on a gate layer in the other area than the memory on the basis of rules for active gate width only. After being subjected to the correction, the areas are combined.

27 Claims, 38 Drawing Sheets

OTHER PUBLICATIONS

SPIE, vol. 2322, pp. 229–238, 1994, Lars W. Liebmann, et al., "Optical Proximity Correction, A First Look At Manufacturability".

Jpn. J. Appl. Phys., vol. 34, pp. 6547–6551, 1995, Eiichi Kawamura, et al., "Simple Method of Correcting Optical Proximity Effect For 0.35 $\mu$m Logic LSI Circuits".

SPIE, vol. 2197, pp. 278–293, 1994, Oberdan W. Otto, et al., "Automated Optical Proximity Correction–A Rules–Based Approach".

SPIE, vol. 2197, pp. 361–370, 1994, Richard C. Henderson, et al., "Correcting For Proximity Effect Widens Process Latitude".

SPIE, vol. 2240, pp. 261–269, 1995, Satomi Shioiri, et al., "Fast Optical Proximity Correction: Analytical Method".

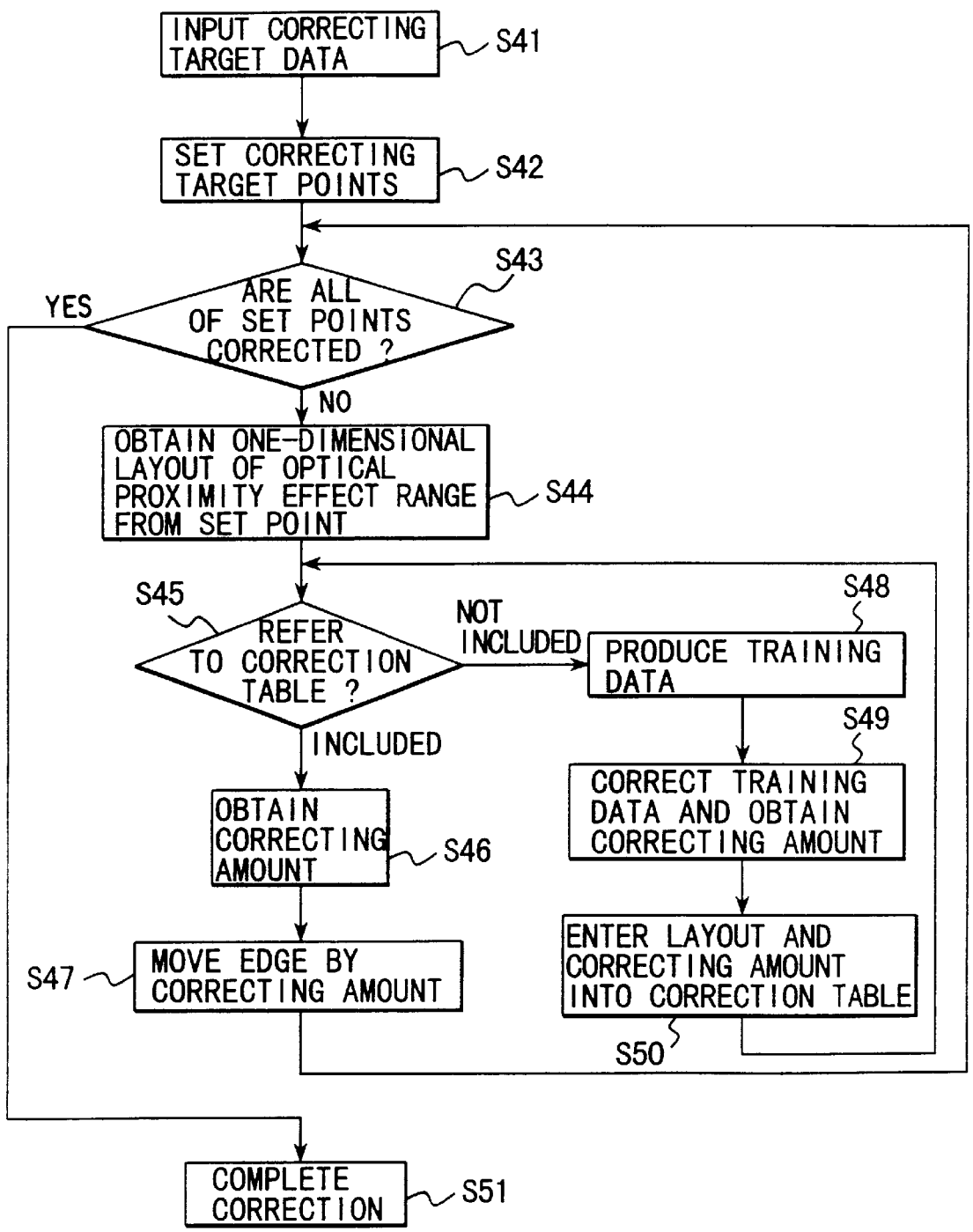
F I G. 23

| LAYOUT CONVERTED INTO PARAMETER | CORRECTING AMOUNT ($\mu$m) |
|---|---|
| (111111111111111000011100001110) | -0.006 |
| (011100001110000111111111111111) | 0.006 |
| (111111000000011100000001111111111) | -0.012 |
| (111111110000000111000000111111) | 0.012 |
| (000111000000011100000000000111) | -0.016 |
| (111000000000000111000000111000) | 0.016 |
| (000000000000000111000000000000) | -0.028 |
| (000000000000000111000000000000) | 0.028 |
TABLE 5
F I G. 25
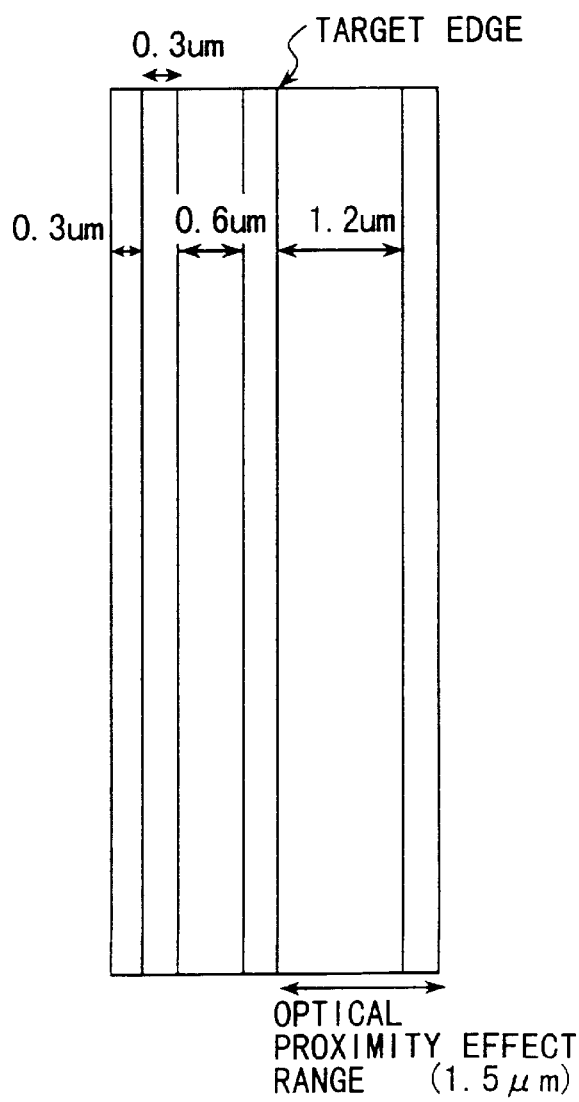
F I G. 26

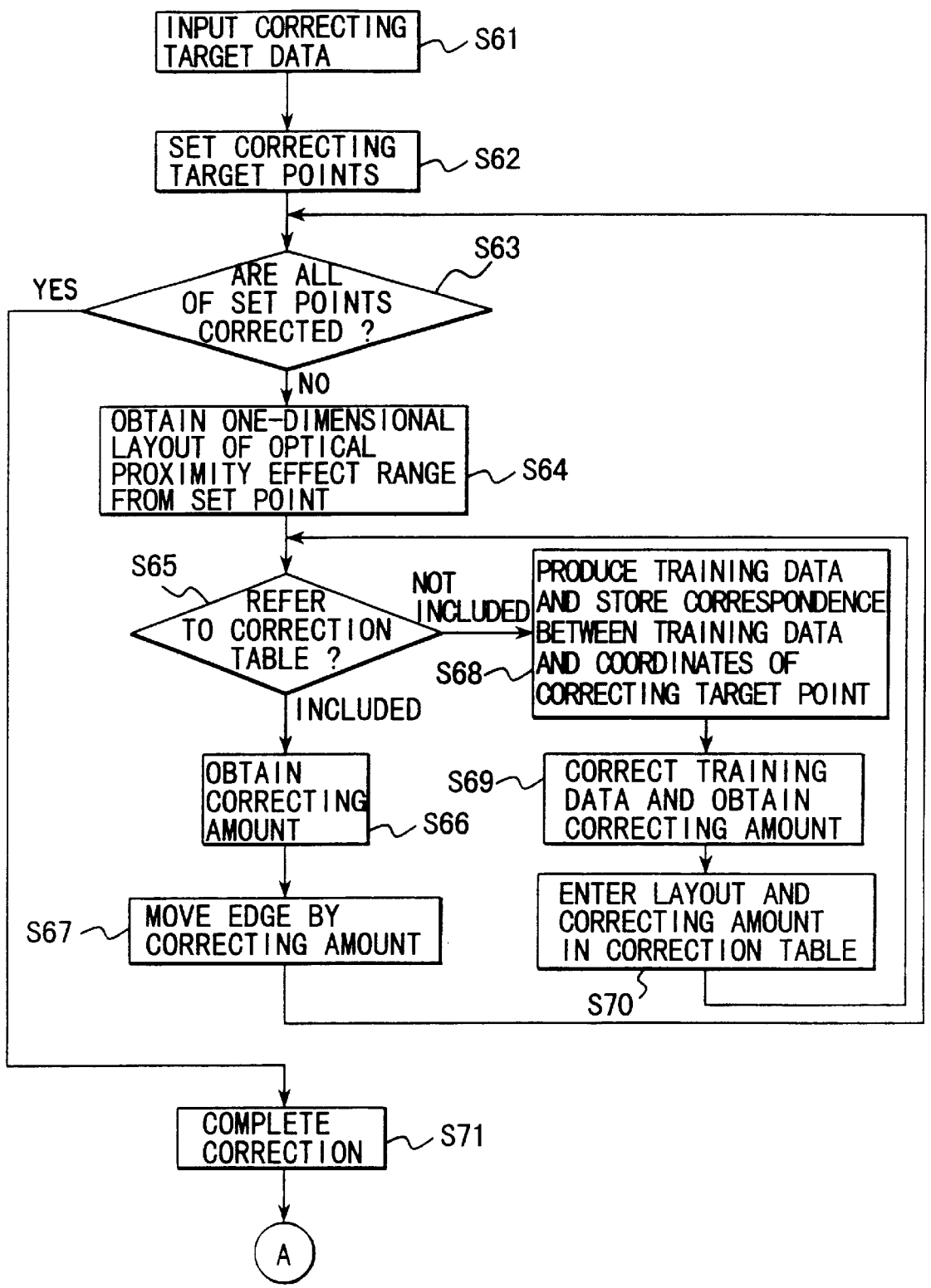
F I G. 27A

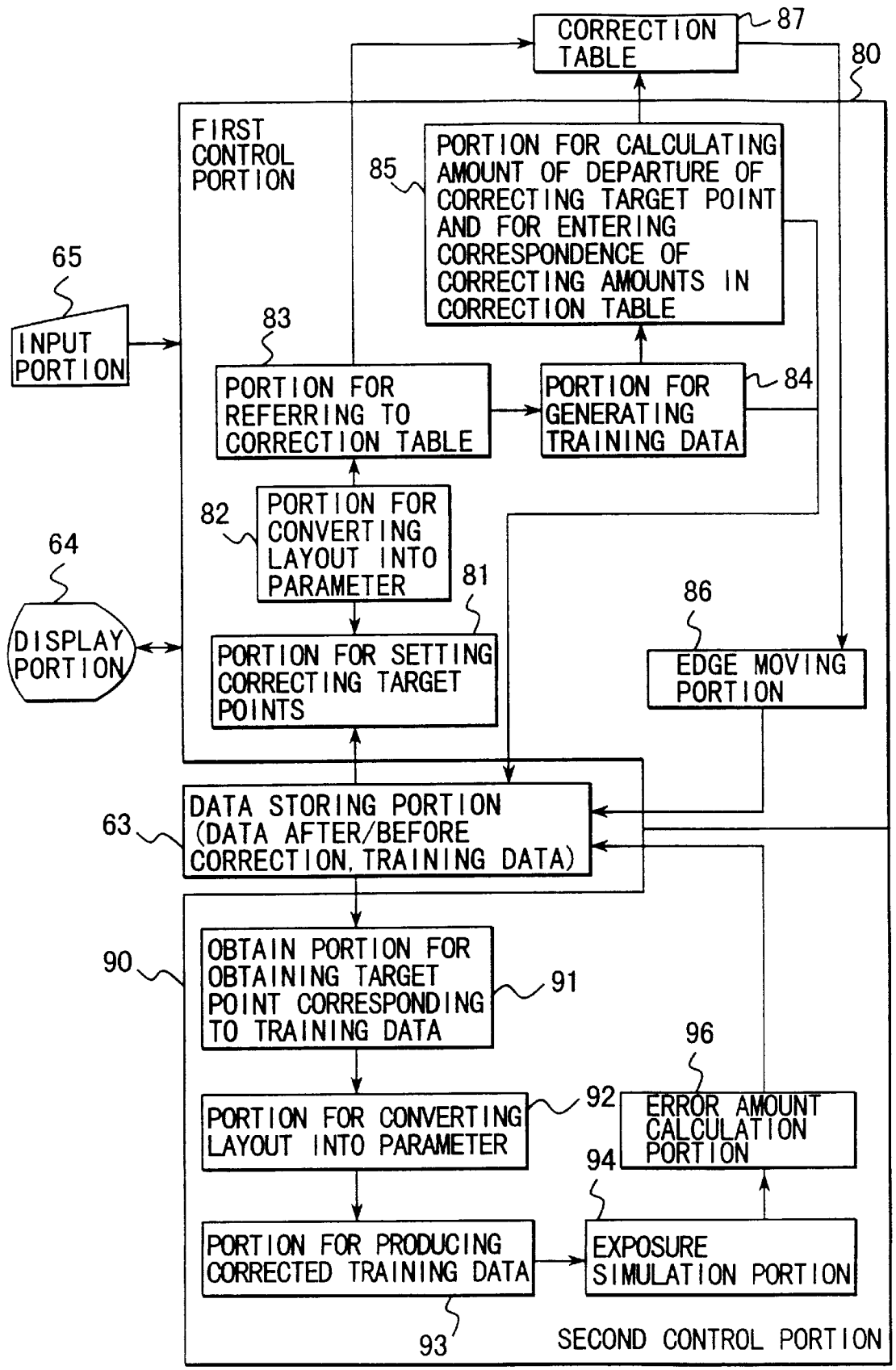
F I G. 3 1

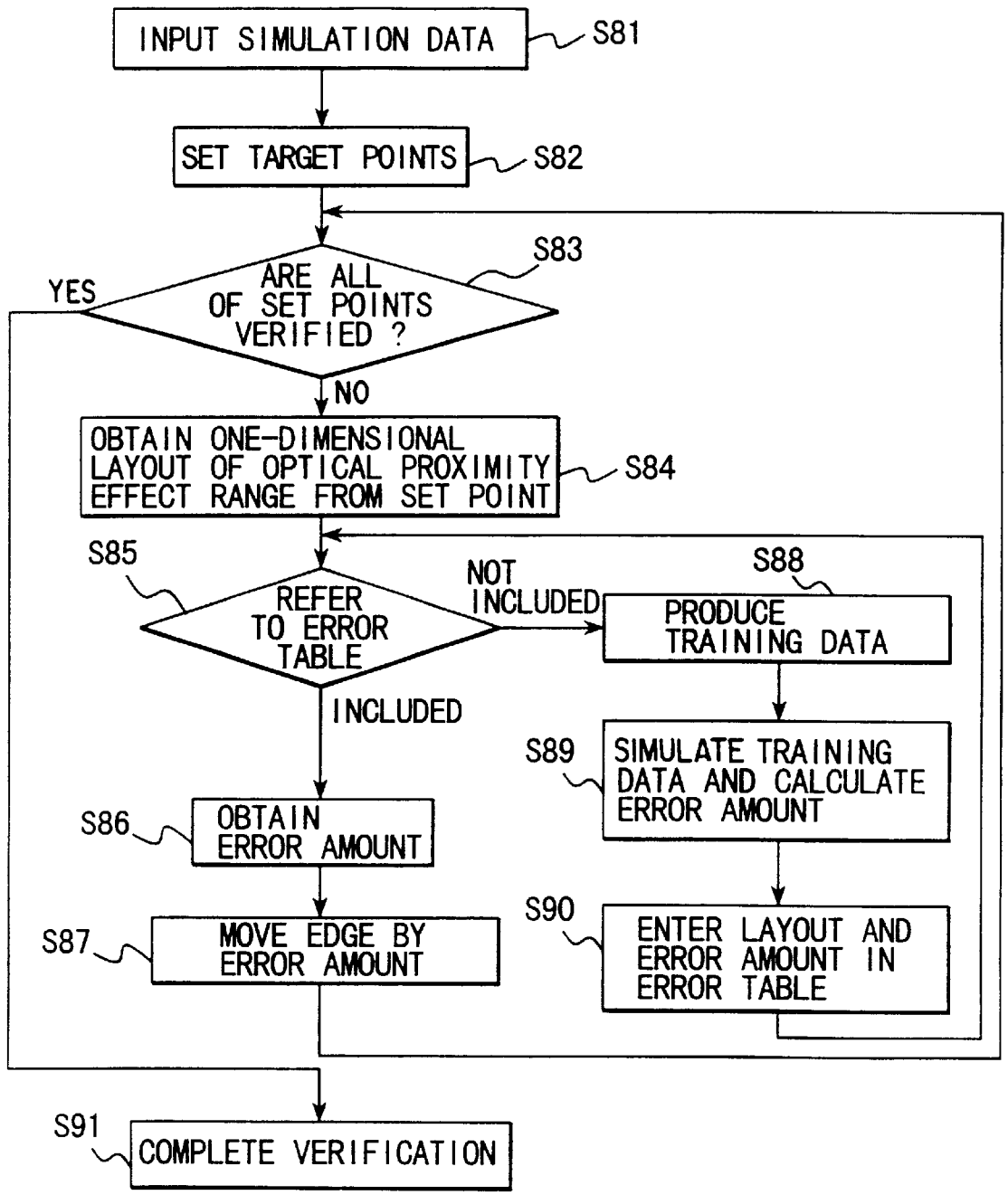
F I G. 32

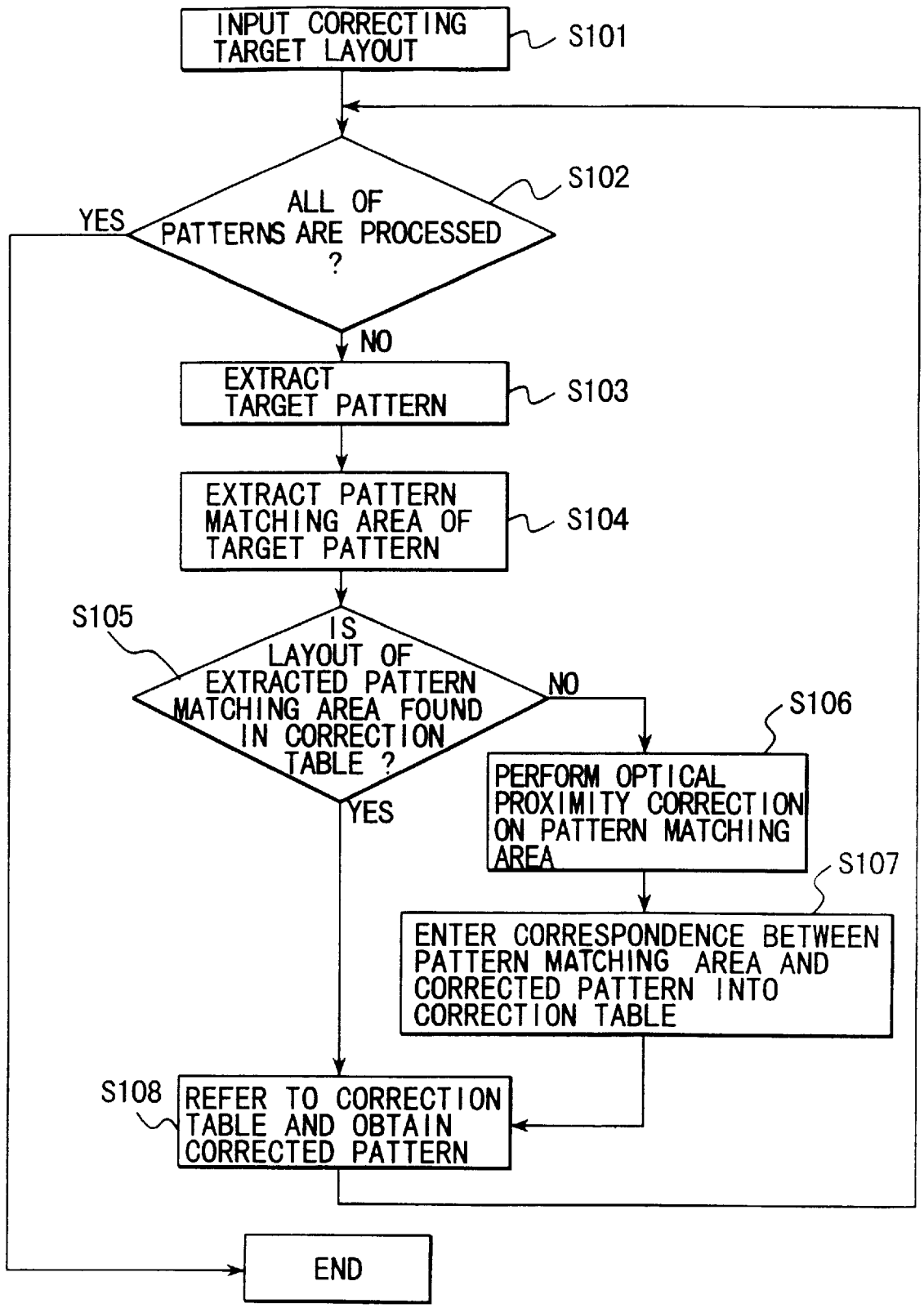
F I G. 33

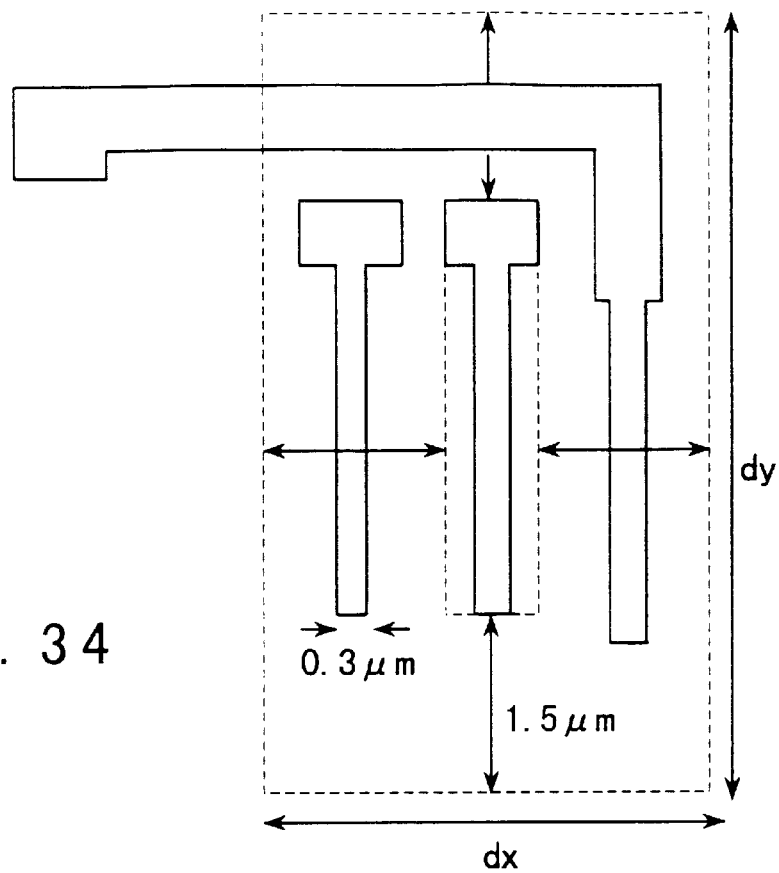
F I G. 3 4
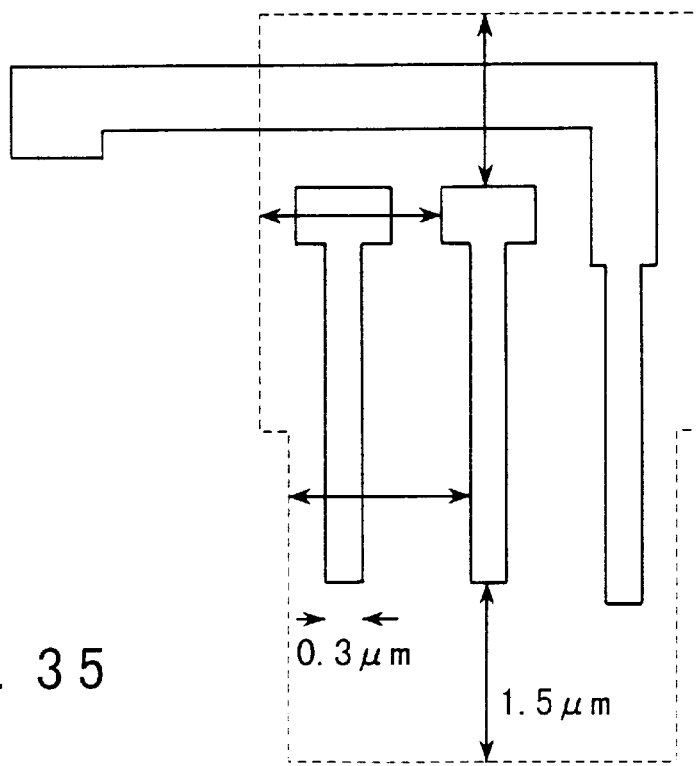
F I G. 3 5

TABLE 6

| INDEX PORTION-LAYOUT WITHIN PATTERN MATCHING AREA | SHAPE OF TARGET PATTERN AFTER CORRECTION |
|---|---|
| (dx, dy), NUMBER OF PATTERNS, COORDINATES OF ALL PATTERNS (PATTERN 1, PATTERN 2, ...) | |
| (3.9, 6.0), 3, ((1.8:1.5 2.1:1.5 2.1:4.0 2.4:4.0 2.4:4.5 1.5:4.5 1.5:4.0 1.8:4.0 1.8:1.5) (0.6:1.5 0.9:1.5 0.9:4.0 1.2:4.0 1.2:4.5 0.3:4.5 0.3:4.0 0.6:4.0 0.6:1.5) ...) | SHAPE1 |
| (3.3, 3.3), 1, ((5.0:5.0 5.3:5.0 5.3:5.3 5.0:5.3)) | SHAPE2 |
| (3.3, 3.3), 2, ((5.0:5.0 5.3:5.0 5.3:5.3 5.0:5.3) (5.6:6.0 5.9:6.0 5.9:6.3 5.6:6.3)) | SHAPE3 |
| ... | ... |

F I G. 36

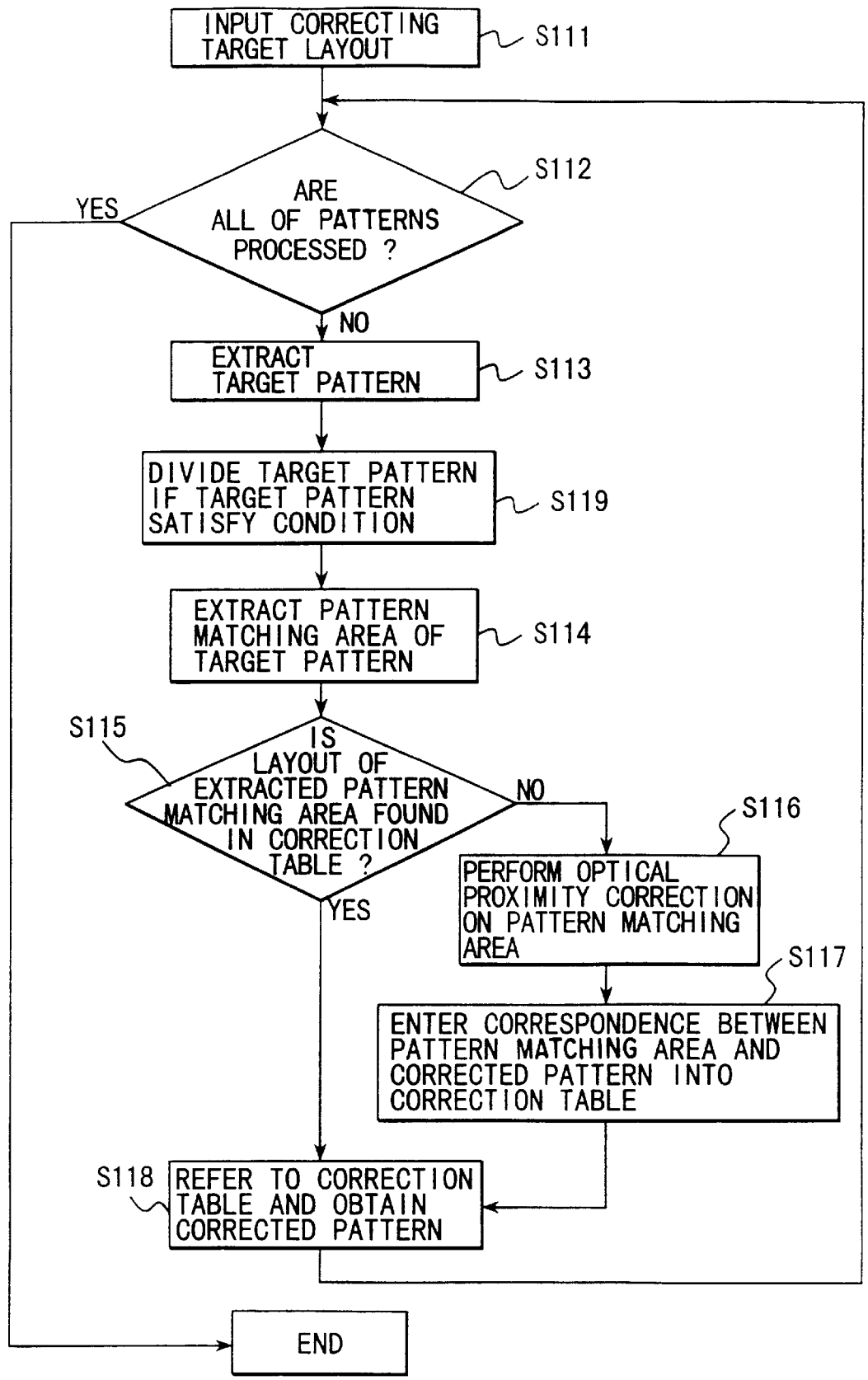
F I G. 38

TABLE 7

| INDEX PORTION-LAYOUT WITHIN PATTERN MATCHING AREA | SHAPE OF CORRECTED PATTERN (POLYSILICON LAYER) | SHAPE OF CORRECTED PATTERN (DIFFUSION LAYER) |
|---|---|---|
| (dx, dy), NUMBER OF PATTERNS IN POLYSILICON LAYER, NUMBER OF PATTERNS IN DIFFUSION LAYER, COORDINATES OF ALL PATTERNS IN POLYSILICON LAYER (PATTERN 1, PATTERN 2, ...), COORDINATES OF ALL PATTERNS IN DIFFUSION LAYER (PATTERN 1, PATTERN 2, ...) | | |
| (3.9, 6.0), 3, 1, ((1.8:1.5 2.1:1.5 2.4:4.0 2.4:4.5<br>1.5:4.5 1.5:4.0 1.8:4.0 1.8:1.5) (0.6:1.5 0.9:1.5 0.9:4.0<br>1.2:4.0 1.2:4.5 0.3:4.5 0.3:4.0 0.6:4.0 0.6:1.5)...),<br>((...)) | SHAPE1 | SHAPE4 |
| (3.3, 3.3), 1, 1, ((5.0:5.0 5.3:5.0 5.3:5.3 5.0:5.3 3.5:3.5<br>6.8:3.5 6.5:4.5 6.5:4.2 3.8:4.5 3.5:4.5))<br>6.8:3.5 6.5:4.5 6.5:4.2 3.8:4.5 3.5:4.5)) | SHAPE2 | SHAPE5 |
| (3.3, 3.3), 1, 1, ((5.0:5.0 5.3:5.0 5.3:5.3 5.0:5.3 (5.6:5.6<br>6.6:5.6 6.6:6.6 5.6:6.6)) | SHAPE3 | SHAPE6 |
| ... | ... | ... |

F I G. 4 1

SHAPE 1

SHAPE 2

SHAPE 3

SHAPE 4

SHAPE 5

SHAPE 6

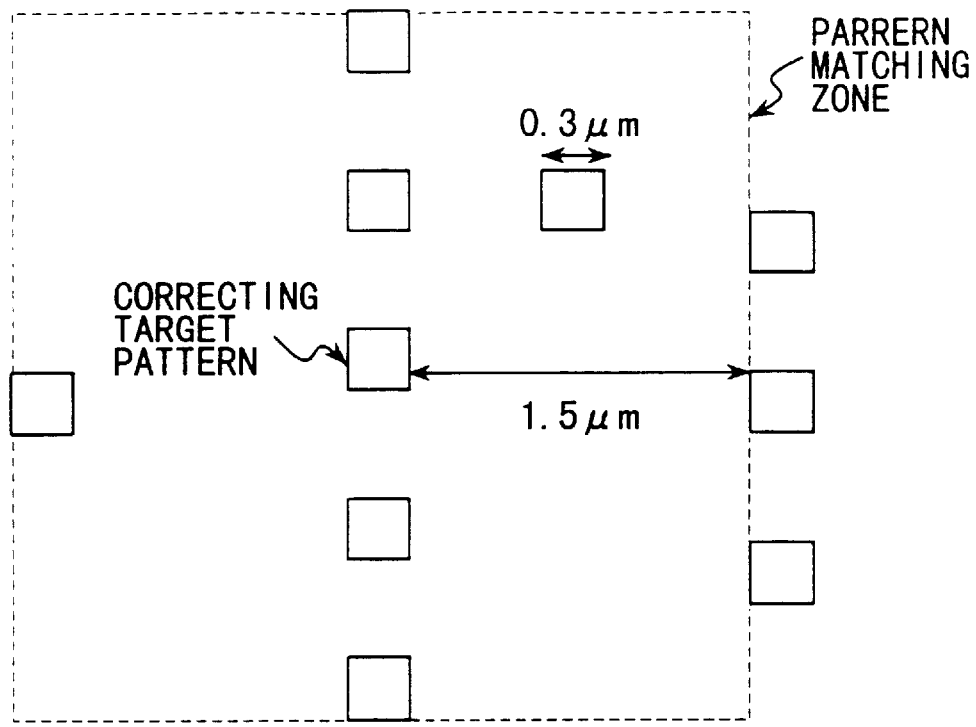
F I G. 44A
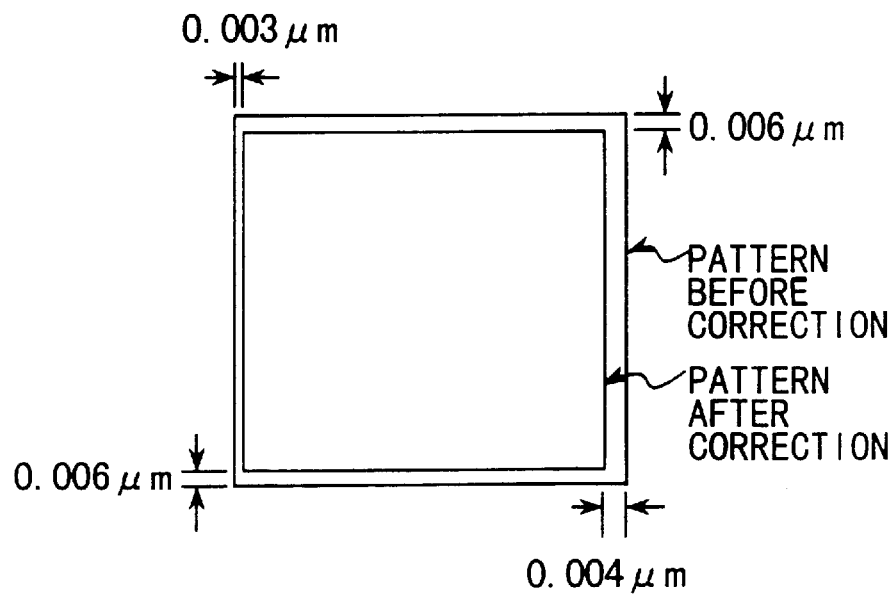
F I G. 44B

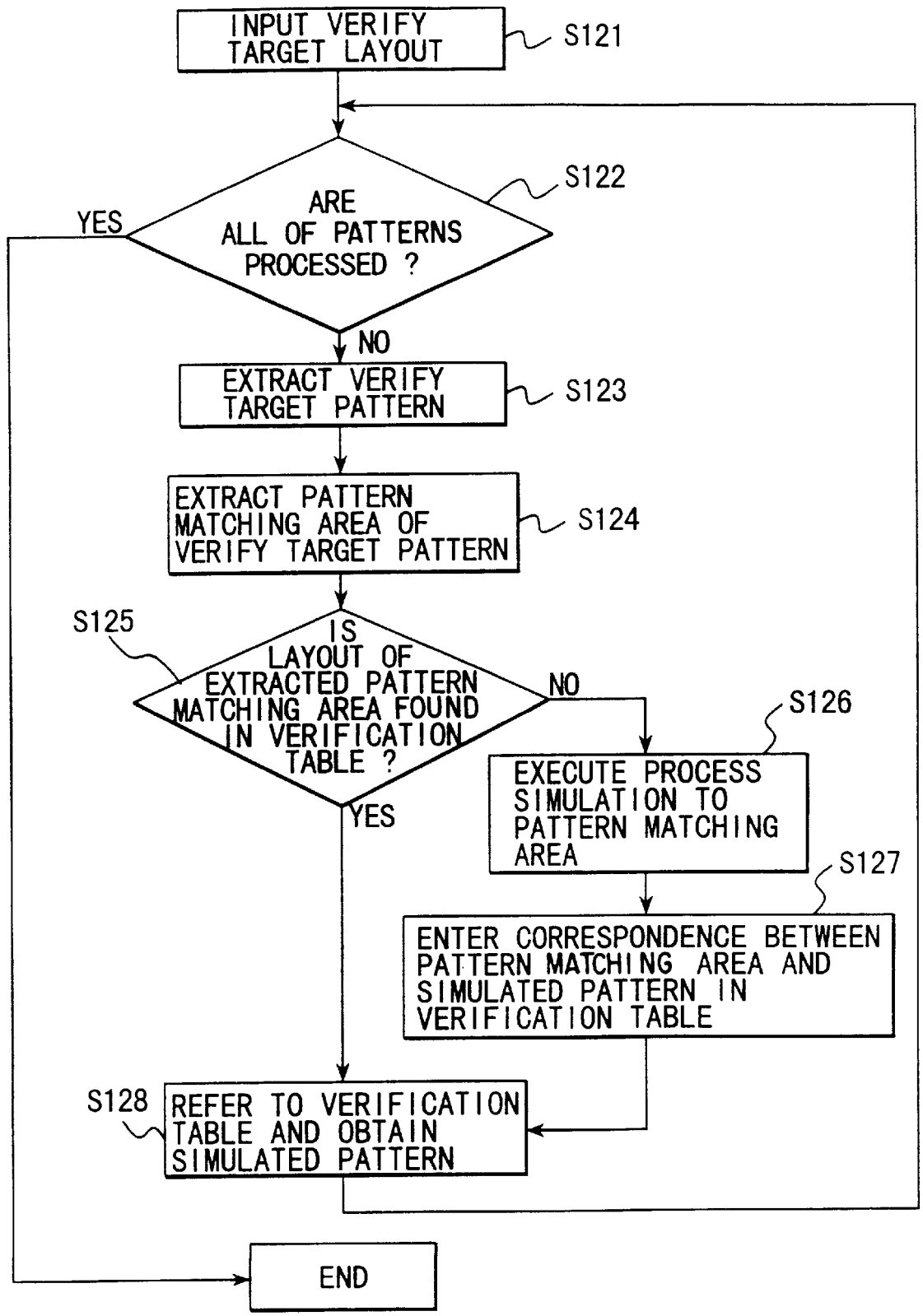
F I G. 45

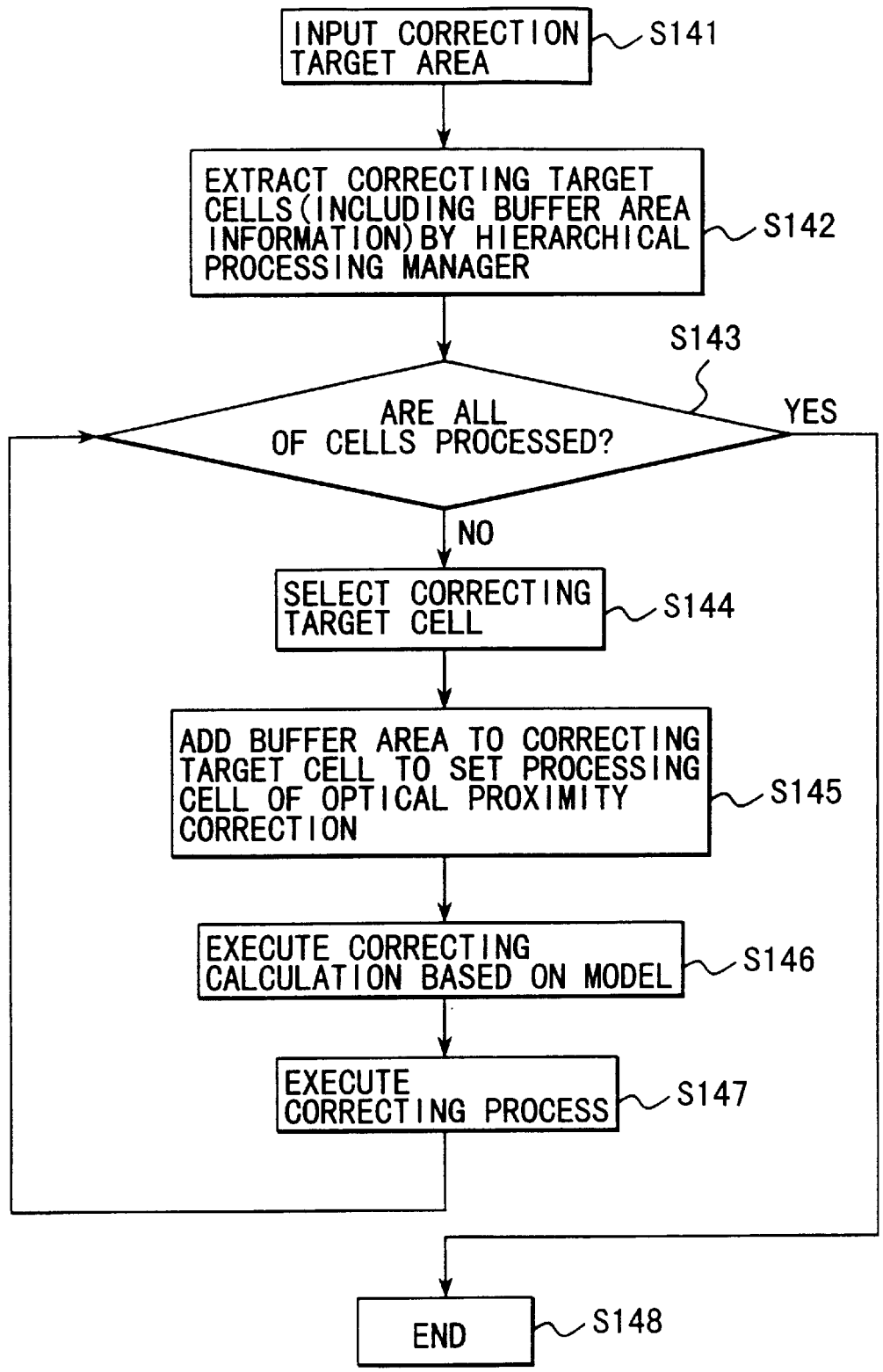
F I G. 51

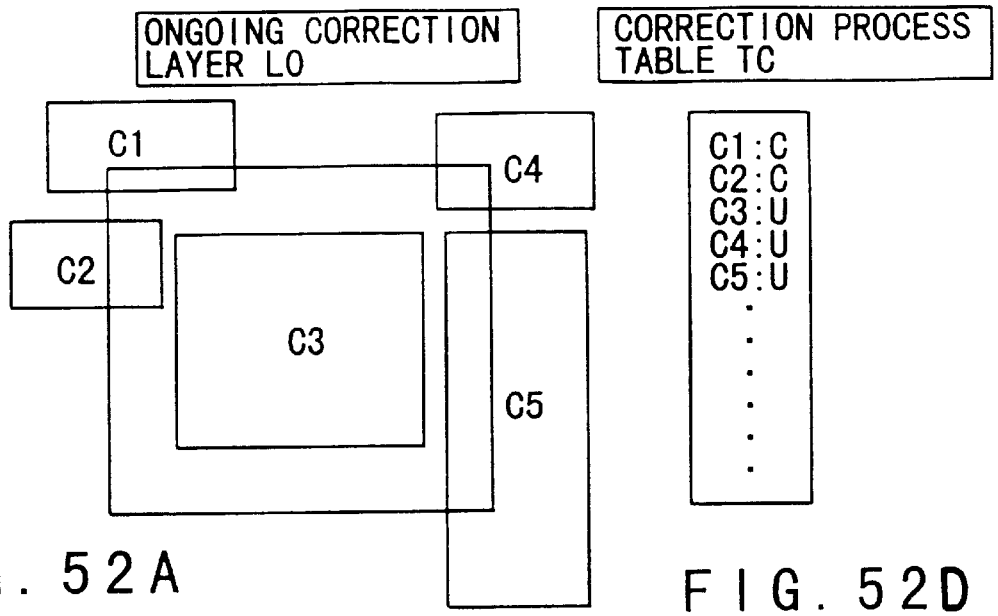
FIG. 52A
FIG. 52D
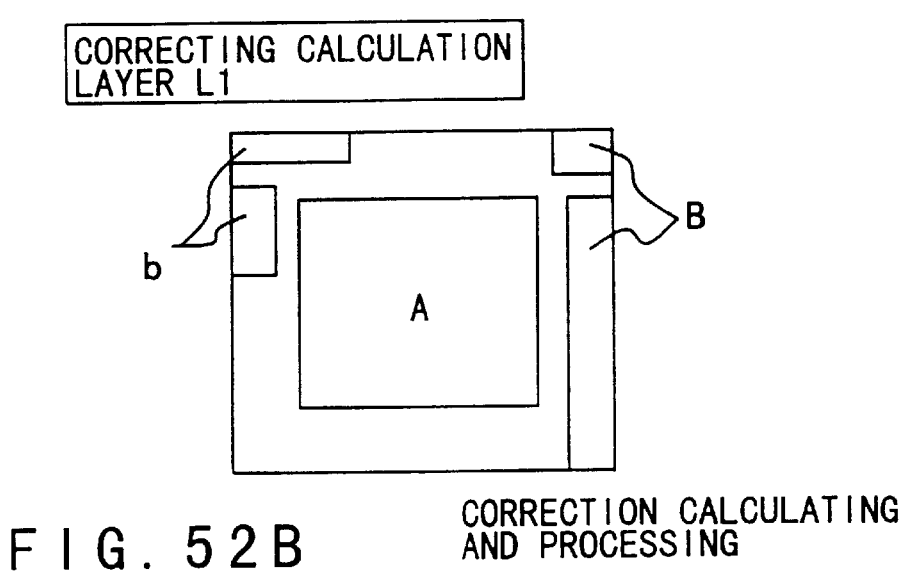
FIG. 52B
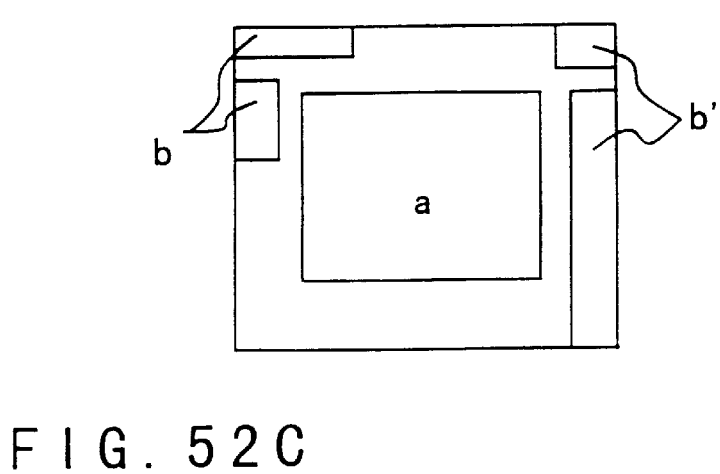
FIG. 52C

OPTICAL PROXIMITY CORRECTION SYSTEM

This application is a Division of Ser. No. 08/771,252 Dec. 20, 1996 U.S. Pat. No. 5,879,844.

BACKGROUND OF THE INVENTION

1. Field of the Invention

The present invention relates to a technique of manufacturing exposure masks used in photolithography or X-ray lithography and more specifically to a method of creating reduced projection printing mask data suitable for forming fine patterns by improving a way to correct design data.

2. Discussion of the Background

In recent years, the accuracy of pattern transfer in a lithographic process has been becoming a problem as the size of a device unit to be manufactured into large-scale integrated circuits becomes very small. More specifically, when a reduced pattern of a mask is transferred onto a wafer, there occur phenomena such that right-angled corners are rounded, line ends become short, and line widths increase/decrease, etc. Hereinafter, such phenomena are referred to as the optical proximity effect (OPE).

The causes of the OPE include optical factors (interference between light beams transmitted through adjacent patterns), resist processes (baking temperatures/times, development time, etc.), the reflection of light from and irregularities of the substrate, the effect of etching, etc. Though the causes include factors except the optical factors, the above phenomena are named as the optical proximity effect. When the absolute values of allowable dimensional errors decrease as patterns become finer, the allowable dimensional errors may be exceeded due to the OPE. The mainstream way of preventing pattern transfer degradation due to the OPE is to add corrections allowing for degradation to a mask in advance. Hereinafter, such processing is referred to as optical proximity correction (OPC).

So far, many OPC methods have been reported. These methods are roughly classified into rule-based approaches to make corrections on the basis of correction rules which have been obtained in advance and simulation-based approaches of using a simulator by which phenomena involved in exposure processes are modeled. Typical examples of these two approaches will be described below.

First examples of rule-based approaches are described in Oberdan W. Otto et al.: "Automated optical proximity correction—a rule-based approach", pp. 278–293, and Richard C. Henderson et al.: "Correcting for proximity effect widens process latitude", pp. 361–370, both in Optical/Laser Microlithography VII, Vol 2197, SPIE Symposium on Microlithography 1994. These approaches make corrections on a mask pattern in advance allowing for dimensional errors due to various factors as described above.

Corrected masks are such that a pattern is partly widened/narrowed (refer to FIG. 1), a corner stressing pattern is placed in corners (see FIG. 1), an assist feature or features of less than resolution limit are placed inside or outside a pattern (see FIG. 2). In FIG. 1, dotted lines indicate mask patterns prior to correction, while fine lines indicate mask patterns after correction. In FIG. 2, reference character P denotes light shading mask patterns, while AF denotes an assist feature of less than limit resolution. The assist features are known to have effects of improving the pattern transfer accuracy if they are combined with annular illumination and preventing the sidelobes of the main pattern from being resolved if they are combined with a halftone type of phase shift mask. It is also known that the resolution of the main pattern is improved by placing a phasing member relative to either of the assist feature and the main pattern so that the phase of light transmitted through the assist feature is shifted by approximately 180 degrees with respect to the phase of light transmitted through the main pattern.

The correction procedure in the conventional approaches includes creating correction rules in advance and correcting the mask pattern accordingly. For example, the amount of correction dE for the correction amount of a reference edge is represented by a combination of parameters L0, L1, L2, G0, G1, W0, W1, and W2 shown in FIG. 3 as follows:

$$dE = f(L0, G0, W0, L1, G1, W1, L2, W2)$$

dE values are calculated based on various combinations of the parameters and entered into a table. In correction, a search is made of the table for a match in parameter combination. With a combination that is not included in the table, dE is obtained by interpolating between members in the table.

As an example of a conventional simulation-based approach, an OPC method using simulation of an optical image is discussed in the paper entitled "Fast optical proximity correction: analytical method" by Satomi Shioiri et al., Optical/Laser Microlithography VIII, Vol. 2440, SPIE Symposium on Microlithography 1995, pp. 261–269. With this method, a rectangle of a width of Δt is added/removed along the contour of a mask pattern and the width Δt is sought so that the light intensity at a point of interest on the contour reaches a desired value. By using this method, it is expected that correction can be made in a time several times the time required to calculate the image intensity at a point of correction.

However, those conventional techniques have the following problems.

With the rule-based approach, in the event that the previously prepared rules cannot apply, it is required to obtain a correction value by means of interpolation. Thus, there arises the possibility of error. In addition, it is very troublesome to seek all the rules for any of layouts in a mask. With complicated two-dimensional layouts in particular, suitable parameters become difficult to set up and moreover the parameters increase in number.

With the simulation-based approach, on the other hand, the optical image simulation requires very lengthy calculations. At present, it is considered very difficult to simulate the entire area of an LSI chip that measures 1 to 2 centimeters on a side. In particular, logic devices in which mask patterns are not always hierarchically defined will have an enormous amount of area to be corrected as compared with memory devices which have hierarchically defined mask patterns. Thus, the problem of processing time is more serious.

Moreover, the simulation-based approach, which simply displaces the contours of pictorial characters, cannot create assist features of less than limit resolution inside or outside the pictorial characters.

Thus, of the conventional techniques of correcting the OPE in creating mask data, the rule-based approach has a problem that there arises the possibility of error when the correction rules do not apply and the simulation-based approach has a problem that an enormous amount of time is required.

Next, a description will be given of a conventional technique in which attention is paid to active gates in a device.

As to the gate layer in the logic section in an LSI device, the dimensional precision of the width of active gates has a great effect on the device performance such as operation speed. For this reason, a very great precision in dimension is required and the OPC has to be made with precision. The layout of each active gate is characterized in that it generally has a length that is sufficiently great relative to the width. In many cases, therefore, the OPC for active gates is made with respect to one dimension, i.e., in the direction of width, in which case the direction of length is not taken into consideration.

A third conventional technique which applies the OPC to the active gates in the logic section is described in an article entitled "Optical Proximity Correction, a First Look at Manufacturability" by Lars. W. Liebmann, Photomask Technology and Management, SPIE Vol. 2322, 1994, pp. 229–238. In this technique, the gates in a 64-Mbit DRAM are subjected to the OPC with respect to the direction of width.

The procedure of the OPE correction will be described here with reference to FIG. 4. In this figure, areas indicated by oblique lines extending up from right to left indicate a gate conductor layer, an area indicated by oblique lines extending up from left to right indicate a diffusion layer, dotted areas indicate active gates, and bold lines indicate sides to be corrected. Of the patterns of gate conductor layer, sides (edges) including the active gates are extracted. For the active gate edge 1, the spacing or distance (D) between the edge and the pictorial character that is closest to the edge is measured. The edge is then shifted by the amount of bias corresponding to the spacing. When the left edge 2 is made a candidate for correction, it is shifted by the amount of bias corresponding to D, the spacing between the edge 2 and the closest pattern. A relationship between the spacing and the amount of bias has been sought in advance in the form of a table as shown below and an edge is shifted for correction while the table is being referred to.

TABLE 1

| SPACING IN MICROMETERS ($\mu$m) | AMOUNT OF BIAS IN MICROMETERS ($\mu$m) |
| --- | --- |
| –0.04 | 0.01 |
| 0.41–0.5 | 0.02 |
| 0.51– | 0.03 |

As a fourth example, the correction of gate width in logic devices is described in an article entitled "Simple Correcting Method of Optical Proximity Effect for 0.35 m Logic LSI's" by Eiich Kawamura et al, Proceedings of Microphotolithography Digest of Papers, 1995, pp. 286–287. Basically, this method is the same as the third technique described above in that the amount of bias corresponding to the distance to the adjacent pictorial character is added to an edge of interest.

The fourth method is distinct from the third method in that an edge is divided into line segments according to the position of a corner or corners of the adjacent pattern, and each line segment is shifted by the amount of bias corresponding to the distance to the adjacent pattern. In the example of FIG. 4, the edge 1 is divided into three segments S1, S2, and S3. For each of S1, S2 and S3, a search is made of the table for the amount of bias for the corresponding one of distances A, B and C. The edge segment is then shifted by the corresponding amount of bias.

In addition, the one-dimensional OPC approach is described in the article entitled "Automated Optical Proximity Correction—a Rule-Based Approach" by Oberdan W. Otto, which has been described herein as the first conventional technique.

As shown in FIG. 5, the amount of bias dE of an edge of interest is represented by a function of line/space parameters in the one-dimensional direction. In this case, the farther away the parameter is from the edge of interest, the less influence it will have on the amount of bias. In other words, the more the parameters, the more accurate dE will become. In the first conventional technique, a table is prepared in advance which establishes a correspondence between sets of parameters and amounts of correction. When no matching set of parameters is found in the table during correction processing, interpolation between sets of parameters in the table is performed to obtain the amount of correction.

The problems with the one-dimensional OPC in the first, third and fourth conventional techniques will be described with reference to FIGS. 6A, 6B, and 6C.

The OPC of layouts shown in FIGS. 6A, 6B and 6C using a commercially available program resulted in the optimum amounts of bias indicated in Table 2 below for edges (1), (2), (3) and (4). The exposure and mask conditions at this point were that annular illumination of a shading factor of ⅔ and a halftone mask of =0.6, NA=0.57, wavelength=365 mm, and amplitude transmittance factor=0.223607 were used.

TABLE 2

| | AMOUNT OF BIAS | | |
| --- | --- | --- | --- |
| Edge position | FIG. 6A | FIG. 6B | FIG. 6C |
| (1) | 0.012 | 0.012 | 0.012 |
| (2) | 0.012 | 0.009 | 0.009 |
| (3) | 0.012 | 0.005 | 0.005 |
| (4) | 0.012 | 0.028 | 0.028 |

Let us consider the case where the mask shown in FIG. 6B is subjected to the OPC by means of the third and fourth conventional techniques. In the third and fourth techniques, the amount of bias is set according to the distance between a point of interest and its adjacent pattern. First, a rule is determined from the layout of FIG. 6A such that the amount of bias is 0.012 micrometers when the spacing between adjacent pattern is 0.525 micrometers, so that the amount of bias of 0.012 micrometers is applied to all of edges whose distance to their respective adjacent pattern is 0.525 micrometers.

As for the edge (1) shown in FIG. 6B, the optimum amount of bias is 0.012 micrometers. As for the edges (2), (3) and (4), however, it can be read from Table 2 that their optimum amount of bias is not 0.012 micrometers because they are affected by a large pattern that locates on the right side of them. That is, when lines and spaces are arranged regularly, it is sufficient to apply to each edge the amount of bias corresponding to the distance to its adjacent pattern. When lines and spaces vary in width, however, a problem arises in that the precision of correction is not sufficient.

In the one-dimensional OPC of the first conventional method, unlike the third and fourth methods, the number of parameters is increased. That is, by taking into consideration lines and spaces which are far from an edge of interest, the precision of correction can be increased, eliminating the problem with the third and fourth methods.

For this reason, in order to correct the edge (2) shown in FIG. 6B with a sufficient precision, dE, the amount of bias is set as a function of nine parameters, i.e., f(L0, G0, G1, L1, L2, G2, G3, L3, L4). The use of the nine parameters will result in the amount of bias of the same precision as in Table 2. As is understood from the fact that the amounts of bias for the layouts shown in FIGS. 6B and 6C are identical, any difference in the layout to the right of L2 has no effect on the amount of bias. It will therefore be understood that, for the edge (2), parameters associated with the layout to the right of the pattern L2 are unnecessary.

In general, contribution of another point to the amount of bias for a certain point of interest is determined by optical conditions, layout, and the distance between the two points. The contribution of a point that is far away from the point of interest can be ignored. By contrast, a point that is at a sufficiently short distance from the point of interest makes contribution to the amount of bias for the point of interest. Hereinafter, the area that is within such a distance from the point of interest is referred to as the OPE range.

In summary, the problems with the one-dimensional OPC in the first conventional technique are that, if the number of parameters is too small, the correction precision becomes insufficient for the same reason as in the fourth conventional technique and, on the other hand, if the number of parameters is increased too much so as to assure the precision, much time is required for rule calculations and a table that makes amounts of bias correspond with parameters becomes larger than is necessary.

Moreover, a problem arises in the first conventional technique in that a correction table must be prepared prior to correction processing. The preparation of a correction table for any layout involves a lot of work and the table also increases in size. Furthermore, when there is no matching parameter set in the correction table, interpolation is made between parameter sets in the table, so that an error may occur in the process of interpolation.

Next, conventional techniques related to two-dimensional OPC will be described.

Methods of making automatic OPC on design data are roughly classified into two types: the simulation-based approach, and the rule-based approach. The simulation-based approach is not suited to handle data in a large-scale layout because much time is required to simulate an optical image. Thus, the rule-based approach appears to be more practical.

At this point, the first conventional technique described previously will be described again. In the first conventional technique, the contour of an input design pattern is divided into line segments, and a point of correction is set at the midpoint of each line segment (refer to FIG. 7). In FIG. 7, a symbol ○ indicates a point of correction. In division, each edge is divided at a point where a change occurs in the surrounding one-dimensional placement and the periphery of each corner is divided as well. For each point of correction, a selection is made among one-dimensional, 1.5-dimensional and two-dimensional rules according to its surroundings. The one-dimensional and 1.5-dimensional rules are applied to normal edge portions, while the two-dimensional rules are applied to corners. To make correction on each point of correction, reference is made to the correction table for the selected rules.

As a fifth conventional technique associated with the rule-based approach, there is a technique described in the article entitled "Large Area Optical Proximity Correction using Pattern Based Corrections" by David M. Newmark, Photomask technology and Management, Vol. 2322. In this technique, the correction is carried out by shifting with a proximity effect correction window (refer to FIG. 8) comprising a correction zone and a buffer zone. The buffer zone is placed around the correction zone to cover the proximity effect range. In shifting the proximity effect correction window, it is considered to be efficient to shift it so that its center will be placed at the corners and the centers of edges of a pattern (refer to FIG. 9). In FIG. 9, a symbol ○ indicates the center of the proximity effect correction window.

A sixth conventional technique relating to rule-based correction of contact holes in particular is a method which corrects the ratio of longitudinal and lateral dimensions of a hole pattern in accordance with intervals at which the hole pattern is arranged, the method being disclosed in Japanese Unexamined Patent Publication No. 8-254812. In this technique, the ratio of longitudinal and lateral dimensions of a hole pattern is determined as a function of the pitch Px of the hole pattern placement in one (x) direction. This method cannot be applied to contact holes that are regularly placed two-dimensionally. The publication thus says that the pitch Py in the other (y) direction should preferably be larger than the OPE range, i.e., not less than $3\lambda/NA$.

The problems with the conventional techniques will be described below.

In the first conventional technique, a reference is made to the table for each of points of correction set by dividing edges. In the case of FIG. 7, there are 20 points of correction and hence 20 references to the table must be made. In addition, since edges must be divided before processing, specific correction processing cannot be performed to suit the shape of a portion of a pattern or the shape of the entire pattern such as performing specific correction processing on a line end or performing specific correction processing on the shape of contact holes.

In the fifth conventional technique, correction is carried out while shifting an OPE window of a fixed size. In the case of FIG. 9, therefore, correction will be repeated four times for the pattern a and two times for the sides b-1 and b-2 of the pictorial character b. The sixth conventional technique cannot be applied to a two-dimensional placement of contact holes or to an aperiodic placement of contact holes.

Further, conventional techniques relating to two-dimensional OPC will be described next.

An example of a rule-based correction method is taught in the article entitled "Automated Optical Proximity Correction, a Rules-Based Approach", SPIE, vol. 2197, 1994, p 302. In this seventh conventional technique, a pattern placement is described by parameters (mainly pattern width, spacing, and length in one dimension). A table that describes correction values for this pattern placement is prepared and then referenced in performing correction processing. With this rule-based correction method, no straightforward method of describing and referencing a two-dimensional correction data table has been established. At present, simulation-based correction methods are mainly investigated.

An eighth conventional technique relating to the simulation-based correction is described in IEEE Trans. Electron Devices, Vol. 38, No. 12, 1991, p 2599, and uses an aerial image as a lithography model. To be specific, by performing an aerial image simulation on an input mask pattern, the amount of displacement of the optical image from a desired pattern edge is calculated and an edge of the mask pattern is shifted (corrected) by the amount of displacement in the direction opposite to the direction of displacement. The above operation is repeated to make the optical image approach the desired pattern.

As an example of making correction by taking all of process conditions into a model, there is the following report. That is, a test pattern is transferred onto a wafer under certain process conditions, a model (behavior model) is produced by measurements of pattern on the wafer, and thus all of process effects such as exposure, development, etching, etc., are included in the model. Correction values are calculated on the basis of that model (for example, SPIE vol. 2197, p 371). As to the simulation-based correction method, there are many other reports.

In applying the automated mask pattern correction technique to a large-area mask pattern, a method of making calculations and correction on all the area of the mask pattern at the same time is not practical because computers have limited processing speed and storage capacity. In order to use hardware resources efficiently, it will be easy to divide the mask pattern into areas suitable for correction and make correction on each of the areas on the basis of a model or correction rules.

Divided correction processing will be described with reference to FIG. 10. In this figure, P0 indicates a design layout area, P1 indicates a corrected layout area, A indicates an area to be corrected, A' indicates an area around the area to be corrected, a indicates an already corrected area, and Au indicates an uncorrected area. Assume that only the inside of one of divided areas, A, is set as an optical proximity effect calculation area for correction. Then, the OPE range from correction area in the surrounding divided areas A's will be disregarded. If, therefore, the area a thus corrected is incorporated into an already corrected mask pattern, the mask pattern will involve the results of improper correction. In particular, it is expected that the improper correction becomes noticeable in patterns in the neighborhood of the boundaries of A.

To avoid such improper correction, a method is described in SPIE Vol. 2197, p 348, which adds a buffer area to the periphery of a to-be-corrected area. This method is illustrated in FIG. 11. A buffer area B which covers the OPE range from the surrounding areas is added to the periphery of a to-be-corrected area A cut out from the design pattern P0 and the to-be-corrected area A and the buffer area B are combined to form an optical proximity effect calculation area C. Calculations are performed on the area C to obtain correction values. Among correction solutions obtained by the calculations, a correction solution for the to-be-corrected area (a) is returned to the corrected mask pattern P1. The procedure then goes to calculations on the next area. In FIG. 11, B is the buffer area of A, C is the OPE calculation area, c is an already corrected optical proximity effect calculation area, b is the buffer area of c, and a is the corrected solution of the to-be-corrected area.

FIGS. 12A and 12B are enlarged views of the area A and its surrounding area of FIG. 11. The to-be-corrected area A is surrounded by already corrected areas (1) to (4) and uncorrected areas (5) to (8). More specifically, FIG. 12A shows a to-be-corrected area and a buffer area in the conventional correction method, while FIG. 12B shows a to-be-corrected area and a buffer area which are actually used. As shown in FIG. 12A, a pattern input to a correction system as an optical proximity effect calculation area is an uncorrected design pattern containing a to-be-corrected area A and a buffer area B regardless of the progress of correction of the entire area of the mask pattern. For this reason, the buffer area of each to-be-corrected area should have contained already corrected patterns b and uncorrected patterns B from the point of view of the progress of correction. However, since all of uncorrected patterns B are input as a buffer area in performing calculations on each OPE calculation area, an accurate correction solution cannot be obtained within the to-be-corrected area when the pattern within the buffer area differs greatly before and after correction.

In FIG. 13, a mask pattern to be corrected is shown divided into areas A1 to A4. More particularly, this figure illustrates how many times correction calculation is performed repeatedly on each area. Some part in the area is calculated repeatedly because a buffer area of each divided area overlaps another divided area. Lb indicates the range of a buffer area, and S1 to S4 indicate areas in which correction calculations are performed one time to four times. As shown in FIG. 13, since the correction calculations are performed on the entire OPE calculation area for each to-be-corrected area, uncorrected patterns in the buffer areas are subjected to correction calculation and pattern data processing two (S2) to four times (S4), resulting in waste of a large amount of calculation time.

In dividing a mask pattern of a large area and making correction for each divided area, the conventional method inputs uncorrected pattern as a buffer area for correction.

The first problem with this method is that, even for an area for which correction calculations have already performed and a correction solution has been obtained, an uncorrected pattern is taken as a buffer area into an OPE calculation area. And hence the pattern taken into the buffer area differs from a pattern to be placed after the termination of correction operation. For this reason, a deviation from a true correction solution will occur. The second problem is that, when dividing correction is made on a mask pattern of a large area, calculations are made redundantly for buffer areas, resulting in waste of calculations.

BRIEF SUMMARY OF THE INVENTION

It is an object of the invention to provide an optical proximity correction (OPC) method which permits calculation time required for optical proximity correction to be reduced and pattern precision to be improved and more particularly to provide an optical proximity correction method which permits the precision in correction to be increased in comparison with the case where only a rule-based approach is used and processing to be simplified in comparison with the case where only a simulation-based approach is used, thereby making better optical proximity correction.

It is a second object of the invention to provide an optical proximity verification method which permits created mask data (design data) to be verified.

It is a third object of the invention to provide an optical proximity correction method which permits optical proximity correction to be made without dividing a mask pattern in advance and setting up any point of correction and the number of references to a table to be minimized.

It is a fourth object of the invention to provide a mask data generation method which permits information on a separate layer within a pattern matching zone to be captured, permits the optical proximity effect produced in relation to the separate layer to be corrected, and permits the separate layer as well to be corrected.

It is a fifth object of the invention to provide an optical proximity correction method for contact holes which permits optical proximity effect to be made with a simple shape without any serif and a mask to be created easily.

It is a sixth object of the invention to provide an optical proximity correction method which permits optical proximity correction to be made on contact holes that are arranged aperiodically or two-dimensionally.

It is a seventh object of the invention to provide an optical proximity correction method which permits an appropriate solution with as little error as possible with respect to a true correction value to be obtained, the calculation time for optical proximity correction to be reduced and the pattern precision to be improved.

It is an eighth object of the invention to provide an optical proximity correction method which permits unnecessary calculation duplication to be avoided when a buffer area within the optical proximity effect range is included in an optical proximity effect calculation area and permits the time required to reach at a solution to be reduced.

According to a first aspect of the present invention there is provided an optical proximity correction method for controlling accuracy in LSI (Large-Scale Integration) patterning, the method comprising the steps of: making first correction on design data for a first area of a mask pattern using a prepared correction table contains correction values corresponding to a pattern and surrounding layout; and making second correction on the design data for the other area of the mask pattern than the first area using correction amount calculated on the basis of simulation of an exposure process for a mask.

In this method, when an object of correction is a central processing unit that has a cache memory built in, the first correction may be made on the other area than the cache memory area and the second correction may be made on the cache memory area.

When the object of correction is patterns defined in a gate conductor layer and either of conditions that its side having an overlap with a diffusion layer is within a distance of a first threshold value from the adjacent side parallel to it and the ratio of the length of the side and the distance is more than a second threshold value is satisfied, the correction may be made by shifting the side in the direction perpendicular to it.

According to this method, the rule-based correction and the simulation-based correction are performed in combination to combine the advantages of the two correction methods. That is, the rule-based correction allows assist features which cannot usually be generated by the simulation-based correction to be created, high processing speed to be attained, and the edge of a pattern that is not desired to be divided to be corrected without dividing.

The provision of correction rules for any layout is not efficient. Although there is no guarantee that all of layouts are covered by rules, parts that the rules is not applicable can be corrected by the simulation-based correction method, allowing any two-dimensional layout to be corrected. By applying the simulation-based correction to only parts that do not meet the rules, the area for the simulation-based correction requiring a large amount of processing time can be minimized.

According to a second aspect of the present invention there is provided an optical proximity correction method for controlling accuracy in LSI (Large-Scale Integration) patterning, the method comprising the steps of: setting up a point of correction on a side of a design pattern; seeking a one-dimensional layout existing within the range of the optical proximity effect from the point of correction in the direction perpendicular to the side on which the point of correction is located; referring to a correction table that stores one-dimensional layouts and their corresponding values; creating training data that is identical in line and space arrangement to the one-dimensional layout and has a sufficient size in the direction of the length of the side when the one-dimensional layout sought has not been found in the correction table; calculating a correction value relating to the point of correction by making optical proximity correction on the training data; adding the one-dimensional layout and the correction value to the correction table; reading the corresponding correction value from the correction table when the one-dimensional layout has been found in the correction table; and correcting the side including the point of correction in accordance with the correction value calculated or read.

In the above method, the adding step includes a substep of adding the positional coordinates of the point of correction along with the one-dimensional layout and the correction value, and further comprises the steps of: reading the positional coordinates of the point of correction from the correction table; seeking a one-dimensional layout in the mask pattern after correction within the range of optical proximity effect from the coordinate position of the point of correction read from the correction table; making training data after correction which has an identical line and space arrangement to the one-dimensional layout in corrected mask, and has a sufficiently great size in the direction of length; making simulation of an exposure process on the training data after correction; and calculating a deviation between the point of correction in the result of the simulation and the point of correction in the training data before correction, thereby verifying the point of correction.

According to the optical proximity correction method of the second aspect, correction is made on a point of correction set on a side of a design pattern in accordance with a one-dimensional layout within the optical proximity effect range from the point of correction, allowing high-precision correction. At the time when a layout that is not listed in the correction table is found during correction processing, training data relating to the layout is created to calculate a correction value for that layout, eliminating the need of providing a correction table in advance. The correction table is simply required to have a necessary and sufficient size.

Training data after correction is obtained from the correspondence between training data and coordinates of points of correction and then input to a simulator for an exposure process to calculate a displacement of the point of correction between the result of the simulation and training data before correction, thereby verifying that the optical proximity correction has been made correctly.

According to a third aspect of the present invention there is provided an optical proximity correction method for controlling accuracy in LSI (Large-Scale Integration) patterning, the method comprising the steps of: setting a circumscribed rectangle of a pattern to be corrected or a layout resulting from growing the pattern to be corrected by a distance over which the optical proximity effect reaches as a pattern matching zone; referring to a correction table that stores pattern matching zones and corrected patterns of patterns to be corrected included in the pattern matching zones using the pattern matching zone set as an index; calculating a corrected pattern of the pattern to be corrected by making optical proximity correction on the pattern matching zone set when the pattern matching zone is not stored in the correction table as an index; adding the pattern matching zone and the corrected pattern calculated to the correction table; reading a corresponding corrected pattern from the correction table when the pattern matching zone is stored in the correction table; and correcting the design pattern in accordance with either of the corrected pattern calculated and the corrected pattern read from the correction table, thereby creating mask data.

According to a fourth aspect of the present invention, there is provided an optical proximity verification method for controlling accuracy in LSI (Large-Scale Integration) patterning, the method comprising the steps of: setting a circumscribed rectangle of a pattern to be verified or a layout resulting from growing the pattern to be verified by a distance over which the optical proximity effect reaches as a verification pattern matching zone; referring to a verification table that stores verification pattern matching zones and the results of simulation of a process made on the verification pattern matching zones using the verification pattern matching zone set as an index; making process simulation on the verification pattern matching zone when it is not stored in the verification table; adding the result of the process simulation and the pattern matching zone to the verification table; reading the corresponding simulation result from the verification table when the verification pattern matching zone is stored in the verification table; and calculating a deviation between the pattern to be verified and the pattern to be verified included in the result of the process simulation using the simulation result sought or the simulation result read from the verification table, thereby verifying the pattern.

In this method, the layout of a pattern matching zone corresponding to a pattern to be corrected is extracted and then used as an index to refer to the correction table. When the layout of the pattern matching zone is listed in the table, the corresponding corrected pattern is obtained. When not listed in the table, the pattern matching zone is subjected to the optical proximity effect calculation to obtain the corrected pattern of the pattern to be corrected. The correspondence relationship between the pattern matching zone and the corrected pattern is added to the correction table.

According to such an optical proximity correction method, a pattern matching zone is set for each pattern and the correction table is referred to for each pattern matching zone, thus eliminating the need of dividing a pattern in advance and setting a point of correction. Since the correction table is referred to for each pattern, the number of references to the table can be minimized. Information about the other layer within a pattern matching zone can also be captured, allowing optical proximity effect resulting from correlation with the other layer to be corrected. In addition, the other layer can also be corrected at the same time.

When the pattern to be corrected is a contact hole, the optical proximity correction can be made with a simple shape without any serif, allowing for ease of mask fabrication. Further, as compared with the conventional method, the optical proximity correction can be made on even contact holes that are arranged aperiodically or two-dimensionally.

Furthermore, in the optical proximity effect verification processing, only one process simulation is required for patterns having the same pattern matching zone, significantly improving the efficiency.

Here, the effects of the first through third aspects of the invention will be described again. In each of the embodiments, a necessary and sufficient correction table (or a verification table) is created.

For example, in a table used with the rule-based approach, which requires to be prepared in advance, correction values are made to correspond with generalized parameters such as lines and spaces.

In the present invention, on the other hand, placements of all patterns included in a layout have been extracted even if they are one-dimensional or two-dimensional. Thus, the analysis of a correction table in the invention allows the tendency of the layout to be recognized. According to a verification table, even if a correction has been made, a placement for which an error will not fall within an allowable range can be detected. Such a placement can be fed back to a designer as a design inhibit placement.

Further, by counting how many each placement listed in the table is included in a layout, it becomes possible to adapt optical conditions to the placement that is most included in the layout. A specific placement listed in the table can be exchanged for a placement created by an operator.

According to a fifth aspect of the present invention there is provided an optical proximity correction method for controlling accuracy in LSI (Large-Scale Integration) patterning, the method comprising the steps of: dividing a mask pattern to be corrected included in the design pattern into areas of proper size; setting an optical proximity effect calculation area by selecting one of the areas and adding buffer areas to the periphery of the selected area; making optical proximity correction on the optical proximity effect calculation area on the basis of results of calculation by a simulator that models part or the whole of a lithography process or previously prepared correction rules; fetching a result of the correction on the selected area in the optical proximity effect calculation area after the termination of the correction of the optical proximity effect calculation area and acquires the result of the correction as the result of correction of the selected area in the mask pattern to be corrected; and when the buffer areas include area in which a pattern has corrected, setting the corrected pattern into the buffer areas.

In the method described above, the optical proximity correction step may exclude the area that has already been corrected in the buffer area from correction.

According to such an optical proximity correction method, a buffer area is set around the periphery of an input divided area to be corrected. At this point, the area to be corrected and the buffer area are set as an optical proximity effect calculation area. For the buffer area, a decision is made as to whether or not it overlaps with a correction completed area. For areas which do not overlap, a group of uncorrected patterns is set as an initial input pattern group in the correction processing. For areas which overlap, a group of correction completed patterns is set as an initial input pattern group. Thereby, for the optical proximity effect calculation area, correction calculation can be initiated with a pattern close to a correction solution as an initial input pattern.

Next, a correction value or correction pattern for each pattern or pattern group is calculated by means of model calculations or the like. Pattern data processing is performed to correct each pattern or pattern group in accordance with the correction value or correction pattern. In this processing, for an area that is included in the buffer area and for which an initial input is a group of correction completed patterns, the initial input pattern is used as it is during the pattern data processing, thereby omitting correction calculation and graphic processing. Thereby, unnecessary pattern data processing and calculation can be avoided and the correction solution can be obtained fast. The processing may be performed on design data or may be performed on data after processing such as mask data conversion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, in which:

FIG. 23 is a flowchart illustrating a mask OPC method according to a sixth embodiment of the present invention;

FIG. 25 shows a table of parameterized one-dimensional layouts and correction values in the sixth embodiment;

FIG. 26 shows training data created for a point of interest shown in FIG. 24B;

FIGS. 27A and 27B are a flowchart for mask OPC and verification method according to a seventh embodiment of the present invention;

FIG. 31 is a block diagram of an OPC and verification device according to a ninth embodiment of the present invention;

FIG. 32 is a flowchart illustrating a simulation method according to a tenth embodiment of the present invention;

FIG. 33 is a flowchart illustrating an OPC method according to an eleventh embodiment of the present invention;

FIG. 34 is diagram for use in explanation of a pattern matching zone in the eleventh embodiment;

FIG. 35 is diagram for use in explanation of a pattern matching zone in the eleventh embodiment;

FIG. 36 shows an example of a correction table used in the eleventh embodiment;

FIG. 38 is a flowchart illustrating an OPC method according to a twelfth embodiment of the present invention;

FIG. 41 shows an example of a correction table used in the thirteenth embodiment;

FIGS. 44A and 44B are diagrams for use in explanation of contact holes to be corrected and correction thereof in a fourteenth embodiment of the present invention;

FIG. 45 is a flowchart illustrating a mask data verification method according to a fifteenth embodiment of the present invention;

FIG. 51 is a flowchart illustrating an OPC method according to a twentieth embodiment of the present invention;

FIGS. 52A to 52D are diagrams for use in explanation of correction processing in the twentieth embodiment.

DETAILED DESCRIPTION OF THE INVENTION

Figure 1:
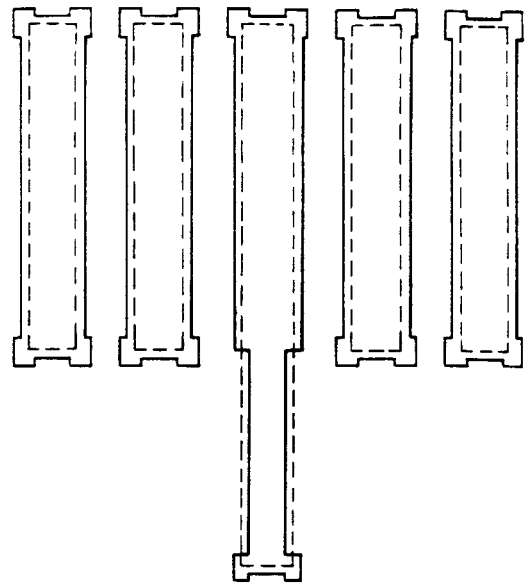
FIG. 1 shows a pattern subjected to OPC based on a conventional rule-based approach.
Figure 2:
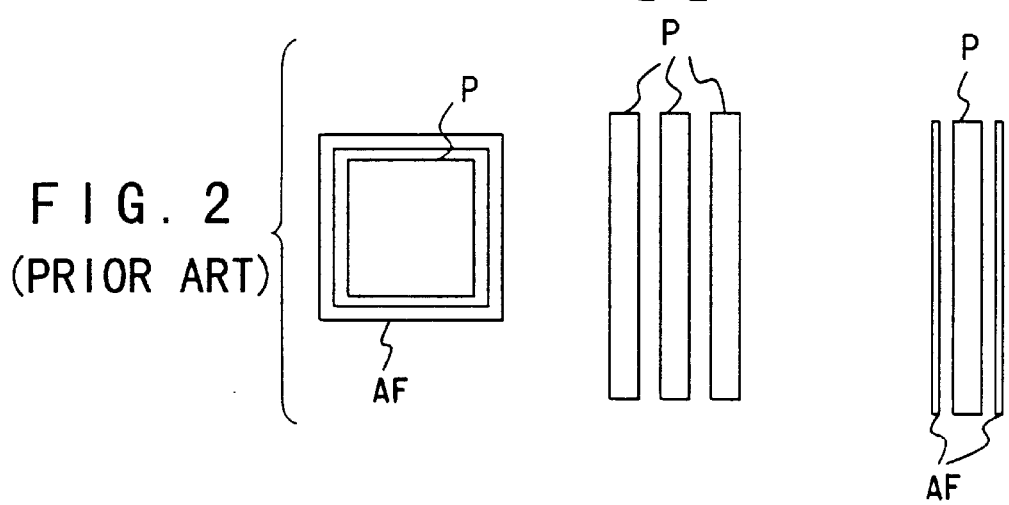
FIG. 2 shows corrected patterns using assist features (patterns) of less than limit resolution in the OPC based on the rule-based approach.
Figure 3:
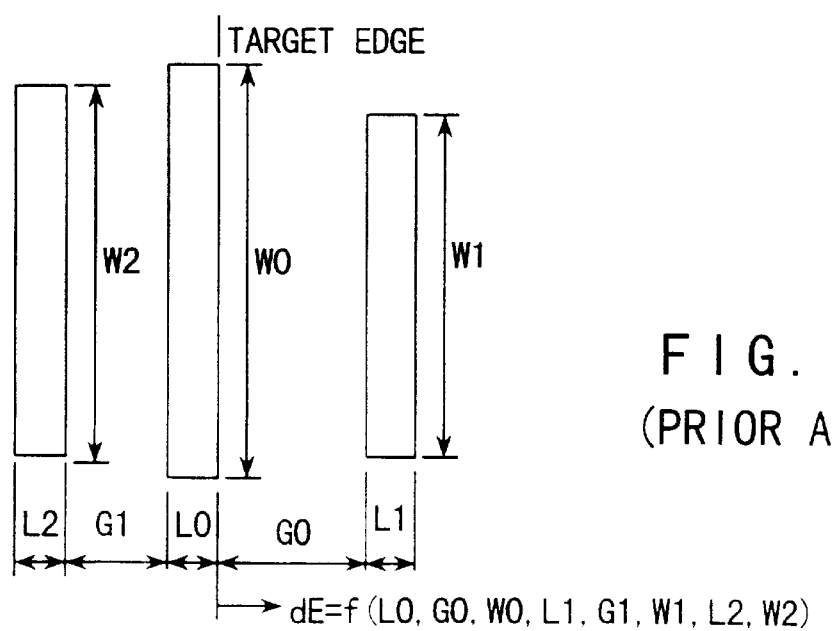
FIG. 3 shows parameters to be entered into a look-up table in the rule-based approach.
Figure 4:
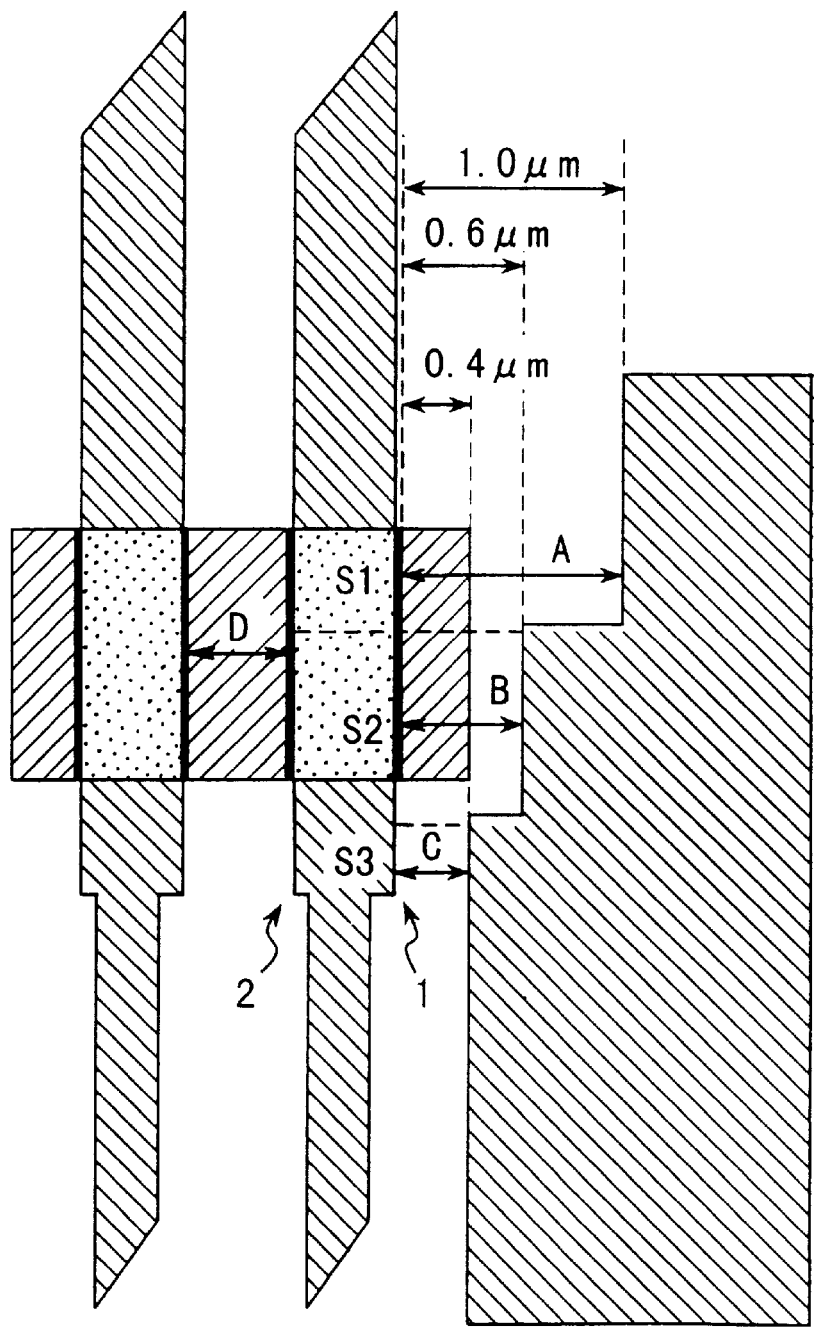
FIG. 4 shows a gate conductor layer and a diffusion layer to illustrate a conventional procedure of OPC.
Figure 5:
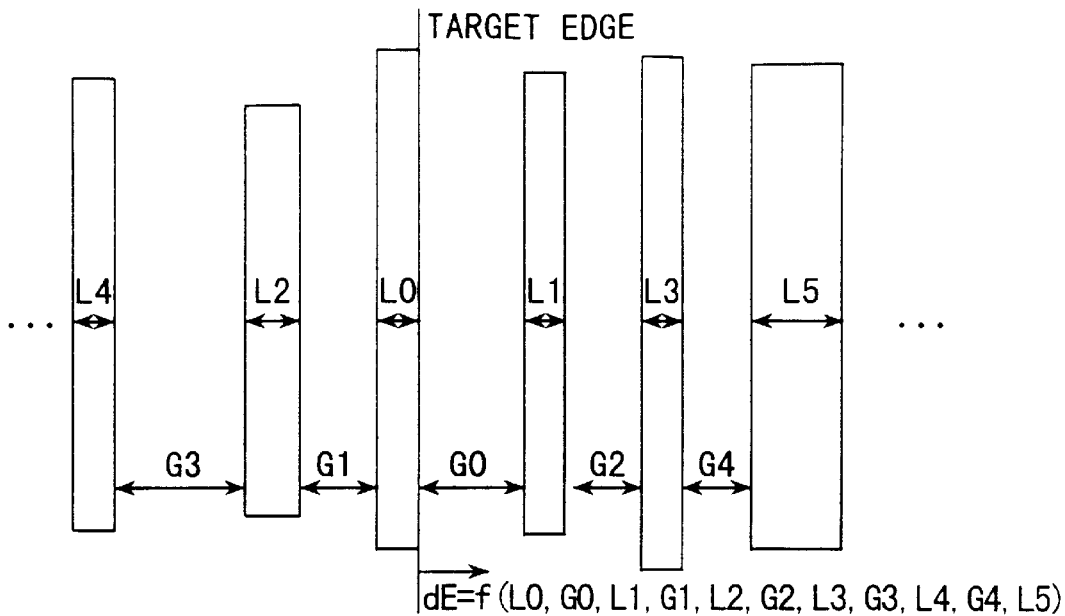
FIG. 5 is a diagram for use in explanation of a conventional one-dimensional OPC process.
Figures 6A, 6B:
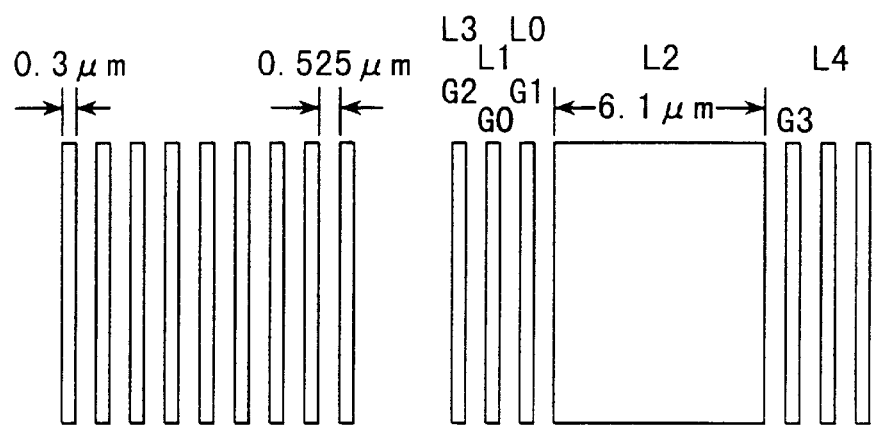
FIGS. 6A to 6C are diagrams for use in explanation of problems with the conventional one-dimensional OPC.
Figure 6C:
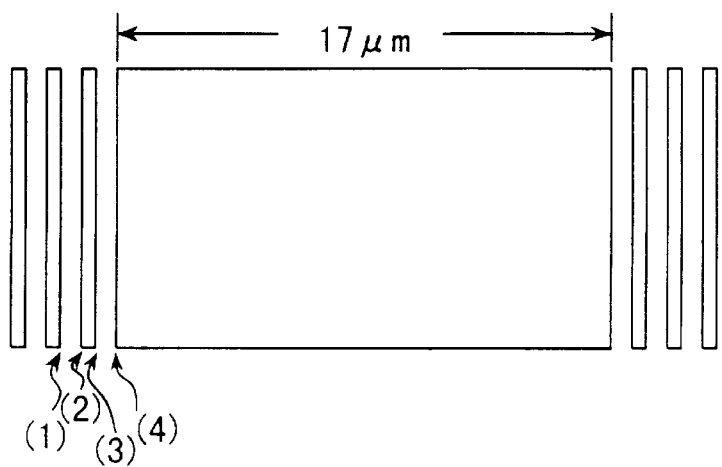
Figure 7:
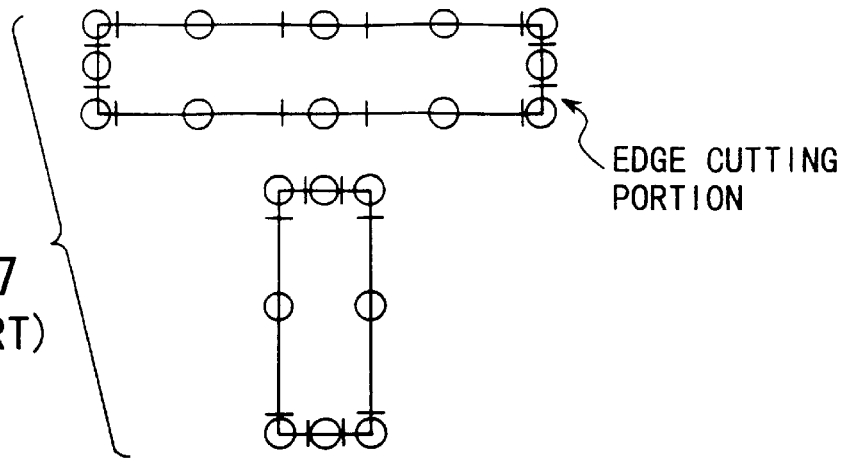
FIG. 7 is a diagram for use in explanation of a conventional OPC.
Figure 8:
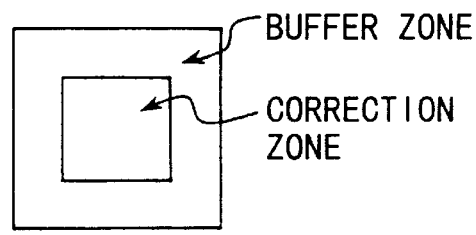
FIG. 8 is a diagram for use in explanation of a proximity effect window in the conventional OPC.
Figure 9:
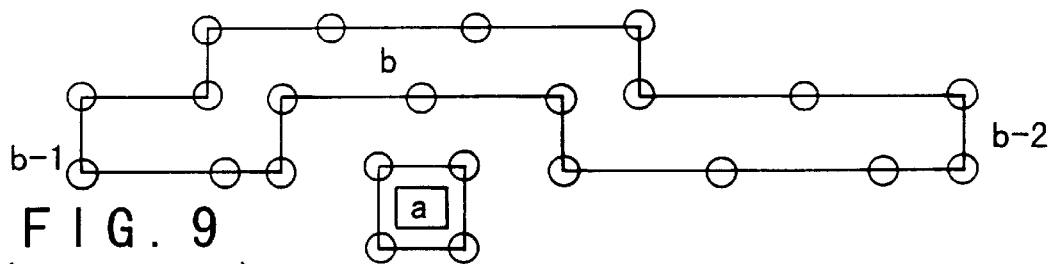
FIG. 9 is a diagram for use in explanation of the shift of the proximity effect window of FIG. 8.
Figure 10:
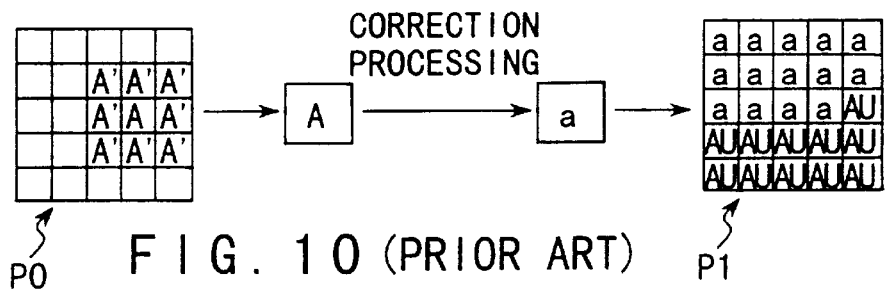
FIG. 10 is a diagram for use in explanation of conventional divided correction processing.
Figure 11:
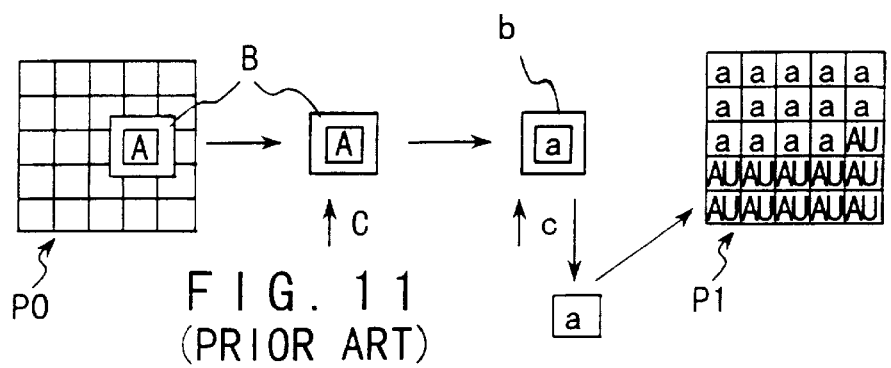
FIG. 11 is a diagram for use in explanation of a conventional method of adding a buffer area to the periphery of an area to be corrected.
Figure 12A:
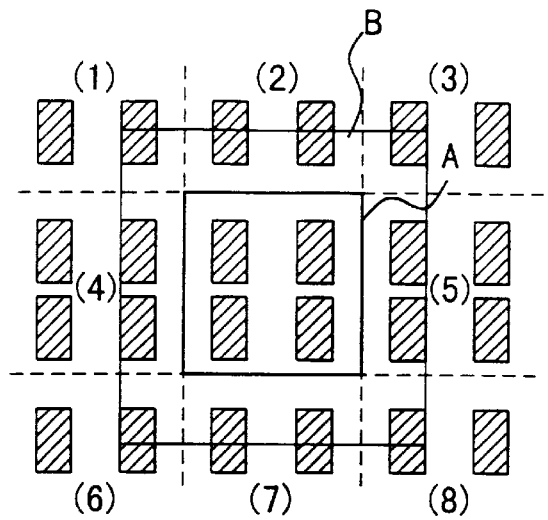
FIGS. 12A and 12B are enlarged views of the neighborhood of A of FIG. 11.
Figure 12B:
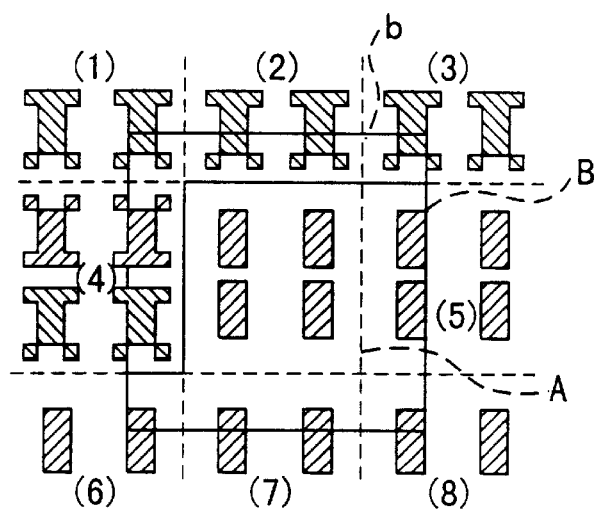
Figure 13:
FIG. 13 is a diagram for use in explanation of the number of times of execution of correction calculations in the conventional divided correction processing.
Figure 14:
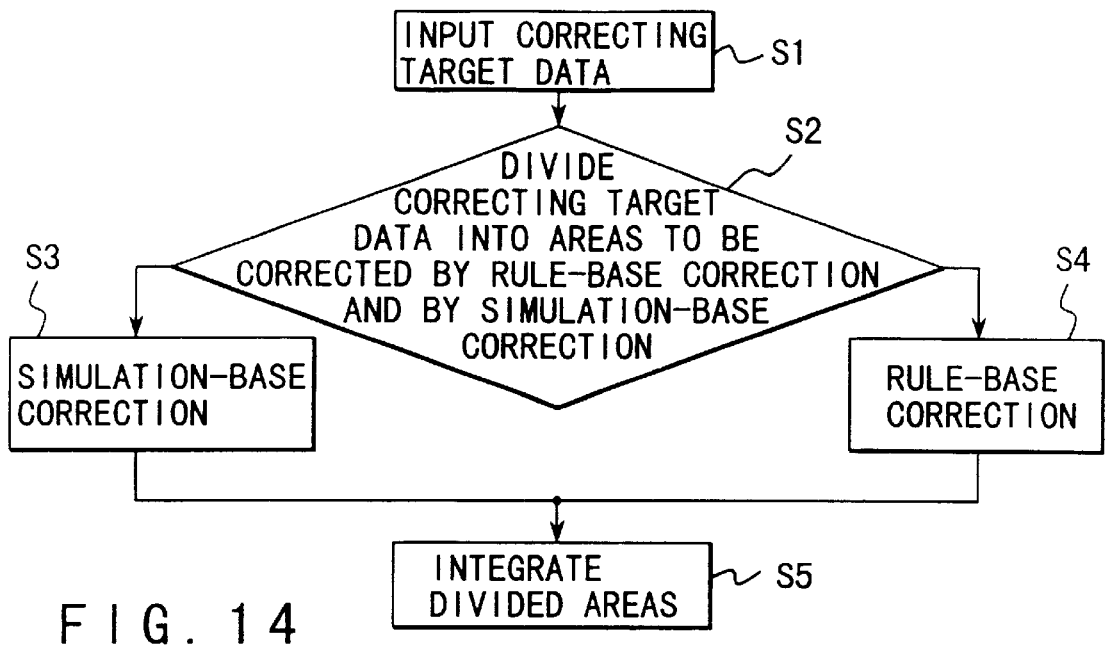
FIG. 14 is a flowchart illustrating a mask OPC method according to a first embodiment of the invention.

Referring now to FIG. 14, there is illustrated a simplified procedure for mask OPC according to a first embodiment of the present invention. When pattern data that is an object of correction is entered (step S1), the pattern area is separated in step S2 into a subarea on which correction is made using correction values which have been calculated in advance for each pattern and its surrounding layout (this type of correction is hereinafter referred to as rule-based correction) and a subarea on which correction is made using the amount of correction calculated on the basis of simulation (this type of correction is hereinafter referred to as simulation-based correction).

Figure 15:
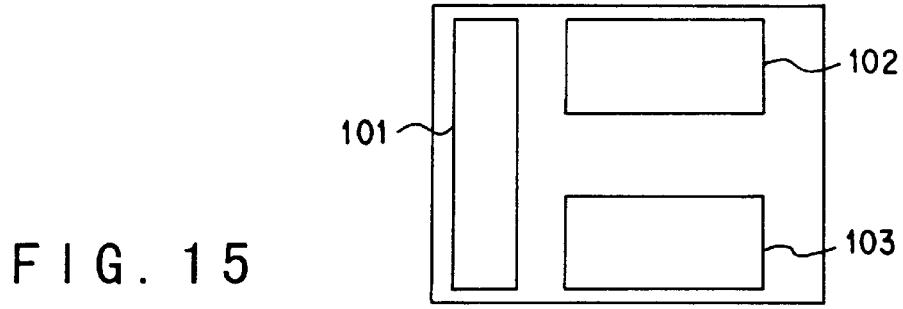
FIG. 15 shows a schematic layout of a central processing unit that is an object of correction in the first embodiment.

For example, suppose that OPC is made on a gate conductor layer in a central processing unit. A schematic layout of the central processing unit is illustrated in FIG. 15. In this figure, reference numeral 101 denotes a cache memory, 102 denotes a floating-point arithmetic unit, and 103 denotes a integer arithmetic unit. The pattern is characterized in that the cache memory has a small number of polygons having long parallel sides, while the other areas have a large number of polygons that have long parallel sides. In the gate pattern, the width of active gates having an overlap with a diffusion layer is very important from the point of view of electrical characteristics of circuits, and the dimensional precision of the spacing between the long parallel sides is more important. For the gate layer pattern in the cache memory, it is required that the accuracy of the entire pattern be improved.

Taking the difference in pattern between subareas into consideration, the simulation-based correction is made on the gate layer in the memory (step S3) and the rule-based correction using rules based on the active gate width only is made on the gate layer in the other areas (step S4). After that, the subareas each subjected to the corresponding OPC are integrated with each other (step S5). The memory occupies several tens of percentage of the entire area in the layout of the central processing unit. Since the memory is designed hierarchically, the area that is a candidate for correction is much smaller than the total area. Thus, the simulation-based correction that is low in speed can be made. The simulation-based correction is made by simply using an optical-image simulator as described in connection with the prior art techniques or a simulator including even development process. The rule-based correction method will be described below in terms of specific examples.

As the most straightforward example, it is supposed here that correction is made according to the distance between an edge of interest and the adjacent pattern. First, Table 3 shown below is prepared. The correction rules are such that exposure wavelength=365 nm, NA=0.5, =0.7, and the halftone mask used has a amplitude transmittance of 5% and a phase difference of 180 degrees. The correction value corresponds to the distance by which the edge of interest is shifted in the direction perpendicular to that edge for correction. The sign "+" indicates the direction to widen a pattern on which the edge of interest is located, while the sign "−" indicates the direction to narrow that pattern.

TABLE 3

| DISTANCE BETWEEN EDGE OF INTEREST AND ADJACENT PATTERN | CORRECTION VALUE ($\mu$m) |
|---|---|
| 0.4 ($\mu$m) | 0.0 |
| 0.7 ($\mu$m) | −0.015 |
| 2.0 or more ($\mu$m) | −0.030 |

Figure 16:
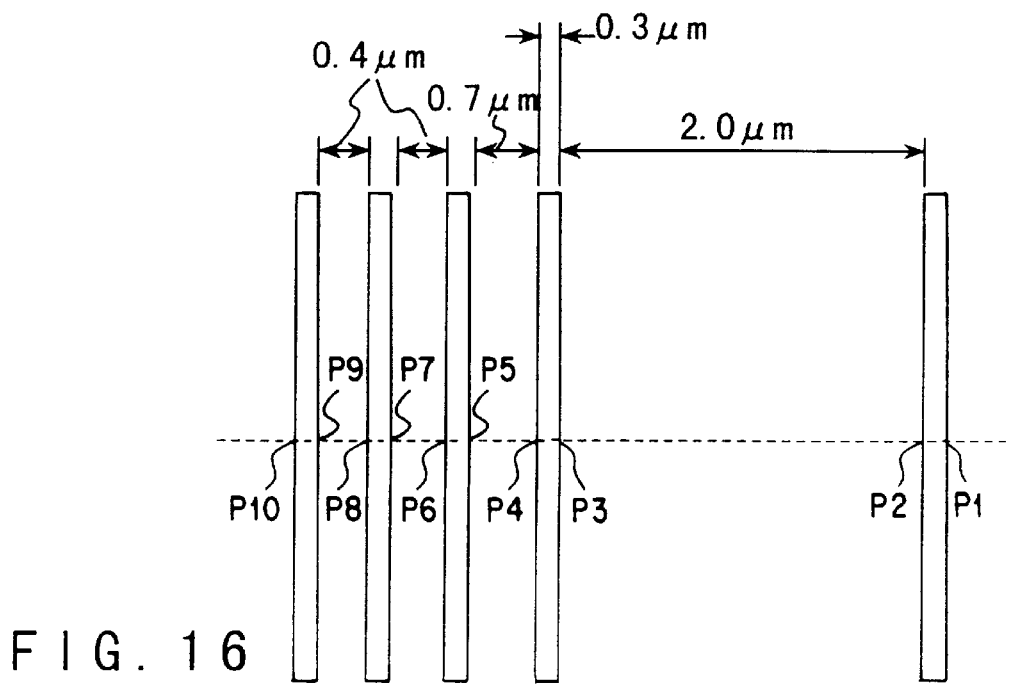
FIG. 16 shows the layout of a mask subjected to OPC of FIG. 14.

The correction values in Table 3 are calculated under the exposure and mask conditions described above. If the exposure conditions are changed, the correction values must be updated accordingly. Suppose here that a layout shown in FIG. 16 is corrected only in the direction of width of each line. A point of interest is set up at the midpoint of the long side of each line. First, with the point P1, its adjacent pattern is two micrometers or more away. Thus, the correction value is read as −0.03 micrometers from table 3 and the side on which the point P1 lies is shifted toward the inside of the pattern (to the left in the drawing). With the point P2 as well, the adjacent pattern is two micrometers away, so that the correction value is −0.03 micrometers and the side on which the point P2 lies is shifted toward the inside of the pattern. The short side is extended/reduced by the amount of shift of the long side. For the points P3 through P10, the same processing is performed.

In this example, the distance between each point of interest and its adjacent pattern is listed in the table. For a distance that is not listed in the table, simulation is made on a point of interest for distance to thereby obtain a simulation-based correction value. The correction value thus obtained is added to the table. The rule-based correction allows correction values to be obtained by simply referencing the table and hence is much faster than the simulation-based correction.

As described above, according to the first embodiment, the rule-based correction is made on areas other than the cache memory area, while the simulation-based correction is made on the cache memory area. For this reason, no error will occur in areas where previously prepared rules do not apply unlike when the rule-based correction alone is used and a large amount of time will not be required unlike when the simulation-based correction alone is used. Thus, the OPC can be made with no error. This is adapted for creating mask data used in manufacturing a mask for photolithography or X-ray lithography and specially adapted for manufacturing a reduced projection printing mask used to form fine patterns.

Next, a second embodiment of the present invention will be described with reference to FIGS. 17 to 18C.

Figure 17:
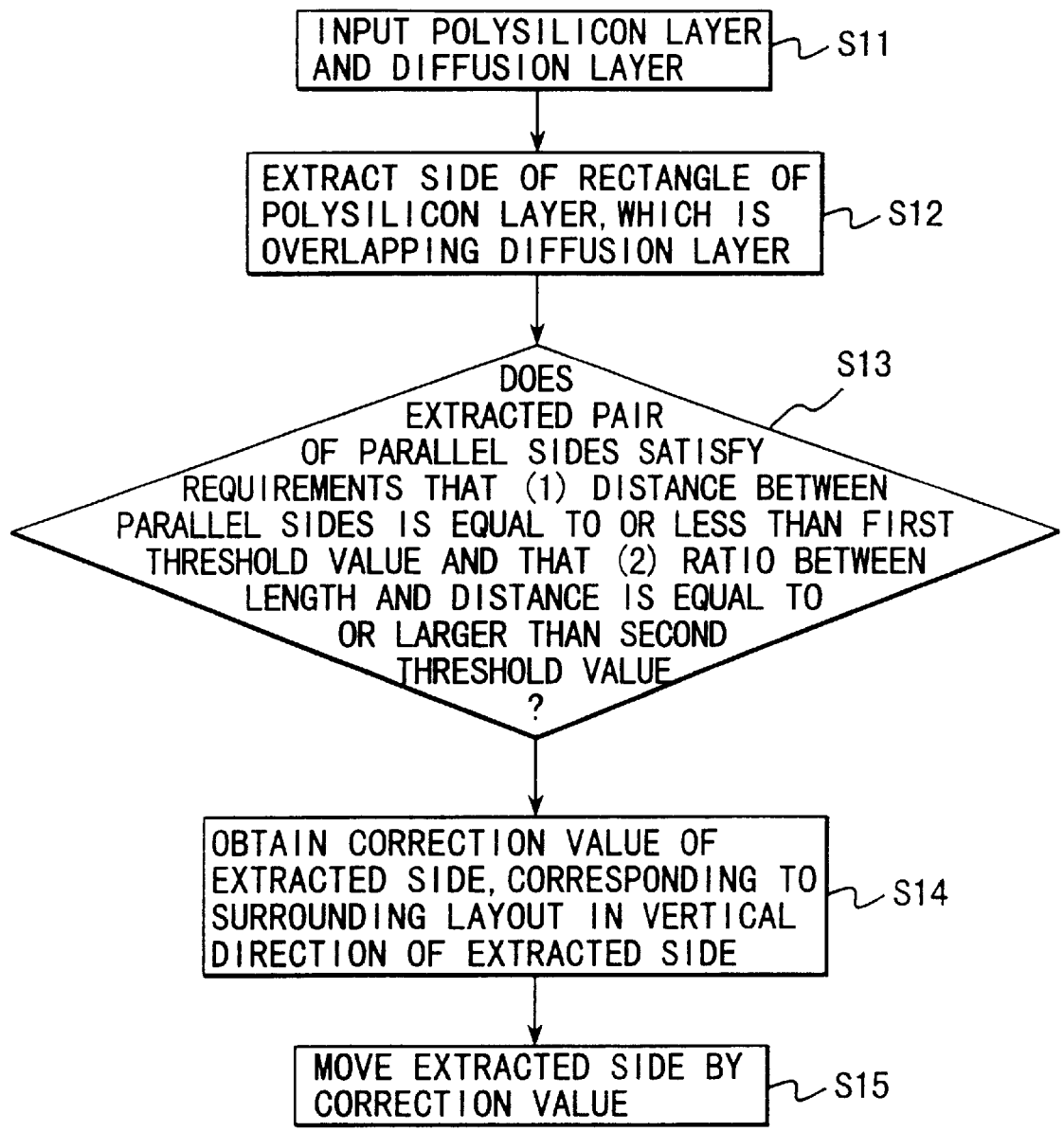
FIG. 17 is a flowchart illustrating a mask OPC method according to a second embodiment of the present invention.
Figure 18A:
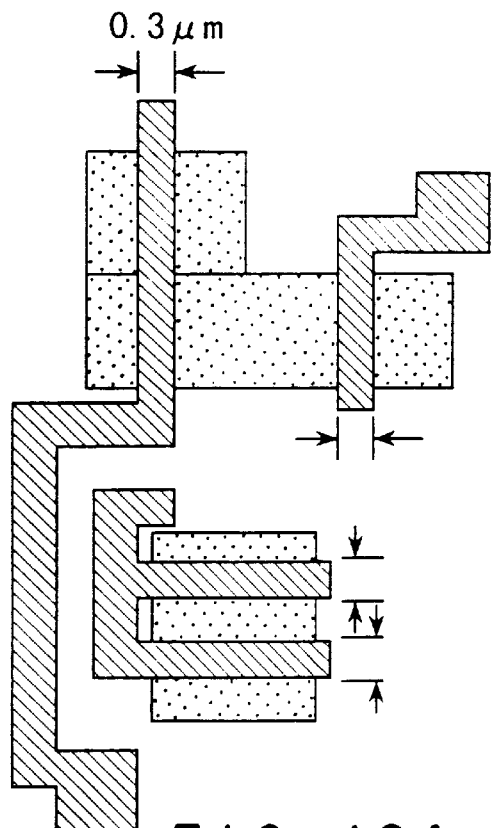
FIGS. 18A, 18B and 18C show mask patterns subjected to the OPC shown in FIG. 17.
Figure 18B:
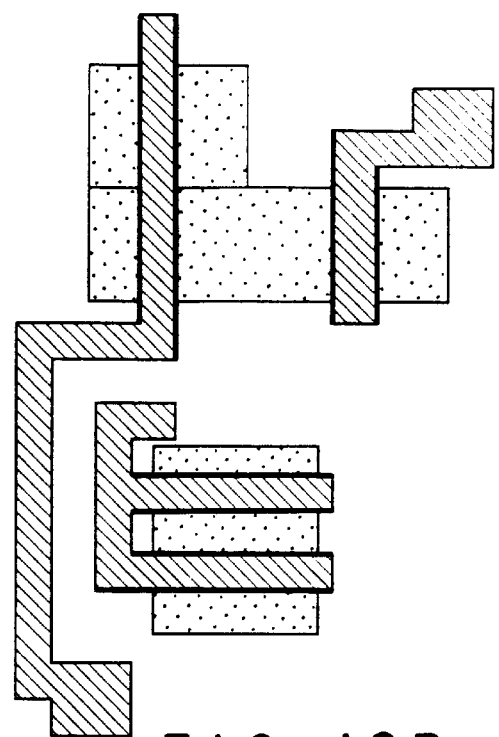

First, data on gate conductor layers and diffusion layers are entered (step S11 in FIG. 17, and FIG. 18A). Next, pattern calculations (logical product) are performed to extract those sides of polygons of the gate conductor layers which overlap the diffusion layers (step S12). In FIGS. 18A to 18C, shaded areas indicate the gate conductor layers and the dotted areas indicate the diffusion layers. Of those sides, sides in the same pattern that are parallel to each other and satisfy either of the following conditions are made candidates for correction. The conditions are such that the distance between sides is less than a first threshold value and the ratio between length and distance is less than a second threshold value. The sides to be corrected are shown by bold lines in FIG. 18B.

Figure 18C:
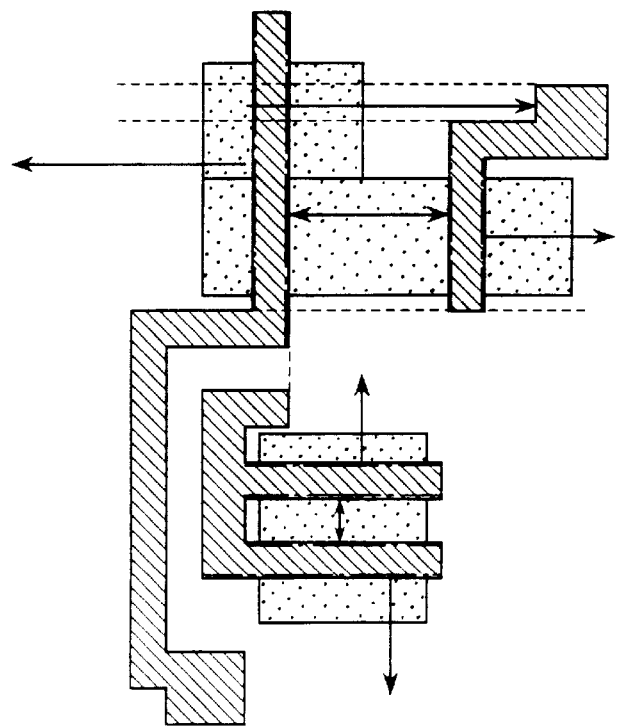

In the example of FIGS. 18A to 18C, the first condition is used and the first threshold value is set to 0.3 micrometers. The use of the first condition allows only gates which should be defined more precisely to be extracted for correction. The second condition allows gates in which their dimension in the direction of length is larger than in the direction of width to be extracted. With such gates, their long sides are properly corrected on the basis of one-dimensional rules in which only width of line is considered and length is assumed to be long enough.

After sides to be corrected have been extracted, a correction value for each side is obtained by making a reference to a table in which each side is made to correspond with a correction value with respect to a pattern placement in a direction perpendicular to that side (step S14). The most straightforward table form is one that sets each correction value as a function of distance to its adjacent pattern as in Table 3 shown above. Subsequently, each side is shifted by the amount specified by the correction value (step S15, FIG. 18C). Of course, other sides of the same pattern are extended/reduced to suit a shift of that side. In FIG. 18C, the direction in which a pattern adjacent to a side to be corrected is searched for is indicated by an arrow and each pattern to be corrected is shown by dotted lines.

Next, a third embodiment of the present invention will be described with reference to FIGS. 19A to 20E.

Figure 19A:
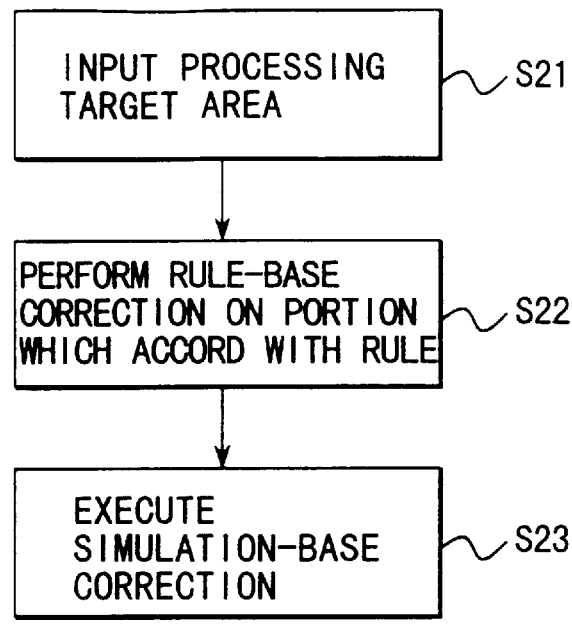
FIGS. 19A and 19B are flowcharts illustrating a mask OPC method according to a third embodiment of the present invention.
Figure 19B:
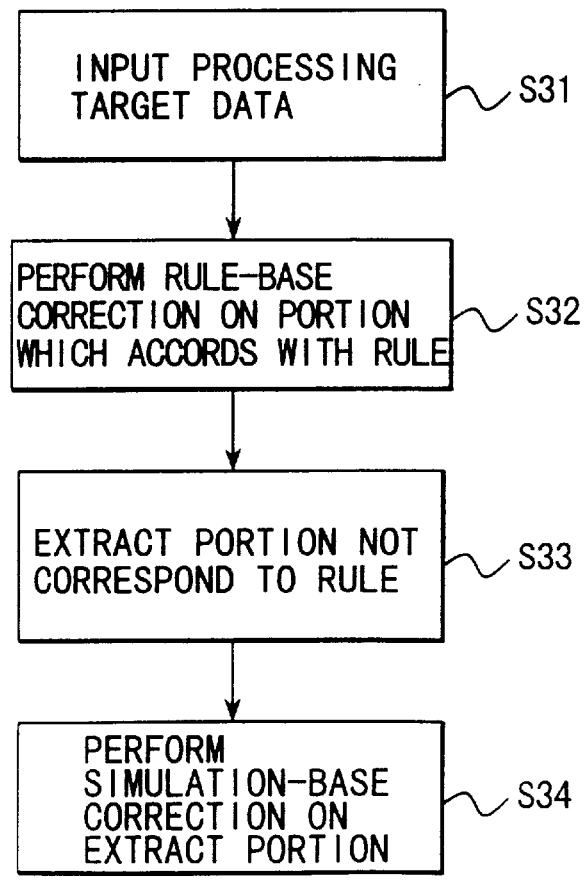
Figure 20A:
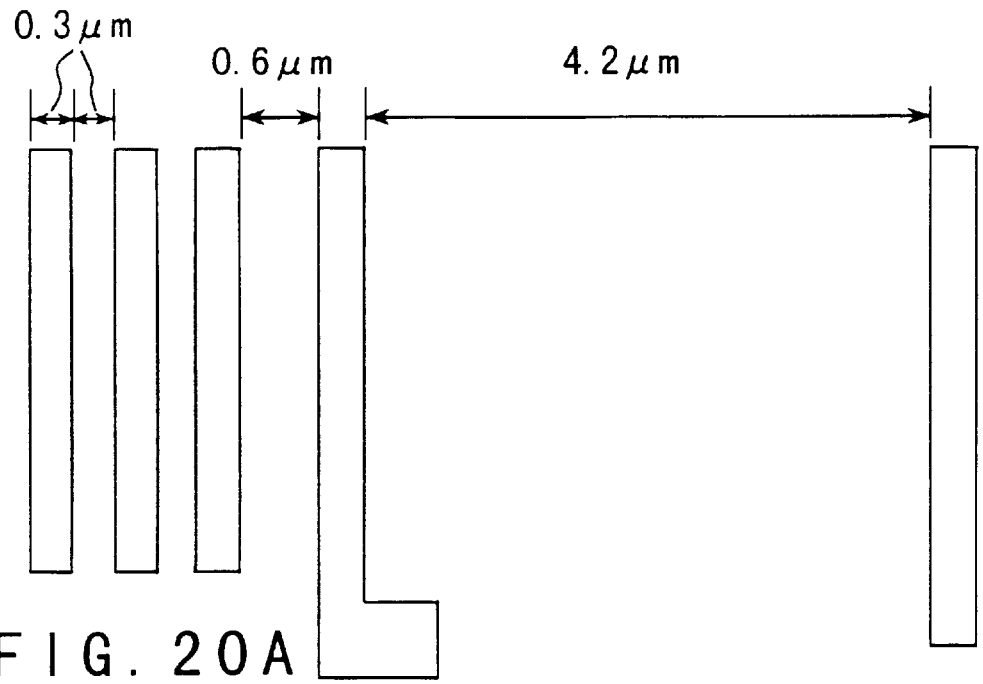
FIGS. 20A to 20E show mask patterns subjected to the mask OPC of FIGS. 19A and 19B.

First, areas for processing are entered (step 21 in FIG. 19A, step S31 in FIG. 19B, FIG. 20A). Next, a reference is made to a rule table to make corrections on parts that meet rules (step S22 in FIG. 19A, step S32 in FIG. 19B, FIG. 20B). The rule table in this example is shown as Table 4 below. Exposure and mask condition and meaning in the table correspond with those in Table 3.

TABLE 4

| DISTANCE BETWEEN EDGE OF INTEREST AND ADJACENT PATTERN | CORRECTION VALUE ($\mu$m) |
|---|---|
| −0.3 ($\mu$m) | 0.005 |
| −0.7 ($\mu$m) | −0.015 |
| −2.5 ($\mu$m) | −0.030 |
| 2.5− ($\mu$m) | PLACE 0.1 $\mu$m-WIDE ASSIST FEATURE AT DISTANCE OF 0.2 $\mu$m |

Figure 20B:
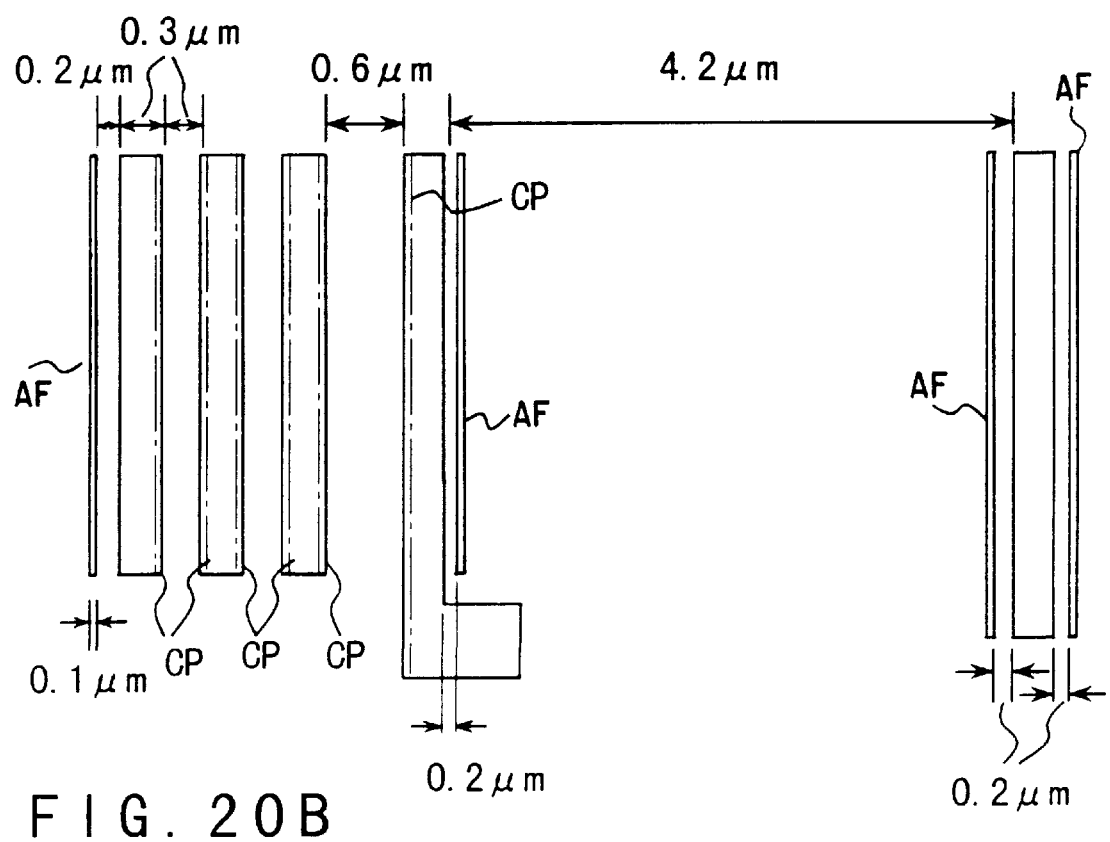

The correction values in the table are applied according to the distance between the edge of interest and the adjacent pattern. When, as shown in Table 4, the distance to the adjacent pattern is great (more than 2.5 m in this example), a rule that places an assist feature AF (see FIG. 20B) of less than limit resolution may be included. In FIG. 20B, assist features are identified as AF and correction patterns based on the normal rules are identified as CP. In addition, it is also possible to make a rule that places an assist feature (serif) in the pattern corner.

After the correction of only parts that conform to the rules, simulation-based correction is made. In this case, there will be two ways of correction. The first way is to make simulation-based correction on the entire area subjected to the rule-based correction (step S23). The advantages of this way are that, even if the results of the rule-based corrections are not perfect, further corrections can be made by the simulation-based correction, and, since the correction starts with a mask layout that is closer to the optimum layout, solutions become easy to find and their precision becomes high in the simulation-based correction.

Figure 20C:
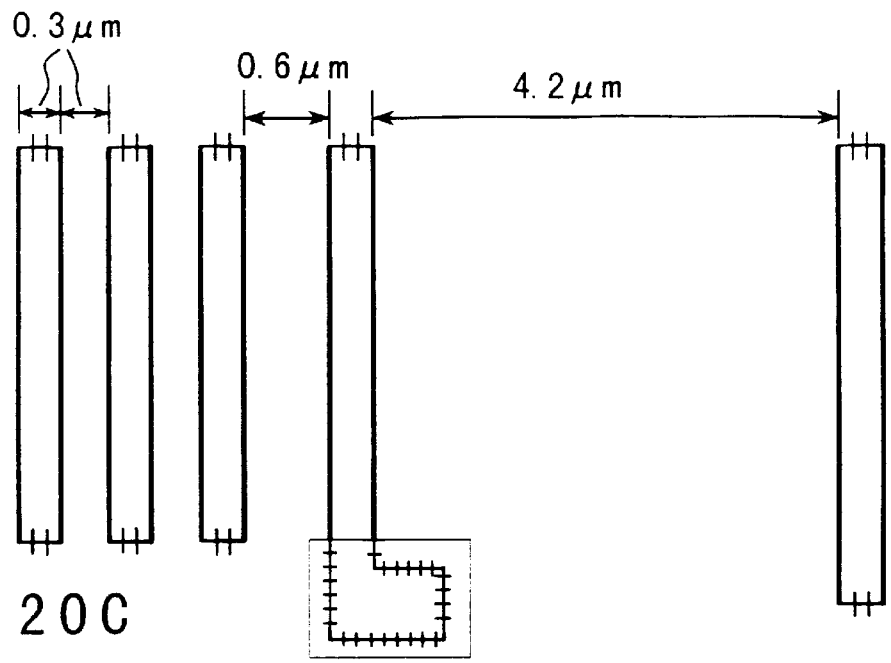
Figure 20D:
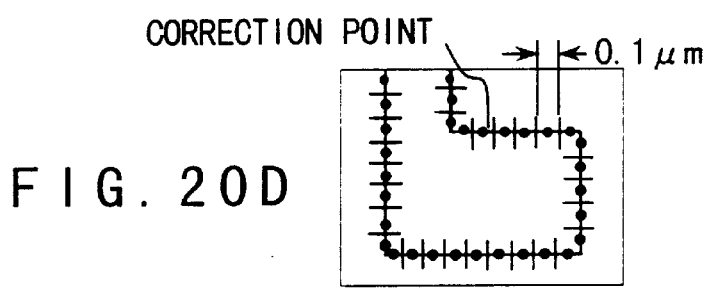

The second way is to use only parts that did not conform to the rules as points of correction in the simulation-based correction as shown in FIGS. 19B, 20C and 20D (steps S33, S34). As a specific example, as shown in FIG. 20D, the edges of parts which do not conform to the rules are divided by the correction width into line segments and the midpoint of each line segment is entered as a correction point for simulation-based correction. In the simulation-based correction, the amount of bias of each of the correction points thus entered is calculated. In FIG. 20C, segments that meet the rules are shown by bold lines.

Figure 20E:
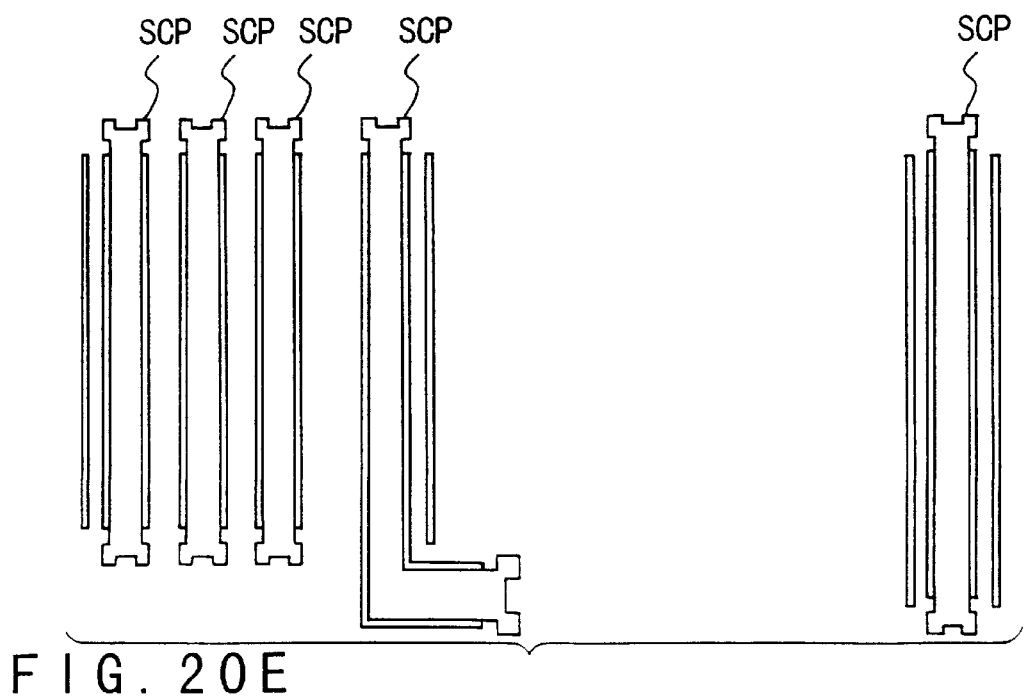

According to this way, the number of correction points in the simulation-based correction that require a large amount of time can be reduced. The results of the simulation-based correction made after the rule-based correction are shown in FIG. 20E, in which patterns subjected to the simulation-based correction are identified as SCP. In the conventional rule-based correction, it is difficult to make a rule that defines the shape of serifs according to surrounding layout. According to the present embodiment, however, proper serifs are automatically added by the simulation-based correction. On the other hand, it will be understood that assist features that are never produced by the simulation-based correction alone are automatically produced by the rule-based correction.

Although Table 4 is set up for ultraviolet lithography, OPC can be made in the same manner as described above in the case of X-ray lithography as well.

Figure 21:
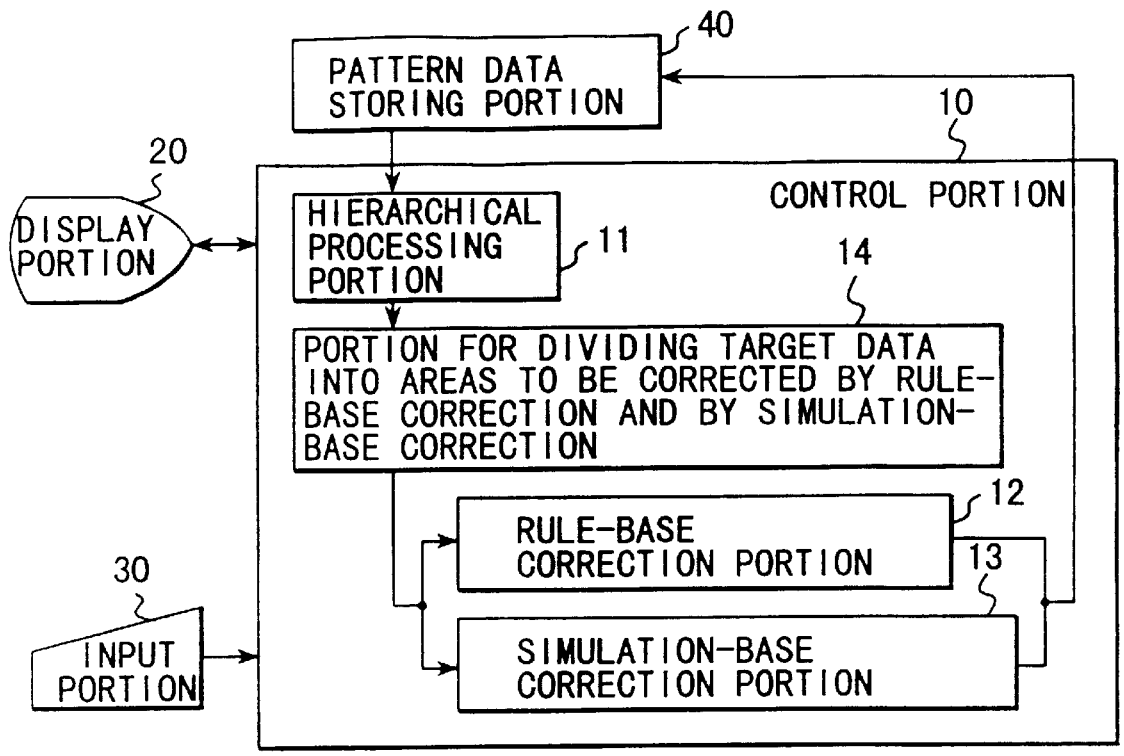
FIG. 21 is a block diagram of an OPC device according to a fourth embodiment of the present invention.

Next, a fourth embodiment of the present invention will be described with reference to FIG. 21, which illustrates the functional configuration of a mask data creating device. The device of the fourth embodiment is constructed roughly from a controller 10, a display unit 20, an input unit 30, and a pattern data storage unit 40.

In particular, the controller 10 comprises a hierarchy processing section 11 having a function of inputting/outputting areas that become candidates for correction from design data having a hierarchy, a rule-based correction section 12 which makes correction using correction values that have been obtained from correspondences between patterns and their respective surrounding layouts, a simulation-based correction section 13 which calculates amounts of correction on the basis of a program that simulates exposure process to thereby make correction, and a decision unit 14 which divides an input layout into a subarea for rule-based correction and a subarea for simulation-based correction and decides which of the correction sections is to be applied to each of the subareas.

Such an arrangement allows the mask OPC described above in connection with the first to third embodiments to be made effectively. In other words, the first to three embodiments can be implemented by hardware.

Next, reference will be made to FIG. 22 to describe a fifth embodiment of the invention.

Figure 22:
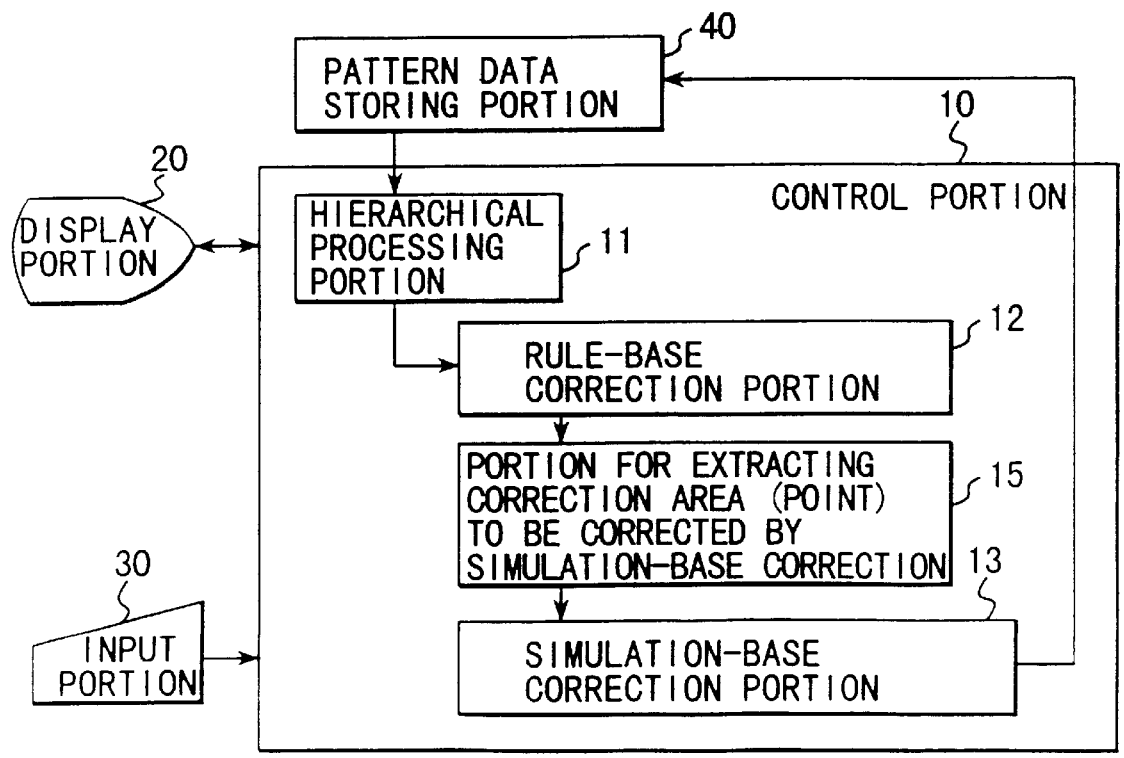
FIG. 22 is a block diagram of an OPC device according to a fifth embodiment of the present invention.

As shown in FIG. 22, a mask data creating device according to the fifth embodiment is constructed roughly from a controller 10, a display unit 20, an input unit 30, and a pattern data storage unit 40. The controller 10 is provided with an extraction section 15 in addition to the hierarchy processing section 11, the rule-based correction section 12, and the simulation-based correction section 13. The extraction unit extracts correction points that do not conform to the rules and hence become candidates for simulation-based correction.

Even with such an arrangement, the mask OPE can be corrected effectively as in the first to third embodiments. In other words, the first to third embodiments can be implemented by hardware.

In the above-described embodiments, an object of exposure using a mask is selected to be a central processing unit having a cache memory built in or a device having a gate conductor layer. This is not restrictive. However, the above embodiments can be applied to masks for various semiconductor integrated circuits. The first to fifth embodiments are characterized by using the rule-based correction and the simulation-based correction in combination. These correction methods each may be carried out properly in other ways than those described in connection with the embodiments.

According to the first to fifth embodiments, the OPC can be made effectively on a mask pattern by the combined use of the rule-based approach and the simulation-based approach. That is, no error occurs unlike when the rule-based approach alone is used, and a large amount of time is not required unlike when the simulation-based approach alone is used. Thus, mask-based exposure can be made with little OPE and the precision of a fine pattern formed on a wafer can be improved.

Hereinafter, description will given of embodiments made by paying attention to the width of active gates in a gate layer in a logic area of a device. The short dimension (width) of active gates has a great influence on the performance (speed or the like) of a device and hence is required to have very high dimensional precision. The layout of a logic gate is characterized in that its length is generally much greater than its width. For this reason, in many cases the OPC for logic gates is made with respect to only one dimension in the direction of width.

Here, a sixth embodiment of the present invention will be described with reference to FIGS. 23 to 25.

FIG. 23 is a flowchart for optical proximity correction processing according to an optical proximity correction method of the sixth embodiment of the invention.

Figure 24A:
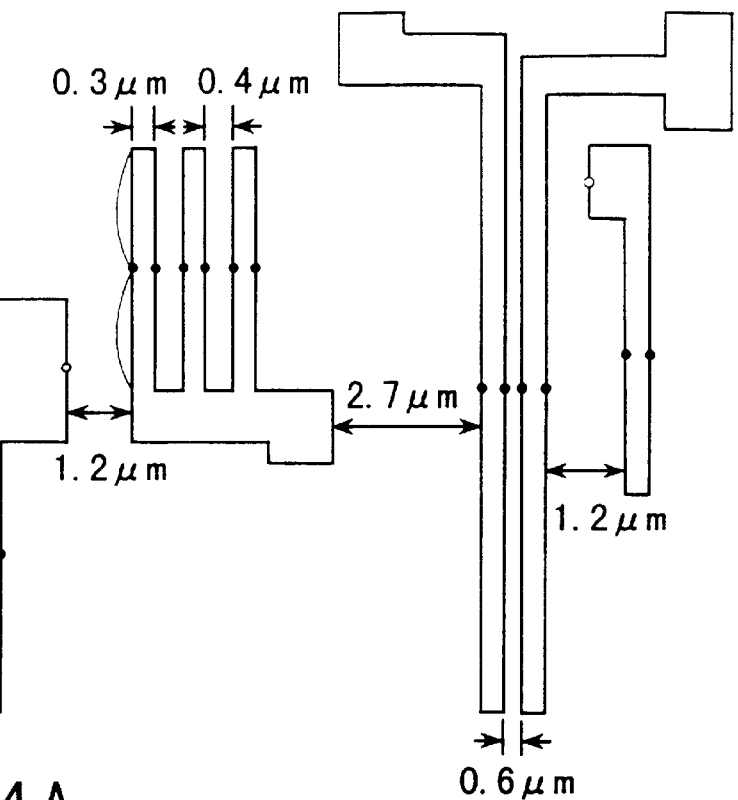
FIGS. 24A and 24B are diagrams for use in explanation of extraction of correction target points in a mask layout when the OPC shown in FIG. 23 is made.
Figure 24B:
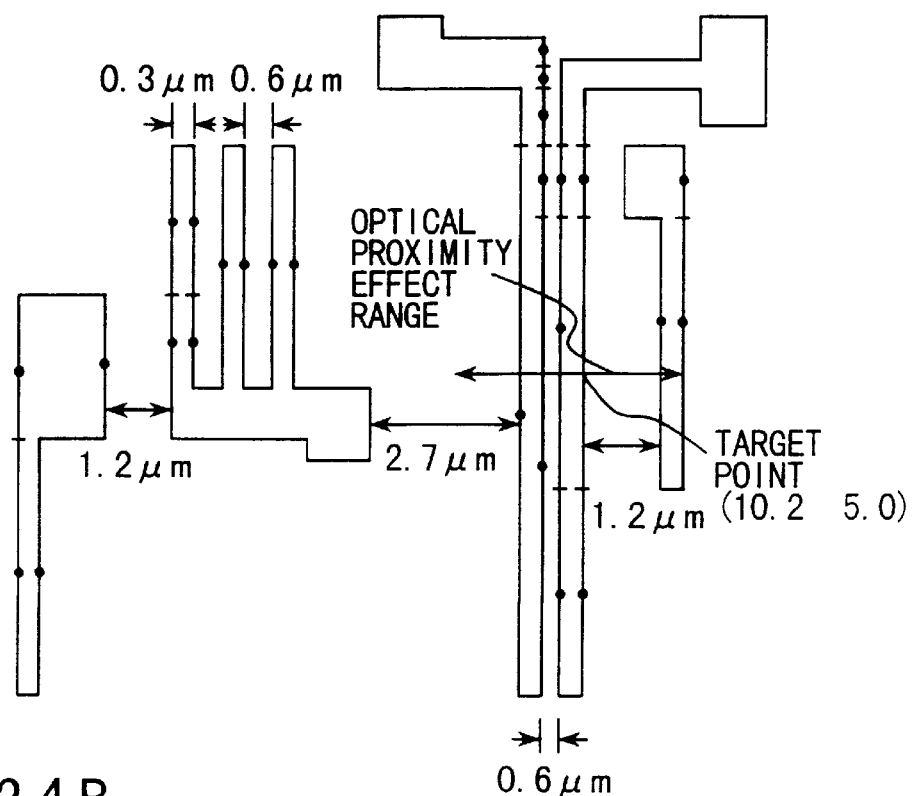

First, data to be corrected is entered (step S41) and then correction points are set (step S42). Here, exemplary correction points are shown in FIGS. 24A and 24B, which illustrate data on a gate layer and are used to describe the proximity effect correction in the direction of gate width. In FIGS. 24A and 24B, a symbol ○ and a symbol ● indicate correction points and short lines drawn perpendicular to pattern sides indicate edges of critical dimension (a narrow width of a pattern is an critical dimension).

For example, when only the gate width of critical dimension is required to be corrected, a design rule checker (DRC) is used for the gate layer to extract the edges of gates of 0.3 micrometers wide and set a correction point (indicated by a symbol ● in FIG. 24A) at the midpoint of each of the extracted edges. If it is desired that edges that are located within the range of OPE from each correction point be corrected, edges that are located within the distance (1.5 micrometers in this example) the OPE reaches are also added to objects of correction (a symbol ○ in FIG. 24A). In this case as well, the DRC can be used.

Another example of extracting correction points is illustrated in FIG. 24B. In this example, each edge is divided into line segments at a point where a layout change occurs within the proximity effect range and a correction point is set at the midpoint of each line segment (indicated by a symbol ● in FIG. 24B). In this approach, the number of correction points generally increases more than in the approach shown in FIG. 24A, but the correction precision further increases.

The correction points thus extracted are corrected in sequence (step S43). First, a one-dimensional placement of a pattern within the proximity effect range from each correction point is acquired (step S44). The processing in this step will be described with reference to FIG. 24B. A one-dimensional placement of a pattern within the proximity effect range from each correction point in the direction perpendicular to the edge on which the correction point is located is parameterized. In the sixth embodiment, the range of the proximity effect in one direction is set to 1.5 micrometers.

A one-dimensional placement of a pattern is parameterized such that each parameter will represent the presence or absence of the pattern. For example, suppose that the proximity effect range is represented by an arrangement of pixels and a pixel on which a pattern is present is set to a 1, while a pixel on which a pattern is absent is set to a 0. For a point of interest of FIG. 24B, its OPE range is then represented by (000111000000111000000000000111) with the pixel size set to 0.1 micrometers. As an alternative, a line may be represented by a plus numeric value and a space may be represented by a minus numeric value. According to this method, the proximity effect range from the point of interest of FIG. 24B will be represented by (−0.3 +0.3 −0.6 +0.3 −1.2 +0.3).

After the acquisition of the parameterized one-dimensional layout, a correction table is searched for a match with that layout (step S45). Table 5 shown in FIG. 25 is an example of a correction table in pixel representation.

In Table 5, a correspondence exists between one-dimensional layouts and correction values. If a one-dimensional layout associated with a current point of interest is included in the correction table, then the corresponding correction value is read out (step S46). The edge associated with the point of interest is shifted by the correction value. The correction value for the layout associated with the point of interest shown in FIG. 24B, i.e., −0.016 micrometers, is read from Table 5 and then the corresponding edge is shifted by −0.016 micrometers (step S47). As for the sign of correction values in Table 5, plus means moving edges to the right, while minus means the opposite.

If, in step S45, a layout is not found in Table 5, a correction value corresponding to that layout is calculated anew. This calculation procedure will be described below in detail.

First, training data for correction value calculation is produced from a parameterized one-dimensional layout (step S48). To remove the influence in the two-dimensional directions, a line whose long dimension is sufficiently greater relative to its short one is prepared to produce training data.

Here, the length of the training data should preferably be greater than twice the OPE distance. Lines and spaces are arranged in a one-dimensional direction in correspondence with the parameterized layout. Subsequently, proximity effect correction software is used to correct the entire training data. The distance between a point of interest in the optimized (corrected) training data and a point of interest prior to correction is calculated and the result is used as a correction value (step S49).

The correction value thus obtained in the above procedure is stored in Table 5 or a separate correction table along with the corresponding parameterized layout (step S39).

The above processing is performed on each point of correction. When the OPC has been made on all the correction points, the processing comes to an end (step S51).

In the above processing, it should be noted that, when optical conditions (mask and exposure condition) are identical, a common correction table can be used, but, when the conditions differ, a correction table cannot necessarily be used in common. Although, an optical-image simulator is used to obtain correction values, a development simulator may be further used instead. Further, wafer-process simulators may be used in combination.

Next, a seventh embodiment of the invention will be described with reference to FIGS. 27A to 29B.

Figure 27B:
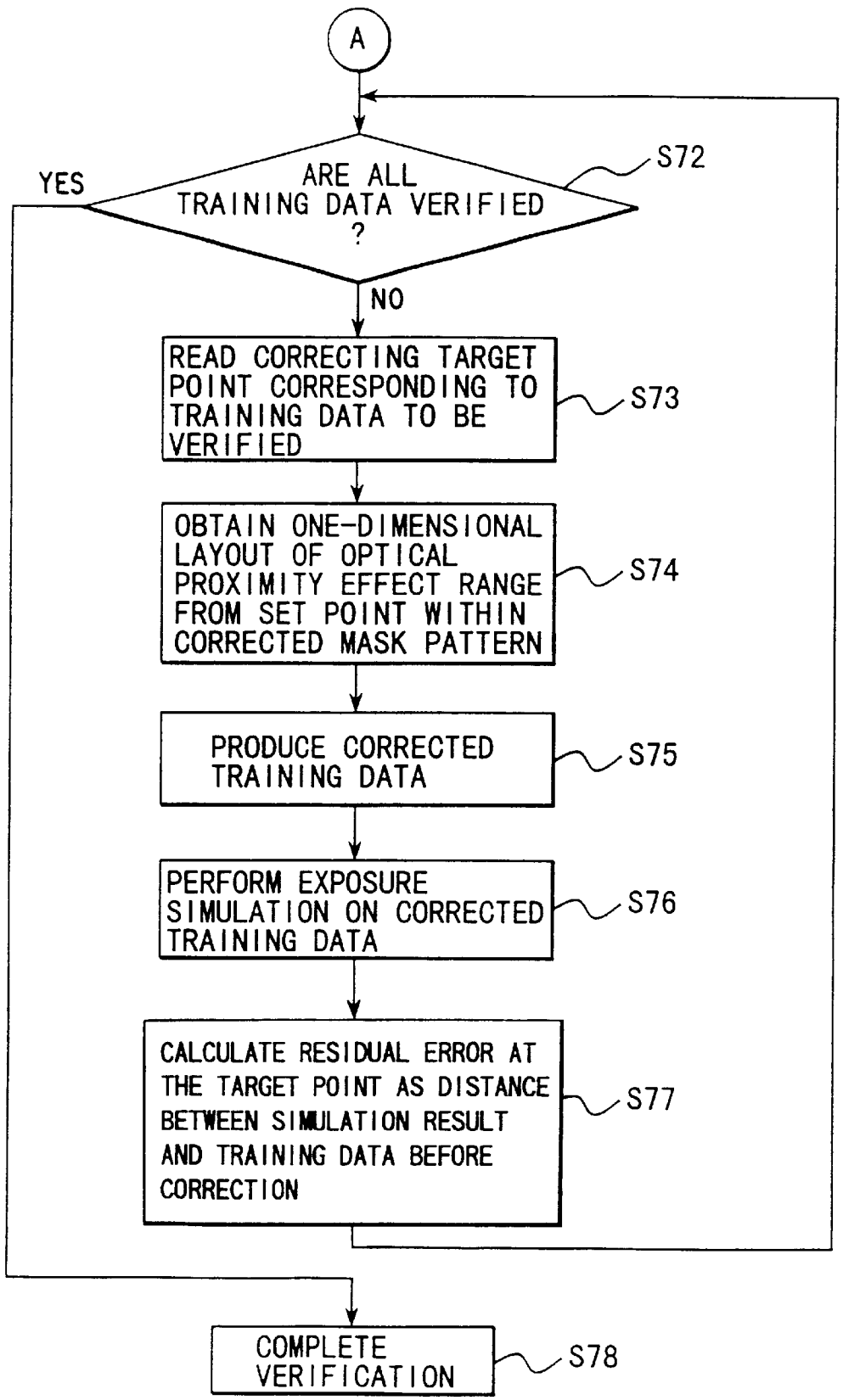

FIGS. 27A and 27B are flowcharts illustrating an optical proximity correction/verification method according to the seventh embodiment. Steps S61 to S71 except step S68 are respectively identical to steps S41 to S51 except step S48 shown in FIG. 23.

In FIG. 27A, in step S68, training data is created and the coordinates of a point of correction are stored associated with the training data. For example, with training data pertaining to a point of interest in FIG. 24B shown in FIG. 26, the coordinates (10.2, 5.0) of that point are stored associated with the training data of FIG. 26. After the correction in steps 61 to 71 in FIG. 27A has been completed, the verification processing is carried out to check that the corrected mask pattern is correct. In the verification processing, steps 72 to 78 in FIG. 27B are performed on training data pertaining to each correction point.

Figure 28:
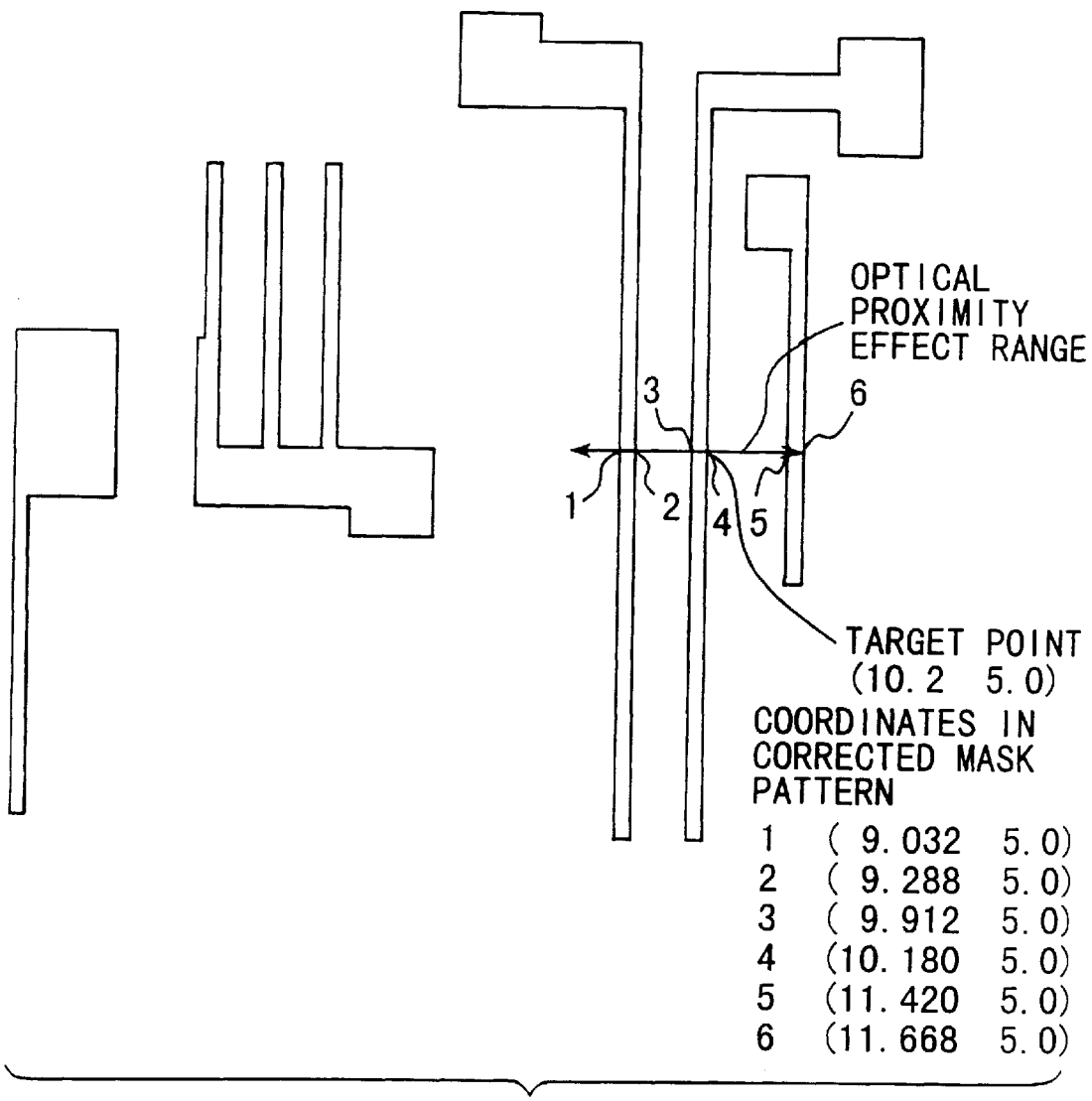
FIG. 28 shows a pattern in which the OPC was made for the point of interest shown in FIG. 24B.
Figures 29A, 29B:
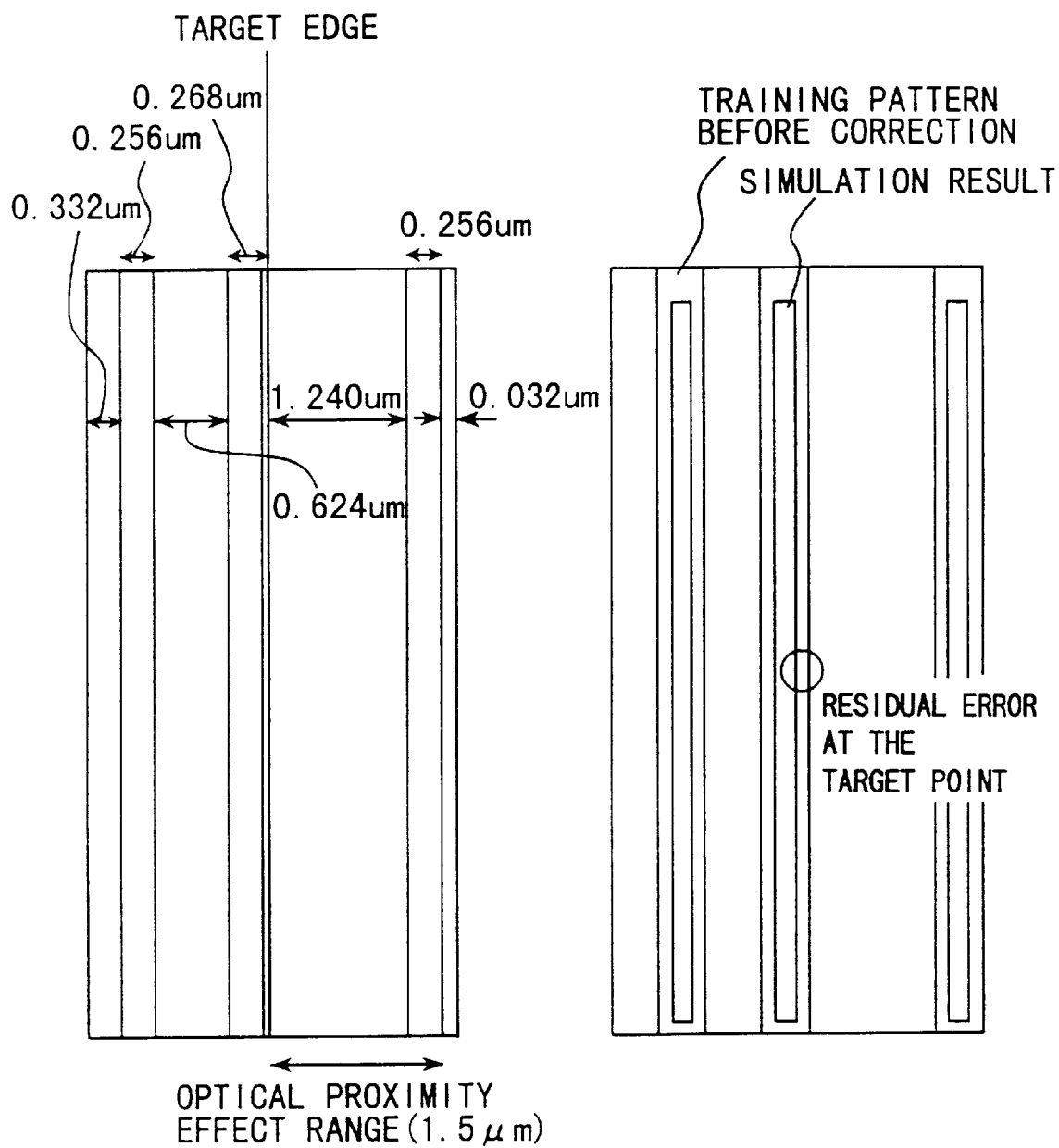
FIG. 29A shows training data corrected for the point of interest shown in FIG. 28.
FIG. 29B shows the difference between the result of simulation of the training data and training data before correction.

In step S73, the coordinates of a correction point corresponding to training data are acquired. For example, the training data shown in FIG. 26 corresponds to the coordinates (10.2, 5.0) shown in FIG. 24B. The results of the OPC made on the mask pattern shown in FIG. 24B are shown in FIG. 28. In step S74, a one-dimensional layout within the proximity effect range from the correction point (point of interest) is acquired on the corrected mask pattern. Subsequently, in step S74, training data (called corrected training data) that is identical in line and space arrangement to the acquired one-dimensional layout and has a sufficiently great size in the direction of length is created (step S75 in FIG. 29A).

Next, the corrected training data is entered into an exposure simulator (step S76). The exposure simulator may calculate only an optical image or may simulate even development and etching effects. A comparison is made between the results of simulation and the training data prior to correction to calculate a residual error at the correction point (step S77 in FIG. 29B). The residual error at the correction point corresponds to a shift (error) from the desired design mask pattern when the corrected mask pattern is transferred. The amount of error for each piece of training data is stored because it may be used later for display.

After steps S73 to S77 have been performed on all the training data (YES in step S72), the results of verification are displayed, if necessary, as follows. In mask data prior to correction, a point of correction that is located in an area for which the results of verification are desired to be displayed is extracted. Subsequently, training data is searched for which matches the one-dimensional layout within the proximity effect range from the extracted correction point. When the target training data is detected, the amount of error after correction, which is stored related to that training data, is considered to be the amount of error for that correction point. For display in a easy to understand form, the amount of error may be displayed only when it exceeds an allowable range.

Next, a description will be given of an eighth embodiment of the present invention which is directed to an optical proximity correction device which allows the above-described optical proximity correction method of the sixth embodiment to be implemented.

Figure 30:
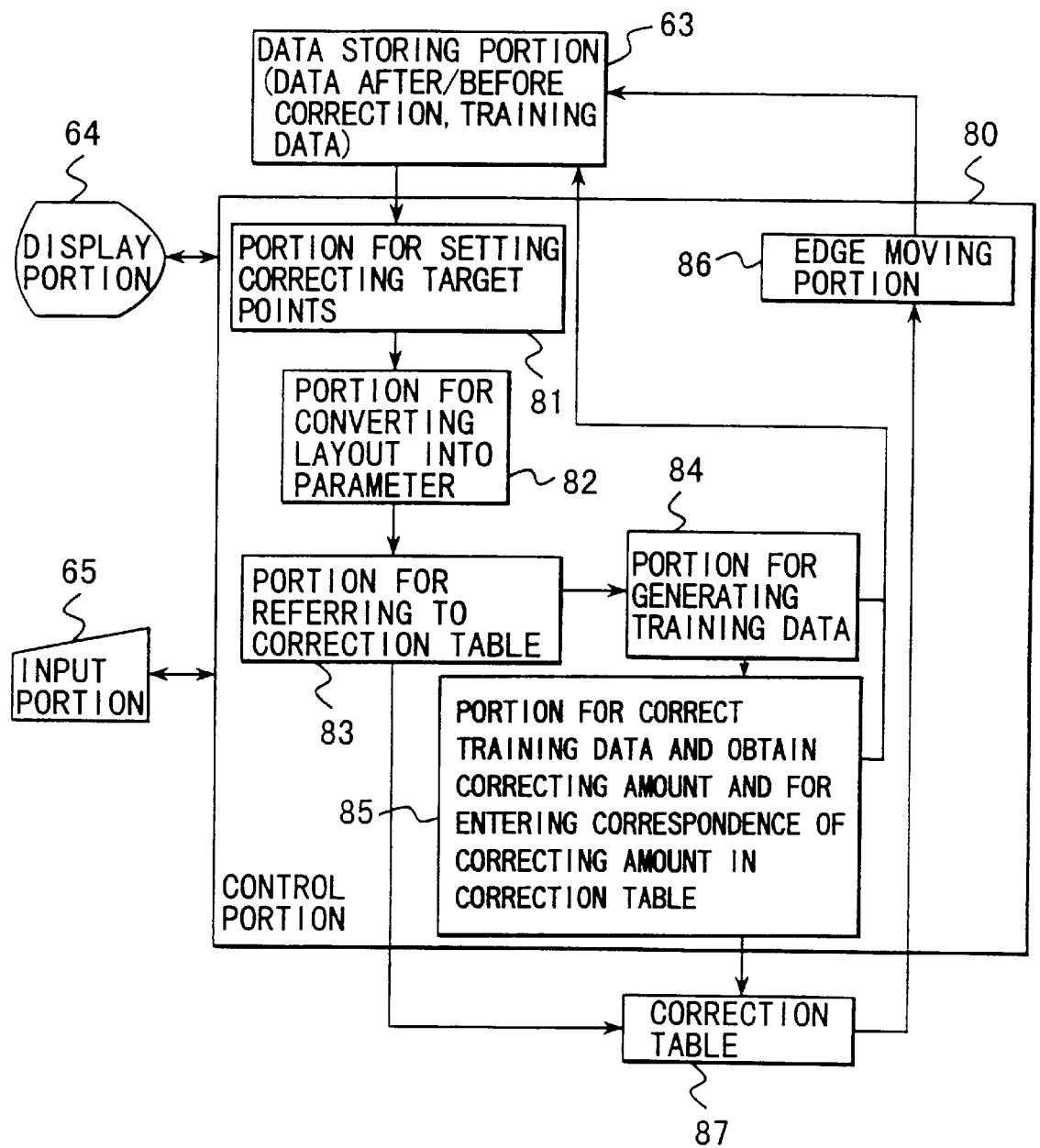
FIG. 30 is a block diagram of an OPC device according to an eighth embodiment of the present invention.

FIG. 30 shows an arrangement of the optical proximity correction device of the eighth embodiment, which comprises an input unit 65, a display unit 64, a data storage unit 63, and a controller 80. The controller 80 comprises a correction point setting section 81 for setting a correction point that is a candidate for correction on a side (edge) of a design pattern, a parameterization section 82 which seeks and parameterizes a one-dimensional layout that is located within the OPE range from that correction point and perpendicular to the side on which the correction point exists, a referencing section 83 which, when the one-dimensional layout is listed in the table 87 in which one-dimensional layouts are made to correspond one for one with correction amount relating to correction points, references to the correction amount for that correction point, a training data creation section 84 which, when the one-dimensional layout is not listed in the table, creates training data which is identical in line and space arrangement to the one-dimensional layout, a correction amount calculation/adding section 85 which calculates an amount of correction for the correction point by making OPC on the training data and then adds the one-dimensional layout and the calculated amount of correction to the correction table 87, and an edge shifting section 86 which shifts the edge on which the correction point exists by the amount of correction obtained by either of the above-mentioned methods.

According to this device, the processing described in connection with the sixth embodiment can be implemented.

Next, a description will be given of a ninth embodiment of the present invention which is directed to an optical proximity correction/verification device which allows the above-described optical proximity correction/verification method of the seventh embodiment to be implemented.

FIG. 31 shows an arrangement of the optical proximity correction/verification device of the ninth embodiment, which comprises an input unit 65, a display unit 64, a data storage unit 63, a first controller 80 and a second controller 90. The first controller 80 is the same as that in the eighth embodiment. That is, the first controller comprises a correction point setting section 81 for setting a correction point that is a candidate for correction on a side (edge) of a design pattern, a parameterization section 82 which seeks and parameterizes a one-dimensional layout that is located within the OPE range from that correction point and perpendicular to the side on which the correction point exists, a referencing section 83 which, when the one-dimensional layout is listed in the table 87 in which one-dimensional layouts are made to correspond one for one with correction amount relating to correction points, references to the correction amount for that correction point, a training data creation section 84 which, when the one-dimensional layout is not listed in the table, creates training data which is identical in line and space arrangement to the one-dimensional layout, a correction amount calculation/adding section 85 which calculates an amount of correction for the correction point by making OPC on the training data and then adds a correspondence relationship between the one-dimensional layout and the calculated amount of correction to the correction table 87, and an edge shifting section 86 which shifts the edge on which the correction point exists by the amount of correction obtained by either of the above-mentioned methods.

The second controller 90, which verifies that correction has been made correctly, is comprised of a correction point coordinate acquisition section 91 which acquires the coordinates of a corresponding correction point from each piece of training data, a second parameterization section 92 which seeks and parameterizes one-dimensional layout after correction within the proximity effect range from the correction point coordinates, a training data setting section 93 which sets layout data that is identical in line and space arrangement to that one-dimensional layout and has a sufficiently great size in the direction of length as training data after correction, a simulation section 94 which enters the training data after correction into an exposure process simulator, and a displacement calculation section 96 which calculates how much the correction point in the results of simulation is displaced from that in the training data before correction.

Thus, according to the eighth and ninth embodiments which use the amount of correction corresponding to the OPE range, the correction precision becomes very high as compared to the method that uses the amount of correction depending only on the distance to adjacent pattern. When several parameters (lines and spaces) are made to correspond with the amount of correction, the number of the parameters must be increased to assure correction precision. With the eighth and ninth embodiments, however, a necessary and sufficient area (only within the OPE range) can be parameterized. No provision of any table in advance is required. It is necessary only that the amount of correction be calculated each time a new layout is found. Thus, a system will be provided which is friendly to users.

In addition, the ninth embodiment can verify that correction has been made correctly by making an exposure simulation on each piece of training data.

Next, a tenth embodiment of the present invention will be described with reference to FIG. 32. In this embodiment, the shape of a pattern after lithography and etching processes such as exposure and development is simulated.

FIG. 32 is a flowchart for the simulation procedure of the tenth embodiment. First, data that becomes a candidate for simulation is entered (step S81) and points of interest are set on edges (step S82). The method of setting points of interest is the same as that described in connection with FIGS. 24A and 24B. Thus, the detailed description therefor is omitted herein. The following processing is subsequently performed on each point of interest.

A parameterized one-dimensional layout within the OPE range from a point of interest is acquired (step S84). This method is the same as that described in connection with FIGS. 24A and 24B and its detailed description is omitted. After that, a check is made as to whether the parameterized one-dimensional layout is listed in an error table (step S85). In the error table, parameterized one-dimensional layouts are made to correspond one for one with edge error amounts. Note that, in the error table, the amount of correction in Table 5 is simply replaced with the amount of error. Here, the amount of error of a point of interest refers to a displacement of its position in the result of simulation from its desired position. When the one-dimensional layout is listed in the error table, the amount of error corresponding to the edge on which the corresponding point of interest is located is referred to.

If, on the other hand, the one-dimensional layout is not listed, then training data that is identical in line and space arrangement to that layout and has a sufficiently great size in the direction of length is created (step S88). The training data is the same as that described in connection with FIG. 26. Simulation is then made on the training data in a simulator. As the simulator, use may be made of an exposure and development process simulator or a simulator which simulates even an etching process. A displacement of the point of interest between the result of the simulation and the input training data is calculated as the amount of error (step S89). The amount of error thus calculated and the corresponding one-dimensional layout are added anew to the error table.

After the amount of error relating to the side on which each point of interest is located has been calculated, a side or sides whose amount of error is above a predetermined value and/or a pattern having its side shifted by the amount of error may be displayed, which allows the results of simulation to be indicated to users in an easy-to-understand form. Brinking display or highlight display serves a useful function to display error position (side).

Thus, according to the sixth to tenth embodiments which use the amount of correction corresponding to the OPE range, the correction precision can be increased to a sufficiently higher level than that in the method that uses the amount of correction that depends only on the distance to adjacent pattern. Moreover, parameterization can be limited to within the OPE range. Furthermore, no provision of a table in advance is required, and it is necessary only that the amount of correction be calculated each time a new layout is found. Thus, a system can be provided which is friendly to users. In addition, by making an exposure simulation on each piece of training data, it becomes possible to verify that correction has been made correctly.

Hereinafter, an eleventh embodiment of the present invention will be described with reference to FIGS. 33, 34, and 35.

The operation of the eleventh embodiment is described with reference to FIG. 33. First, a layout to be corrected is entered (step S101). The following processing is then performed on all of patterns included in that layout. In this embodiment, a description is given of the case where all the patterns are processed. The same processing may be performed only on a specific patterns or part of patterns which is extracted by the use of a DRC (design rule checker).

A pattern to be corrected is extracted from the entered layout (step S103). A pattern matching zone is extracted from the pattern (step S104). FIGS. 34 and 35 each show part of a layout of a gate conductor layer, in which case the minimum line width is set to 0.3 micrometers and the OPE range is set to 1.5 micrometers. In these figures, arrows indicate the OPE range. In FIG. 34, a circumscribed rectangle of the pattern to be corrected is indicated by dashed lines. A pattern matching zone is defined by growing each side of the circumscribed rectangle by the OPE range distance, which is indicated by bold dashed lines. In FIG. 35, on the other hand, a pattern matching zone is made by extending the pattern itself (as opposed to the circumscribed rectangle) by the OPE range distance. According to the method shown in FIG. 34, the pattern matching zone becomes rectangular, allowing for ease in data processing. In the case of FIG. 35, the area of the pattern matching zone may become smaller than in FIG. 34, allowing for a reduction in the amount of data processing.

Figures 37A, 37B, 37C:
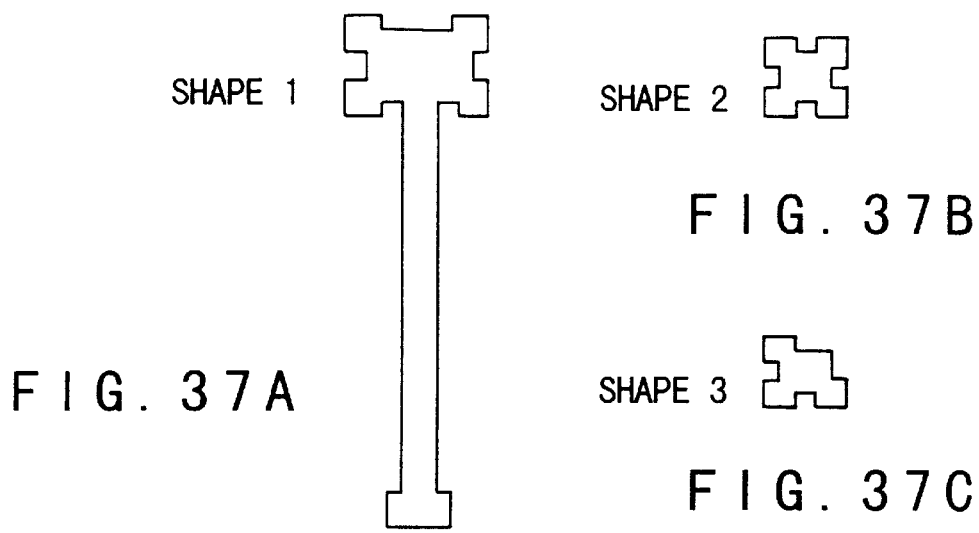
FIGS. 37A, 37B and 37C show patterns after correction entered into the correction table of FIG. 36.

After the pattern matching zone has been extracted, a reference is made to a correction table to search for a match with the layout within the pattern matching zone (step S105). FIG. 36 shows an example of a correction table (Table 6). There are various forms to represent a layout within a pattern matching zone as an index of the correction table. The speed with which the table is referenced to depends on the form. Table 6 shown in FIG. 36 corresponds to the pattern matching zone shown in FIG. 34 which is rectangular. The index includes the size of the pattern matching zone (dx, dy), the number of patterns in the zone, and the coordinates of the patterns included in the zone in this order. The coordinates of the patterns in the pattern matching zone are referenced to the lower left point of the pattern matching zone. When multiple patterns are included in the pattern matching zone, the coordinates of the lower left points of the patterns are arranged in ascending order. According to this representation, the pattern matching zone of FIG. 34 is represented by (3.9, 6.0), 3, ((1.8: 1.5 2.1:1.5 2.1:4.0 2.4:4.0 2.4:4.5 1.5:4.0, 1.8:4.0 1.8:1.5) (0.6:1.5 0.9:1.5 0.9:1.5 0.9:4.0 1.2:4.0 1.2:4.5 0.3:4.5 0.3:4.5 0.3:4.0 0.6:4.0 0.6:1.5 . . . )

when the layout of the pattern matching zone is present in the correction table (YES in step S105), the corresponding correction corrected pattern, shape 1 in this example, is fetched from Table 6 (step S108). Corrected patterns of shape 1, 2 and 3 indicated in Table 6 are shown in FIGS. 37A, 37B, and 37C, respectively.

When the layout is not listed in the correction table (Table 6) (NO in step S105), the pattern matching zone is subjected to the OPC (step S106). As the OPC means, simulation-based correction can be applied. After the correction, the pattern matching zone and the corrected pattern are added to the correction table in a one-to-one relationship for subsequent correction (step S107).

As described above, in the eleventh embodiment, the processing including steps S103 to S108 is performed on all the patterns entered. At the termination of the processing for all the patterns, the creation of mask data terminates (YES in step 102).

Figure 39:
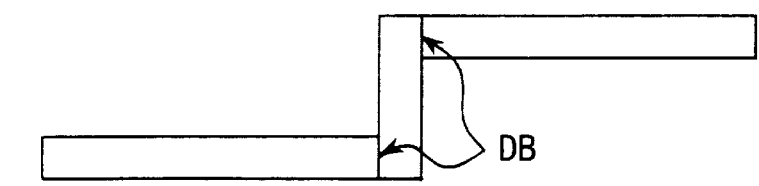
FIG. 39 shows division boundaries of a correction pattern in the twelfth embodiment.

Next, a twelfth embodiment of the present invention will be described with reference to FIGS. 38 and 39.

FIG. 38 shows the operation of the twelfth embodiment. In this figure, steps S111 to S118 are identical to steps S101 to S108 in FIG. 33, respectively, and hence their description is omitted. The only distinction is that, in FIG. 38, unlike FIG. 38, step S119 is interposed between steps S113 and S114.

In step S119, a pattern to be corrected is divided when its area is greater than a threshold value, the area of the circumscribed rectangle of that pattern is greater than a threshold value, or the length or width of the circumscribed rectangle is greater than a threshold value. FIG. 39 shows an example of a pattern divided in the direction parallel to its axis into rectangles. In this figure, the pattern is divided by division boundaries DB into three patterns. The same correction processing as described so far is performed on each of the three patterns.

Although, in the flowchart of FIG. 38, step S119 is carried out between steps S113 and S114, it may be carried out between steps S112 and S113.

According to the eleventh and twelfth embodiments, as described above, since a pattern matching zone is set up for each pattern and the correction table is referenced for each pattern matching zone, there is no need of dividing a pattern in advance and setting up points of correction. In addition, referencing the correction table for each pattern allows the number of references to the correction table to be minimized.

Next, reference will made to FIGS. 40 to 43C to describe a thirteenth embodiment of the present invention.

Figure 40:
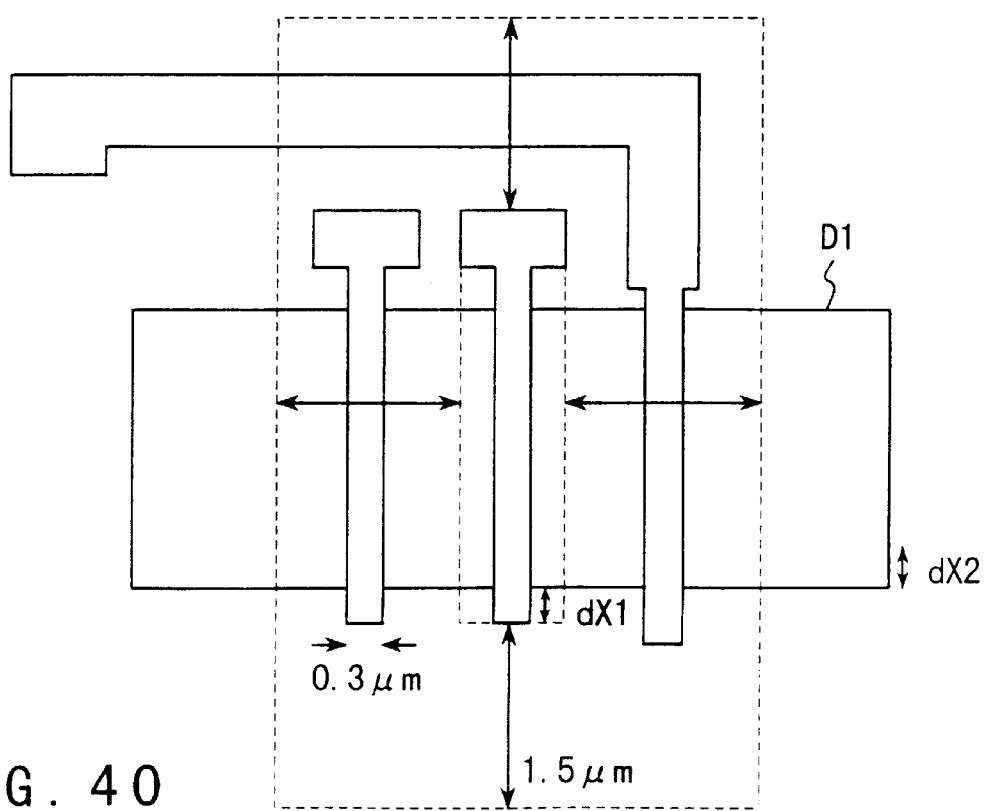
FIG. 40 shows a relationship between a pattern to be corrected and a diffusion region in a thirteenth embodiment of the present invention.

In FIG. 40, there is illustrated a diffusion layer pattern D1 in addition to the gate conductor layer that is currently made a candidate for processing. As in FIG. 34, the OPE range is indicated by arrows, the circumscribed rectangle of a pattern to be corrected is indicated by dashed lines, and the pattern matching zone is indicated by bold dashed lines. If, when a pattern of interest is subjected to exposure and development, dX1 is small, the lower line end may shift over the diffusion layer as a result of shortening due to the OPE. This problem will be solved by making dX1 larger, adding a serif to that portion, or reducing the diffusion layer by dX2, or using the above three approaches in combination.

Figure 42A:
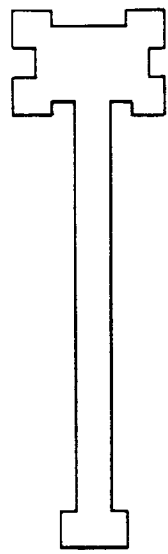
FIGS. 42A, 42B and 42C shows corrected patterns of the gate conductor layer entered into the correction table of FIG. 41.
Figure 42B:
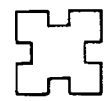
Figure 42C:
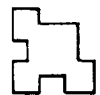
Figure 43A:
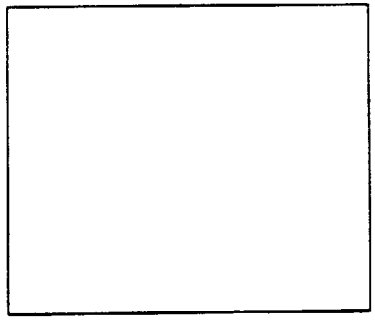
FIGS. 43A, 43B and 43C show corrected patterns of the diffusion region entered into the correction table of FIG. 41.
Figure 43B:
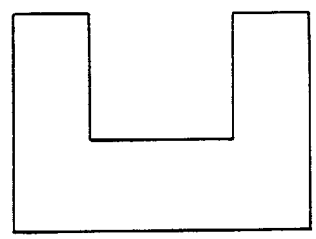
Figure 43C:
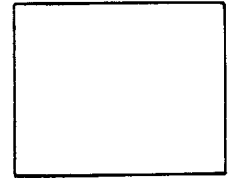

To make the OPC taking into consideration a correlation with other than a layer to be processed, patterns of another layer included in a pattern matching zone are preferably included in index information in a correction table. In this case, corresponding corrected patterns will be corrected patterns in the layout to be processed, and/or patterns to be corrected in the other layer. In FIG. 41 there is illustrated an example of a table (Table 7) used when a gate conductor layer and a diffusion layer are corrected simultaneously. In Table 7, the index field describes the layouts in the pattern matching zone and remains basically unchanged from that of Table 3. However, in Table 6, the index field describes a layout of a pattern of only one layer, whereas, in Table 7, the index field describes a layout of pattern of two layers. Correction pattern characters for a gate conductor layer and a diffusion layer are listed. Corrected pattern for the gate conductor layer, shapes 1, 2 and 3, are shown in FIGS. 42A, 42B, and 42C, respectively, while corrected pattern characters for the diffusion layer, shapes 4, 5 and 6, are illustrated in FIGS. 43A, 43B, and 43C, respectively.

Further, according to the thirteenth embodiment, information about the other layer within a pattern matching zone can also be captured, allowing the OPE resulting from a correlation with the other layer to be corrected. Further, it is also possible to correct the other layer at the same time.

Next, a fourteenth embodiment of the present invention will be described with reference to FIGS. 44A and 44B.

FIG. 44A shows a layout of contact holes prior to correction. The contact holes measure 0.3 micrometers on a side. The correction is made in accordance with the same procedure as described in connection with the eleventh embodiment. In a correction table, a corrected pattern is made to correspond with a layout of a pattern matching zone as an index.

FIG. 44B shows an enlarged view of a pattern character of interest in FIG. 44A before and after correction. Here, correction is made in such a way as to bias each side of the contact hole in the perpendicular to it. The OPE range is 1.5 micrometers and the optical conditions are such that annular illumination of a shaded factor of ⅔ is used, wavelength= 248 nm, σ=0.75, NA=0.6.

Such a contact hole correction method allows the OPC to be made with a simple shape without any serif, allowing for easy mask fabrication. Further, as compared with the conventional method, the OPC can be made on even contact holes that are arranged aperiodically or two-dimensionally.

Next, a fifteenth embodiment of the present invention will be described with reference to FIG. 45, which is directed to a verification method to verify the influence of the OPE on uncorrected and already corrected layouts.

A layout to be verified is entered (step 121). The following processing is performed on all patterns included in the layout entered (NO in step S122).

First, a pattern to be verified is extracted (step S123) and then the pattern matching zone of this pattern is extracted (step S124). The pattern matching zone is the same as that described in connection with FIGS. 34 and 35. Subsequently, a reference is made to a verification table (step S125) for the layout of the pattern matching zone. In the verification table, layouts of pattern matching zones are used as indexes and the results of process simulation of patterns to be verified are made to correspond one for one with the layouts. Namely, the verification table is the same as Table 6 in index field, but the results of simulation of pattern to be verified are stored in place of the corrected pattern.

If the layout of the pattern matching zone has been entered into the verification table (YES in step S125), then the result of the simulation is fetched from the verification table (step 128).

If, on the other hand, the pattern matching zone layout has not been entered into the verification table (NO in step S125), then the simulation process is performed on that pattern matching zone (step S126). The results of the process simulation performed on the pattern to be verified are generally contour lines of the light intensity of an optical image. The process simulator used here supposes one that anticipates an optical image, the shape of a resist after development, and the shape of the resist after etching. The results (pattern) of the simulation and the pattern matching zone are additionally entered into the verification table in a one-to-one correspondence relationship (step S127).

In the fifteenth embodiment, such verification processing is performed on all the patterns included in a layout to be verified.

According to the optical proximity effect verification method of the fifteenth embodiment, only one process simulation is required for patterns of the same pattern matching zone, significantly improving the efficiency.

Figure 46:
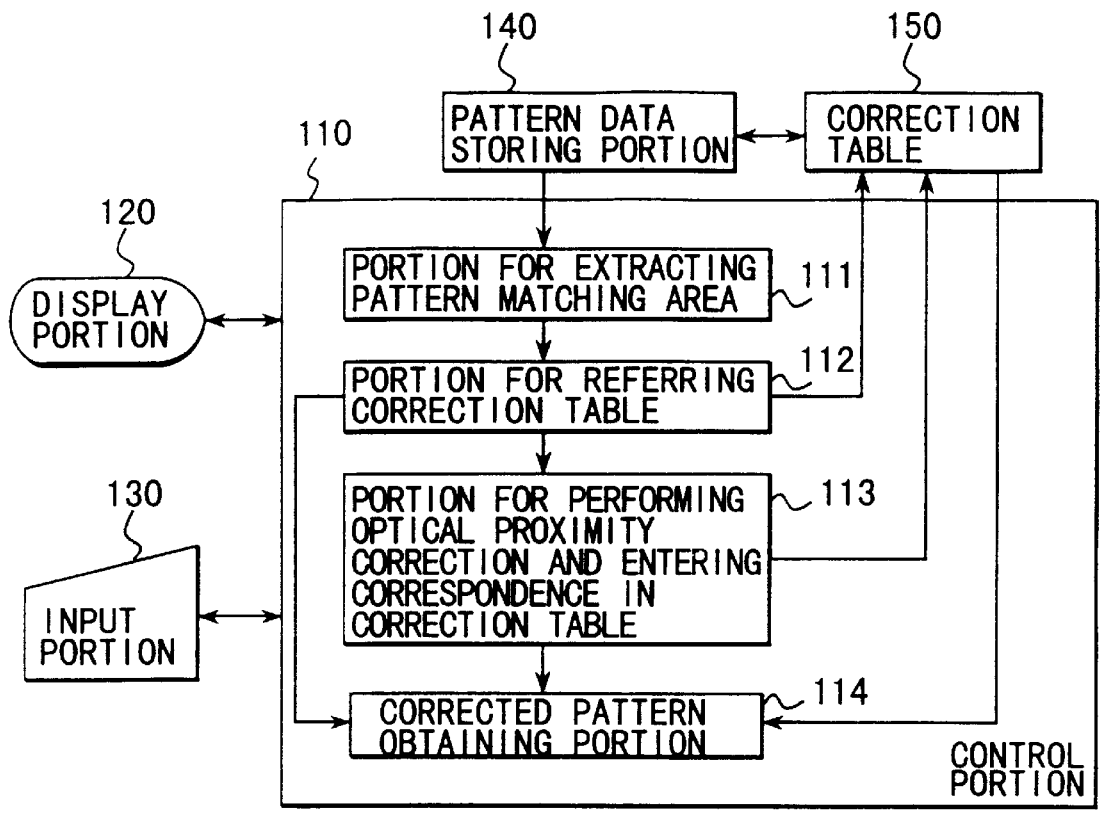
FIG. 46 is a block diagram of an OPC device according to a sixteenth embodiment of the present invention.

Next, a sixteenth embodiment of the present invention will be described with reference to FIG. 46, which illustrates in simplified block form a mask data creating device.

The mask creating device of the sixteenth embodiment is constructed roughly from a controller 110, a display unit 120, an input unit 130, a pattern data storage unit 140, and a correction table 150.

In particular, the controller 110 comprises a pattern matching zone extracting section 111, a verification table referencing section 112, a correction/addition section 113 which, when a pattern matching zone is not listed in the correction table, makes OPC on the pattern matching zone and then adds the results to the correction table, and an acquisition section 114 which acquires a corrected pattern from the correction table.

According to the sixteenth embodiment, various optical proximity correction methods described in connection with the eleventh to fourteenth embodiments can be implemented by a single device.

Next, a mask data verification device according to a seventeenth embodiment of the present invention will be described with reference to FIG. 47. In this figure, like reference numerals are used to denote corresponding components to those in FIG. 46.

Figure 47:
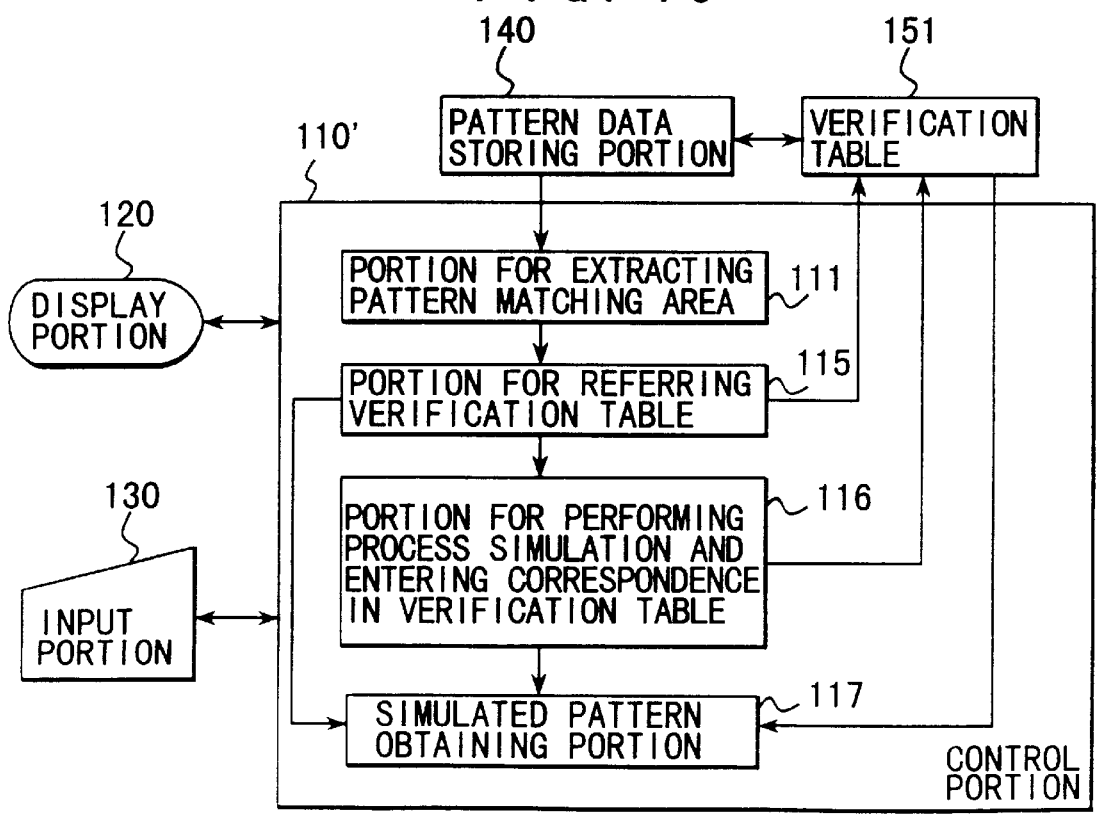
FIG. 47 is a block diagram of a mask data verification device according to a seventeenth embodiment of the present invention.

The mask data verification device of FIG. 47 is constructed roughly from a controller 110', a display unit 120, an input unit 130, a pattern data storage unit 140, and a correction table 151.

In particular, the controller 110' comprises a pattern matching zone extracting section 111, a correction table referencing section 115, a simulation/addition section 116 which, when a pattern matching zone is not listed in the correction table, performs process simulation on the pattern matching zone and then adds the results to the verification table, and an acquisition section 117 which acquires a correction pattern from the correction table.

According to the seventeenth embodiment, the optical proximity effect verification method of the fifteenth embodiment can be implemented by a single device.

According to the eleventh and twelfth embodiments, as described above, since a pattern matching zone is set up for each pattern and the correction table is referenced to for each pattern matching zone, there is no need of dividing a pattern in advance and setting up points of correction. In addition, referencing to the correction table for each pattern allows the number of references to the correction table to be minimized.

Further, according to the thirteenth embodiment, information about the other layer within a pattern matching zone can also be captured, allowing the OPE resulting from a correlation with the other layer to be corrected. Further, it is also possible to correct the other layer at the same time.

The contact hole correction method of the fourteenth embodiment allows the OPC to be made with a simple shape without any serif, allowing for easy mask fabrication. Further, as compared with the conventional method, the OPC can be made on even contact holes that are arranged aperiodically or two-dimensionally.

Furthermore, according to the optical proximity effect verification method of the fifteenth embodiment, only one process simulation is required for patterns of the same pattern matching zone, significantly improving the efficiency.

Here, the effects of the first through seventeenth embodiments will be described again. In each embodiment, a necessary and sufficient correction table (or a verification table) is created.

For example, in a table used with the rule-based approach, which requires to be prepared in advance, correction values are made to correspond with generalized parameters such as lines and spaces.

In the present invention, on the other hand, placements of all patterns included in a layout have been extracted even if they are one-dimensional or two-dimensional. Thus, the analysis of a correction table in the invention allows the tendency of the layout to be recognized. According to a verification table, even if a correction has been made, a placement for which an error will not fall within an allowable range can be detected. Such a placement can be fed back to a designer as a design inhibit placement.

Further, by counting how often each placement listed in the table is included in a layout, it becomes possible to adapt optical conditions to a placement that is most included in the layout. A specific placement listed in the table can be exchanged for a placement created by an operator.

Next, a description will be given of an optical proximity correction method of the present invention which allows the time required to make the OPC to be reduced, the pattern precision to be increased, and particularly, unnecessary calculation duplication to be avoided as much as possible.

First, an eighteenth embodiment of the present invention will be described with reference to FIGS. 48 to 50.

Figure 48:
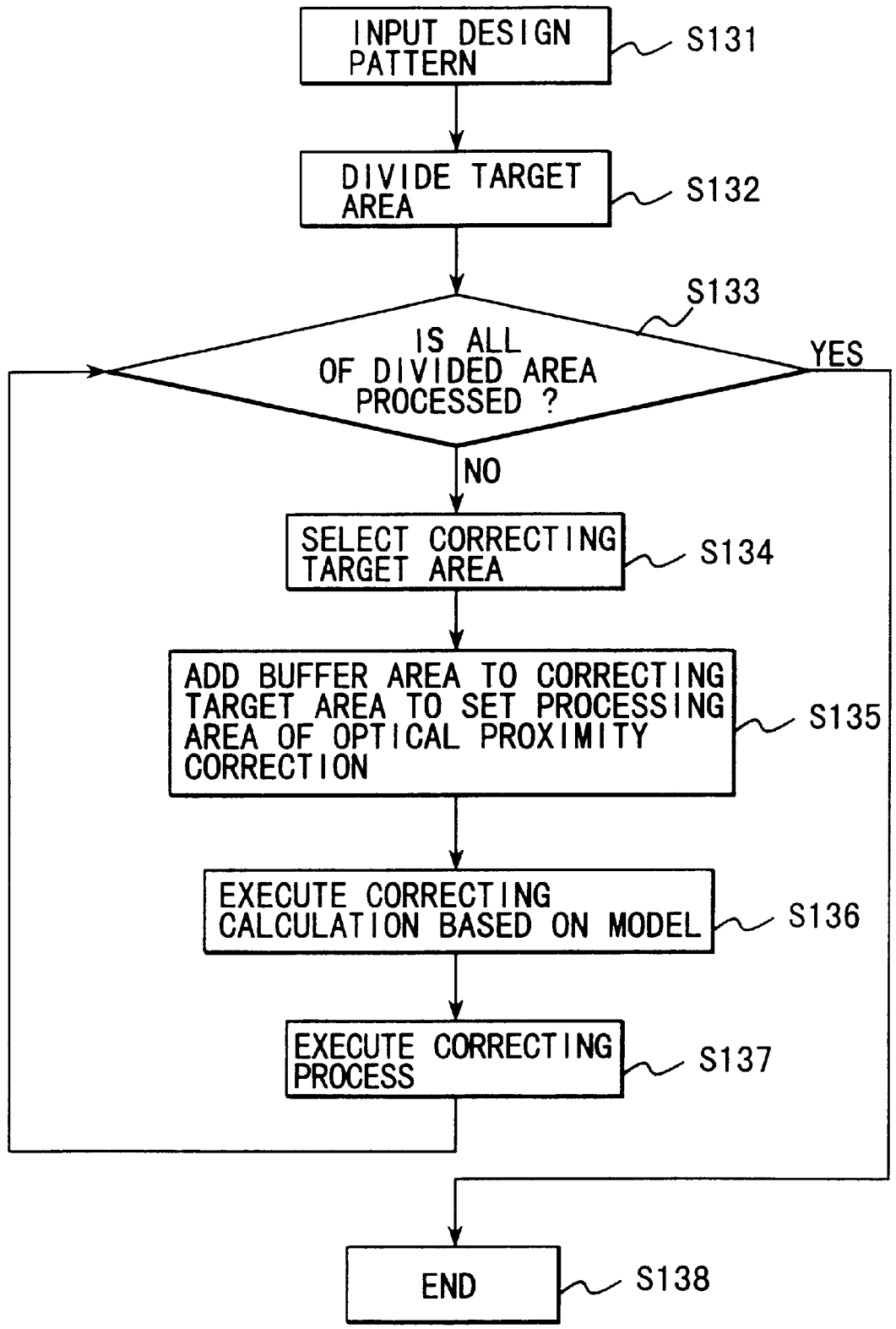
FIG. 48 is a flowchart illustrating an OPC method according to an eighteenth embodiment of the present invention.
Figure 49:
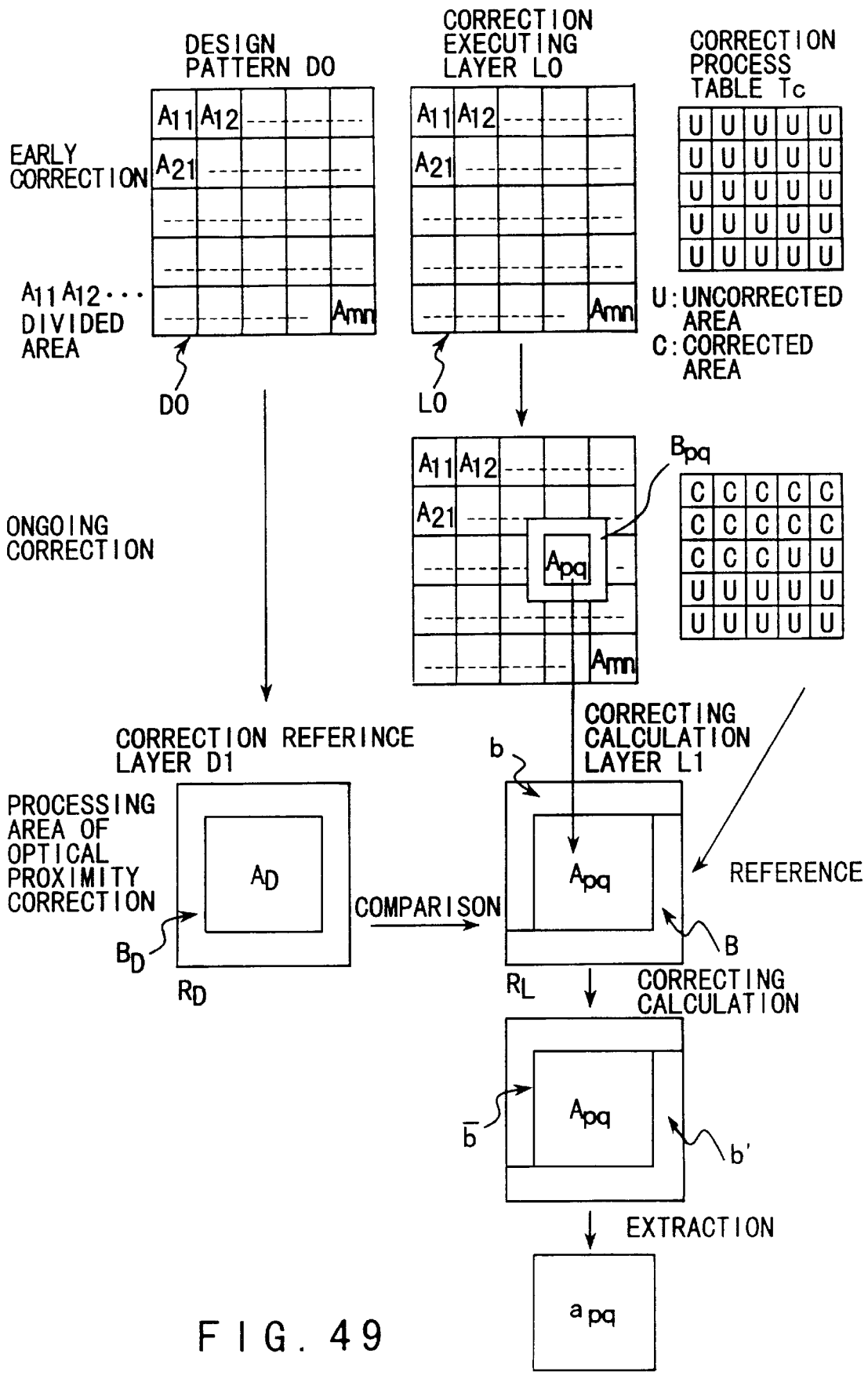
FIG. 49 is a diagram for use in explanation of correction processing in the eighteenth embodiment.

FIGS. 48 and 49 are diagrams for use in explanation of the optical proximity correction method of the eighteenth embodiment of the present invention. FIG. 48 is a flowchart for the OPC procedure, and FIG. 50 illustrates the method to make correction. In this embodiment, a mask pattern of a large area is divided into areas to suit the performance of the central processing unit and the internal storage for subsequent OPC. Further, the mask pattern is to be transferred onto a wafer by means of photolithography or X-ray lithography.

First, a design pattern requiring correction is entered (step S131) and then split into correction areas A11, A12, ... and Amn each having an appropriate size (step S132). The split design pattern is copied onto a correction execution layer L0 on which correction is made. A correction calculation is next performed on each of the correction areas in the layer L0 in sequence. The progress of the correction is recorded in a correction progress table Tc. During correction, a decision is made as to whether or not an area to be corrected remains (step S138). When it is decided that no area to be corrected remains, the OPC processing terminates (step S138). If some correction areas are left for correction, an area Apq is selected from the layer L0 (step S138). The area Apq is cut out from the layer with a buffer area Bpq added around it and then copied into a correction calculation layer L1.

Next, the correction progress table is referred to. With the corrected part in the buffer area Bpq as b and the uncorrected part in the buffer region as B, a proximity effect calculation area $R_L$ is set which is comprised of Apq, b and B (step S135). For b, the correction calculation (the measurement of a displacement of it from an ideal image and the replacement of edges on the basis of the results of the measurement) is specified to be omitted during the correction processing. B is made a candidate for correction together with Apq. An area corresponding to $R_L$ is cut out from the design pattern as $R_D$ and then copied in a calculation pattern reference layer D1.

Next, the correction calculation and processing are performed on $R_L$ while $R_D$ is being referred to (steps S136 and S137). At the completion of the correction processing for $R_L$, a correction completed pattern apq corresponding to Apq is cut out from the calculation layer L1 and then replaced in the corresponding area of the correction progress layer L0. The correction progress table Tc is updated accordingly. If, at this point, at least one uncorrected area remains, then it is selected from the layer L0 and then subjected to correction. If no area is left, then the correction procedure terminates (steps S133 and S138).

Next, reference will be made to FIG. 50 to describe a nineteenth embodiment of the present invention.

In this embodiment, a description is given of the procedure of performing a correcting operation on a limited number of divided areas by means of parallel processing. In FIG. 50 there is illustrated an example of making OPC on four areas concurrently. The correction processing conforms to that of FIG. 48, but it is set so that adjacent areas will not be processed at the same time. The sequence of correction is determined so that the correction completed area will be captured, to a maximum, into the buffer area (Ta).

Figure 50:
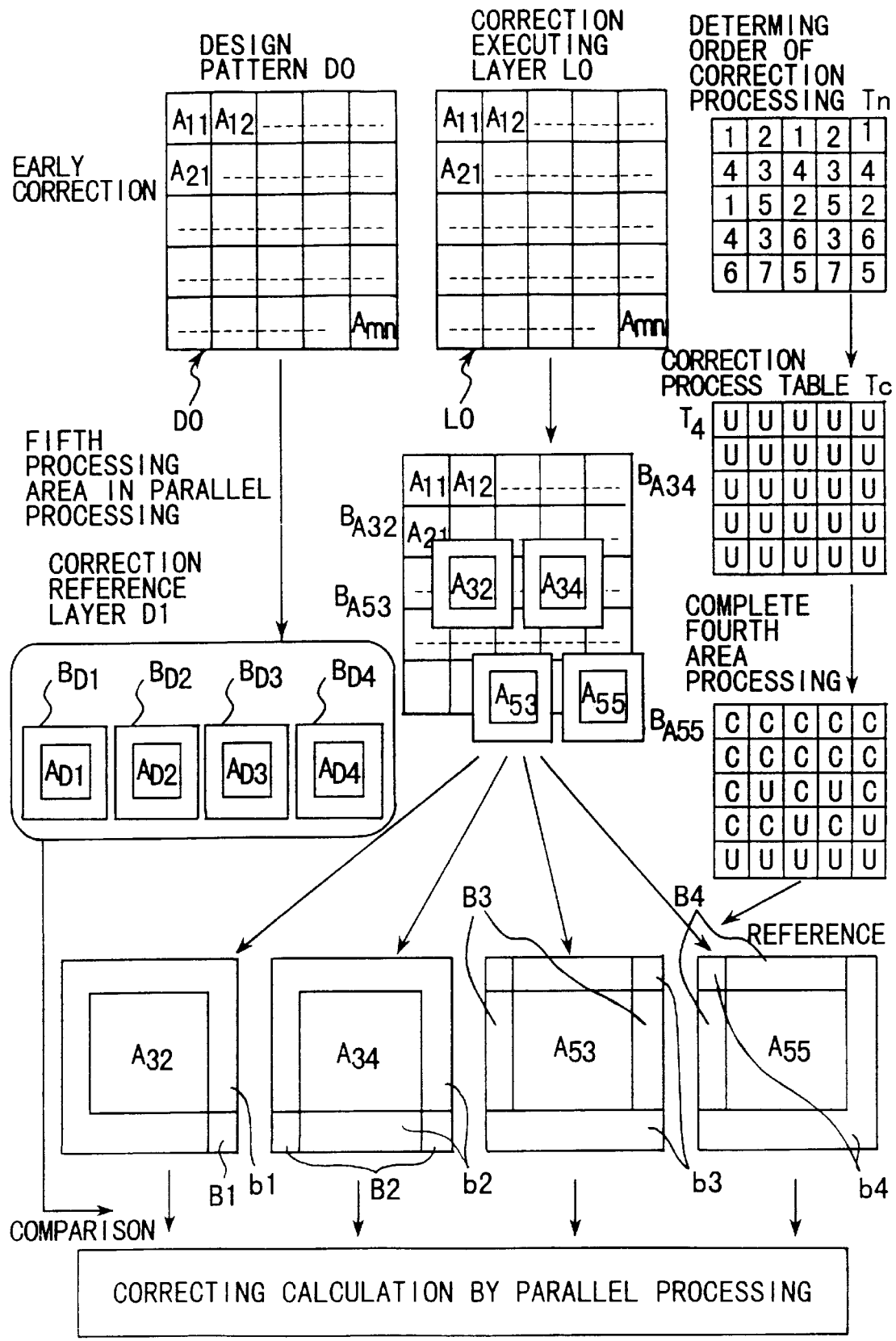
FIG. 50 is a diagram for use in explanation of an OPC method according to a nineteenth embodiment of the present invention.

FIG. 50 shows the condition in which the correction processing has been performed through the fourth set of areas and the fifth set of areas is now being corrected. The buffer areas BA32, BA34, BA53 and BA55 associated with the respective correction areas A32, A34, A53 and A55 selected at the same time are respectively occupied by corrected and uncorrected parts b1 and B1, b2 and B2, b3 and B3, and b4 and B4, which differ according to the progress of correction in their respective surrounding areas. For this reason, a correction progress table (Tc) is referred to for each buffer region. The correction areas are transferred to parallel processing for correction/calculation with the corrected parts (b1, b2, b3, b4) of the respective buffer areas specified to be excluded from correction.

In FIG. 50, A32, A34, A53 and A55 are correction areas, BA32, BA34, BA53 and BA55 are the buffer areas of the respective correction areas A32, A34, A53 and A55, B1, B2, B3 and B4 are uncorrected parts of the respective buffer areas, and b1, b2, b3 and b4 are corrected parts of the respective buffer areas. AD1, AD2, AD3 and AD4 denote the design patterns of the respective correction areas, and BD1, BD2, BD3 and BD4 denote the buffer areas of the respective design patterns.

Next, a twentieth embodiment of the present invention will be described with reference to FIGS. 51 to 52D. FIG. 51 is a flowchart for the OPC using a hierarchical processing unit.

In hierarchical processing, an area for correction is input (step S141) and the correction cells are extracted by a hierarchy manager from the input area together with buffer area information. The information extracted at this point include the cell names and coordinates. Next, a decision is made as to whether or not all the areas have been corrected (step S143). If YES, then the correction processing terminates (step S148). If, on the other hand, at least one uncorrected area remains, then the procedure goes to step S144 where a cell to be corrected is selected.

Next, the cell to be corrected is added with a buffer area to make a proximity effect calculated area (step S145). At this point, in the buffer area a corrected pattern (as opposed to a design pattern) is captured into the part for which correction has been completed and it is specified that the same correction calculation and pattern data processing are omitted. Calculations of a model and a correction value are performed on the proximity effect calculated area (step S146) and correction pattern data processing is added (step S147). The procedure then returns to step S143.

Next, the progress of the proximity effect correction taking the hierarchical processing into consideration will be described with reference to FIGS. 52A to 52D. In these figures, C1 to C5 indicate cells, Tc indicates a correction progress table, U stands for "uncorrected", C stands for "already corrected", A indicates a cell to be corrected, b indicates a corrected area in a buffer area, B indicates an uncorrected area in the buffer, a indicates a corrected pattern in the A area, and b' indicates corrected pattern in the B area.

It is assumed here that, of cells C1 to C5 that are candidates for correction, the cells C1 and C2 have already been corrected and correction calculation and processing are to be performed on the cell C3. The progress of the correction is described in a table Tc. Those parts of the cells C1 and C2 which are included in the buffer area of the cell A to be corrected are captured as corrected areas b into the OPC calculated area and parts of the uncorrected cells C4 and C5 are captured as uncorrected areas B. For the areas b, the correction processing is omitted. For A and B, the correction calculation and pattern data processing are performed. As a result, a that is the result of the correction on the A area is fetched and then made to be the result of correction on the cell C. The progress table Tc is next updated and then the procedure goes to the correction of the cell C4.

Figure 53:
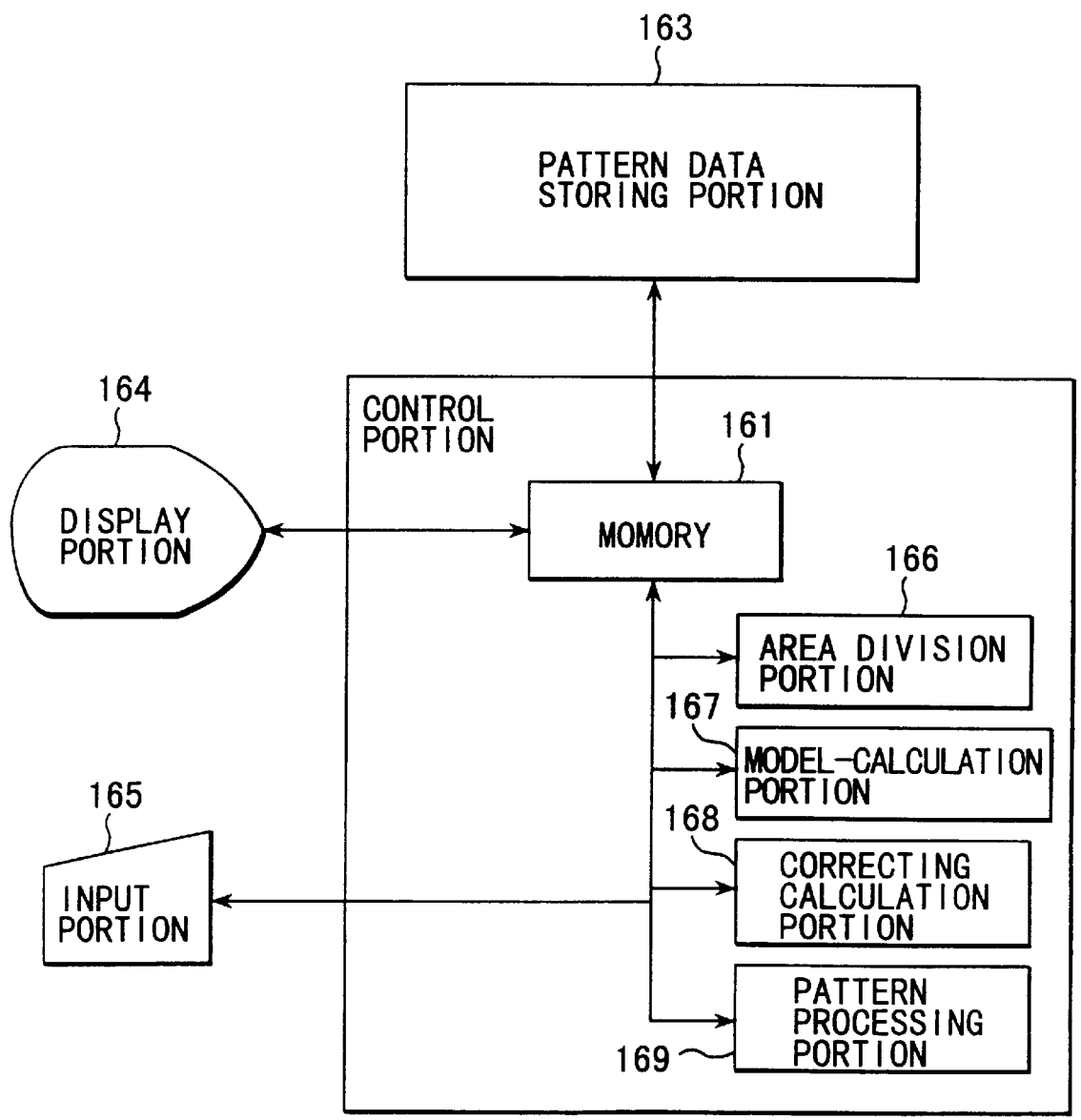
FIG. 53 is a block diagram of an OPC device according to a twenty-first embodiment of the present invention.

Next, a twenty-first embodiment of the present invention will be described with reference to FIG. 53, which shows a basic arrangement of a mask data processing device for OPC.

The hardware configuration of the mask data processing device comprises a memory 161, a controller 162, a pattern data storage 163, a display unit 164, and an input unit 165. The software module comprises an area division section 166, a model calculation section 167, a correction calculation section 168, and a pattern data processing section 169.

Design data is fetched from the pattern data storage 163 into the memory 161 and then split into appropriate areas in the area division section 166. In the model calculation section 167, a model calculation is performed on the pattern of each area under specified conditions. In the correction calculation section 168, the amount of correction is calculated from the result of the model calculation. In the pattern data processing section 169, graphical processing, such as edge replacement and deformation, is performed. The results of the correction are displayed on the display unit 164.

Thus, according to the eighteenth through twenty-first embodiments, a group of patterns that is close to a correction solution can be used as an initial input pattern, which allows an appropriate correction solution to be obtained in an area to be corrected by properly taking in the OPE from the corresponding buffer area. Further, for parts of the buffer area that have already been corrected, correction duplication can be avoided, significantly reducing the amounts of calculation and pattern data processing. As an example, assume that an area to be corrected has a size of 50×50 micrometers, the width of the buffer area is 5 micrometers, and part of the buffer area that is adjacent to the upper side and the left side of the area to be corrected has already been corrected. Then, the size of an area for which the graphical processing can be omitted really reaches 550 square micrometers. Thus, it will be obvious that the amount of calculation can be reduced significantly.

In the above-described embodiments, descriptions were made of methods of solving the OPE problem encountered in transferring a mask pattern onto a wafer. A proximity effect (PE) also occurs in forming or drawing a on a wafer by means of electron beam lithography. In this case as well, the proximity effect can be corrected in the same manner as in the above embodiments. At this point, more accurate correction can be made by using a corrected pattern by the method in each of the above embodiments as a pattern to be formed on a mask.

As described above, according to the eighteenth through twenty-first embodiments, a proper correction solution with as little error as possible with respect to a true correction solution can be obtained, the calculation time for the proximity effect correction can be reduced, and the pattern precision can be improved. Furthermore, when the OPE range is included in a proximity effect calculated area as a buffer area for calculation, unnecessary calculation duplication can be avoided and the time required to reach a solution can be reduced. That is, the OPC of high precision can be made at high speed, allowing photolithography techniques to be adapted to manufacture of high-density semiconductor devices.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. An apparatus for correcting an optical proximity effect in a lithography process for an LSI (Large-Scale Integration) pattern, said apparatus comprising:
   a hierarchical processing portion for extracting area data to be processed from hierarchical data and inputting/outputting the area data;
   a rule-based correction portion for performing correction by use of a correction value calculated beforehand, such that the correction corresponds to a pattern and layout data surrounding the pattern;
   a simulation-based correction portion for calculating an amount of correction and executing correction based on a process simulating program; and
   a determination portion for dividing the pattern and layout data into areas to be corrected by rule-based correction and areas to be corrected by simulation-based correction, and for determining which correction portion, the rule-based correction portion and the simulation-based correction portion, should be used for correcting each of the areas.

2. An apparatus according to claim 1, wherein the rule-based correction includes placement rules of assist features which are smaller than a resolution limit.

3. An apparatus according to claim 1, wherein the rule-based correction includes placement rules of assist features at pattern corners.

4. A computer program product, comprising:
   a computer readable medium and a computer program code embedded in the computer readable medium to control a central processor;
   a first computer code configured to input data to be processed;
   a second computer code configured to divide the data into areas to be corrected by rule-based correction and areas to be corrected by simulation-based correction;
   a third computer code configured to perform rule-based correction on the areas to be corrected by the rule-based correction which meet rules; and
   a fourth computer code configured to perform simulation-based correction on the areas to be corrected by simulation-based correction.

5. A computer program product according to claim 4, wherein the rule-based correction includes placement rules of assist features which are smaller than a resolution limit.

6. A computer program product according to claim 4, wherein the rule-based correction includes placement rules of assist features at pattern corners.

7. An optical proximity correction method for controlling accuracy in LSI (Large-Scale Integration), said method comprising the steps of:
   inputting data to be processed;
   dividing the data into areas to be corrected by rule-based correction and areas to be corrected by simulation-based correction;
   performing rule-based correction on the areas to be corrected by rule-base correction which meet rules; and
   performing simulation-based correction on the areas to be corrected by simulation-based correction.

8. A method according to claim 7, wherein the rule-based correction includes placement rules of assist features which are smaller than a resolution limit.

9. A method according to claim 7, wherein the rule-based correction includes placement rules of assist features at pattern corners.

10. A computer program product, comprising:
    a computer readable medium and a computer program code embedded in the computer readable medium to control a central processor;
    a first computer code mechanism configured to input data to be processed;
    a second computer code mechanism configured to perform rule-based correction on parts which do not meet rules; and
    a third computer code mechanism configured to execute simulation-based correction on the rule-based correction data.

11. A computer program product according to claim 10, wherein the rule-based correction includes placement rules of assist features which are smaller than a resolution limit.

12. A computer program product according to claim 10, wherein the rule-based correction includes placement rules of assist features at pattern corners.

13. A computer program product, comprising:
    a computer readable medium and a computer program code embedded in the computer readable medium to control a central processor;
    a first computer code mechanism configured to input data to be processed;
    a second computer code mechanism configured to perform rule-based correction on parts which meet rules; and a third computer code mechanism configured to execute simulation-based correction on the rule-based correction data.

14. A computer program product according to claim 13, wherein the rule-based correction includes placement rules of assist features which are smaller than a resolution limit.

15. A computer program product according to claim 13, wherein the rule-based correction includes placement rules of assist features at pattern corners.

16. An optical proximity correction method for controlling accuracy in LSI (Large-Scale Integration), said method comprising the steps of:

inputting data to be processed;

performing rule-based correction on parts which meet rules; and executing simulation-based correction on the rule-based corrected data.

17. A method according to claim 16, wherein the rule-based correction includes placement rules of assist features at pattern corners.

18. A method according to claim 16, wherein the rule-based correction includes placement rules of assist features which are smaller than a resolution limit.

19. An optical proximity correction method for controlling accuracy in LSI (Large-Scale Integration), said method comprising the steps of:

inputting data to be processed;

performing rule-based correction on parts which meet rules;

extracting parts which do not meet rules; and executing simulation-based correction on the extracted parts.

20. A method according to claim 19, wherein the rule-based correction includes placement rules of assist features at pattern corners.

21. A method according to claim 19, wherein the rule-based correction includes placement rules of assist features which are smaller than a resolution limit.

22. An apparatus for correcting an optical proximity effect in a lithography process for an LSI (Large-Scale Integration) pattern, said apparatus comprising:

a processing portion for processing data to be input and output;

a rule-based correction portion for performing rule-based correction on parts which meet rules; and a simulation-based correction portion for executing simulation-based correction on the rule-based correction data.

23. An apparatus according to claim 22, wherein the rule-based correction includes placement rules of assist features at pattern corners.

24. An apparatus according to claim 22, wherein the rule-based correction includes placement rules of assist features which are smaller than a resolution limit.

25. An apparatus for correcting an optical proximity effect in a lithography process for an LSI (Large-Scale Integration) pattern, said apparatus comprising:

a processing portion for processing data to be input and output;

a rule-based correction portion for performing rule-based correction on parts which meet rules;

a portion for extracting parts which do not meet rules; and a simulation-based correction portion for executing simulation-based correction on the extracted parts.

26. An apparatus according to claim 25, wherein the rule-based correction includes placement rules of assist features pattern corners.

27. An apparatus according to claim 25, wherein the rule-based correction includes placement rules of assist features which are smaller than a resolution limit.

* * * * *